United States Patent
Boujamaa et al.

(10) Patent No.: US 10,734,056 B2
(45) Date of Patent: Aug. 4, 2020

(54) AMPLIFIER CIRCUIT DEVICES AND METHODS

(71) Applicant: Arm Limited, Cambridge (GB)

(72) Inventors: El Mehdi Boujamaa, Valbonne (FR); Cyrille Nicolas Dray, Antibes (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/290,844

(22) Filed: Mar. 1, 2019

(65) Prior Publication Data

US 2020/0160901 A1    May 21, 2020

Related U.S. Application Data

(60) Provisional application No. 62/768,415, filed on Nov. 16, 2018.

(51) Int. Cl.
G11C 7/02 (2006.01)
G11C 11/16 (2006.01)
H03F 3/45 (2006.01)

(52) U.S. Cl.
CPC ...... G11C 11/1673 (2013.01); H03F 3/45264 (2013.01); H03F 3/45269 (2013.01); H03F 3/45273 (2013.01)

(58) Field of Classification Search
CPC ............ G11C 11/1673; H03F 3/45264; H03F 3/45269; H03F 3/45273
USPC ........................ 365/207–208, 189.011–225.7
See application file for complete search history.

(56) References Cited

U.S. PATENT DOCUMENTS

| | | | |
|---|---|---|---|
| 6,894,934 B2 * | 5/2005 | De Santis | G11C 7/062 365/185.2 |
| 2004/0160837 A1 * | 8/2004 | De Santis | G11C 7/062 365/205 |

* cited by examiner

Primary Examiner — Harry W Byrne
(74) Attorney, Agent, or Firm — Pramudji Law Group PLLC; Ari Pramudji

(57) ABSTRACT

In a particular implementation, an apparatus including first and second bias circuits and an inner amplifier provides sense amplifier offset cancellation. The inner amplifier includes: first and second current generators configured to replicate respective first and second currents from the first and second bias circuits, first and second transistors configured to transform the first and second currents into voltage samples, and first and second capacitors configured to store the voltage samples. In a sampling phase, a sampling of the first and second currents may be performed in the inner amplifier, and further, in an amplification phase, an amplification of the stored voltage samples may also be performed in the inner amplifier.

20 Claims, 30 Drawing Sheets

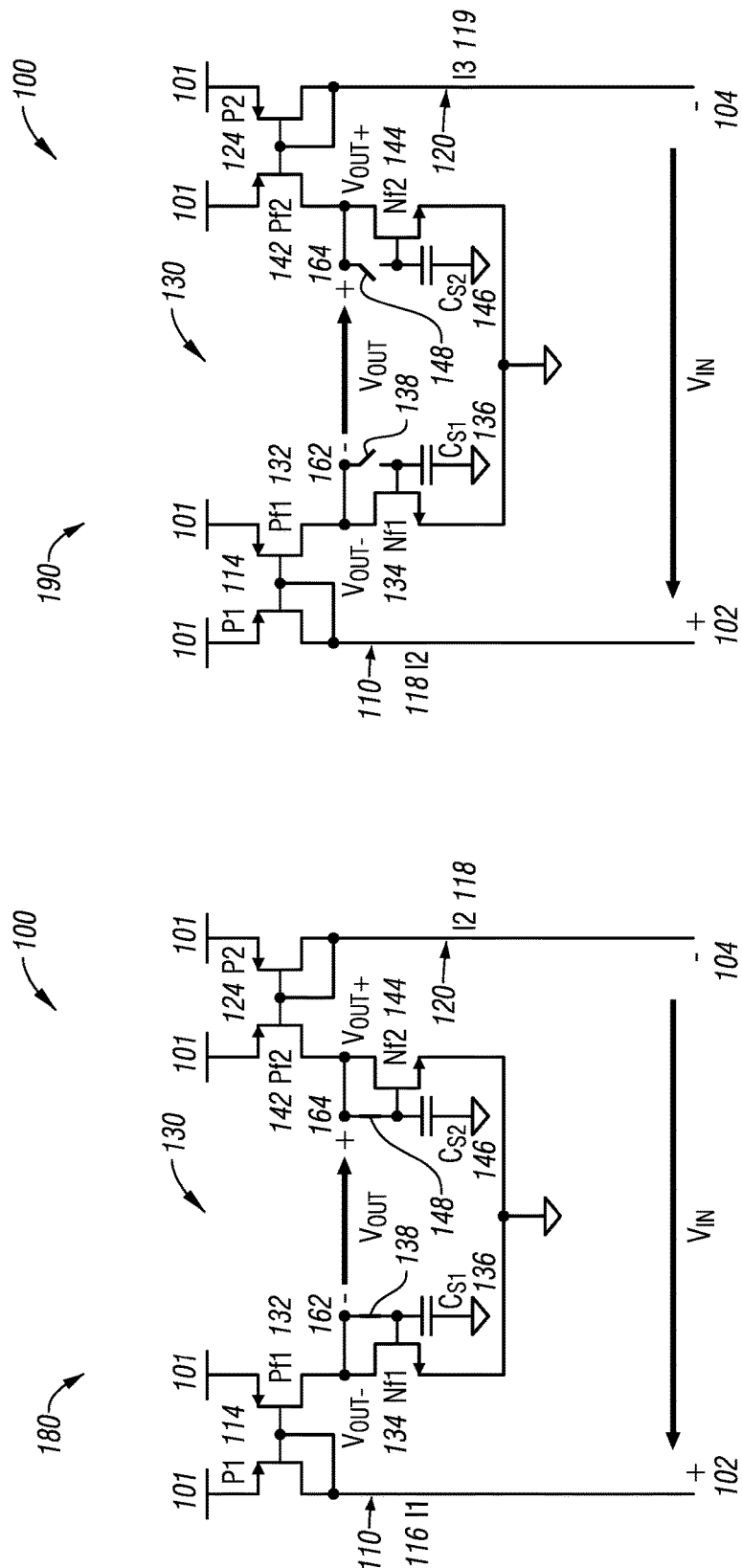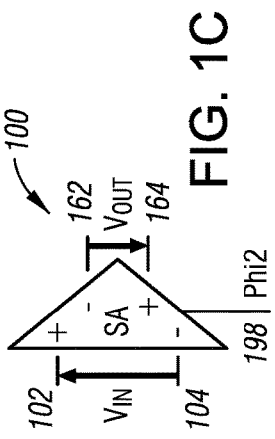

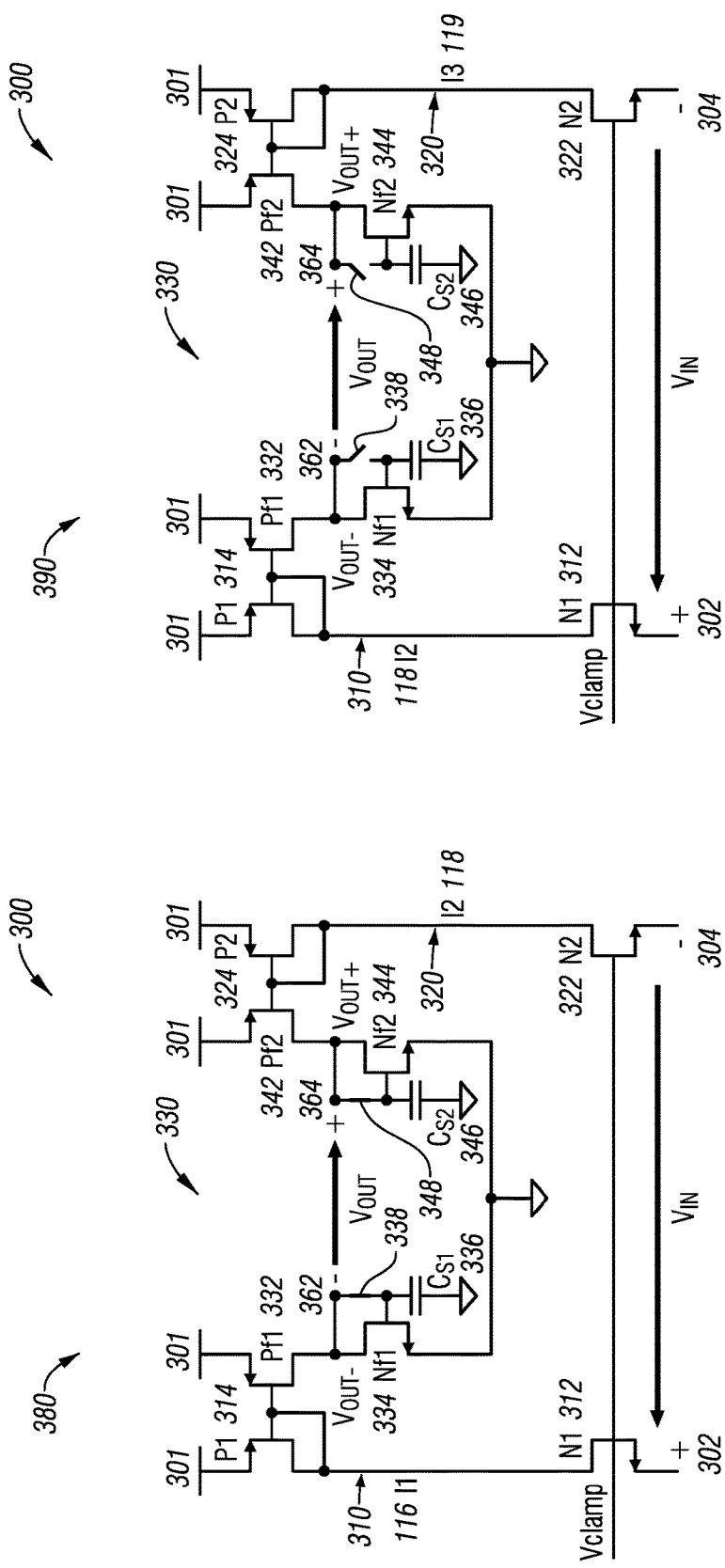
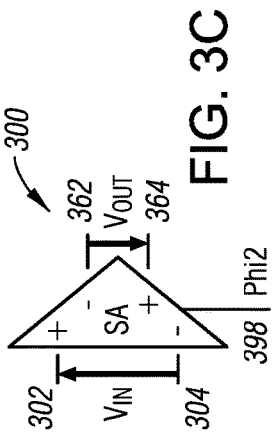
FIG. 3A
FIG. 3B
FIG. 3C

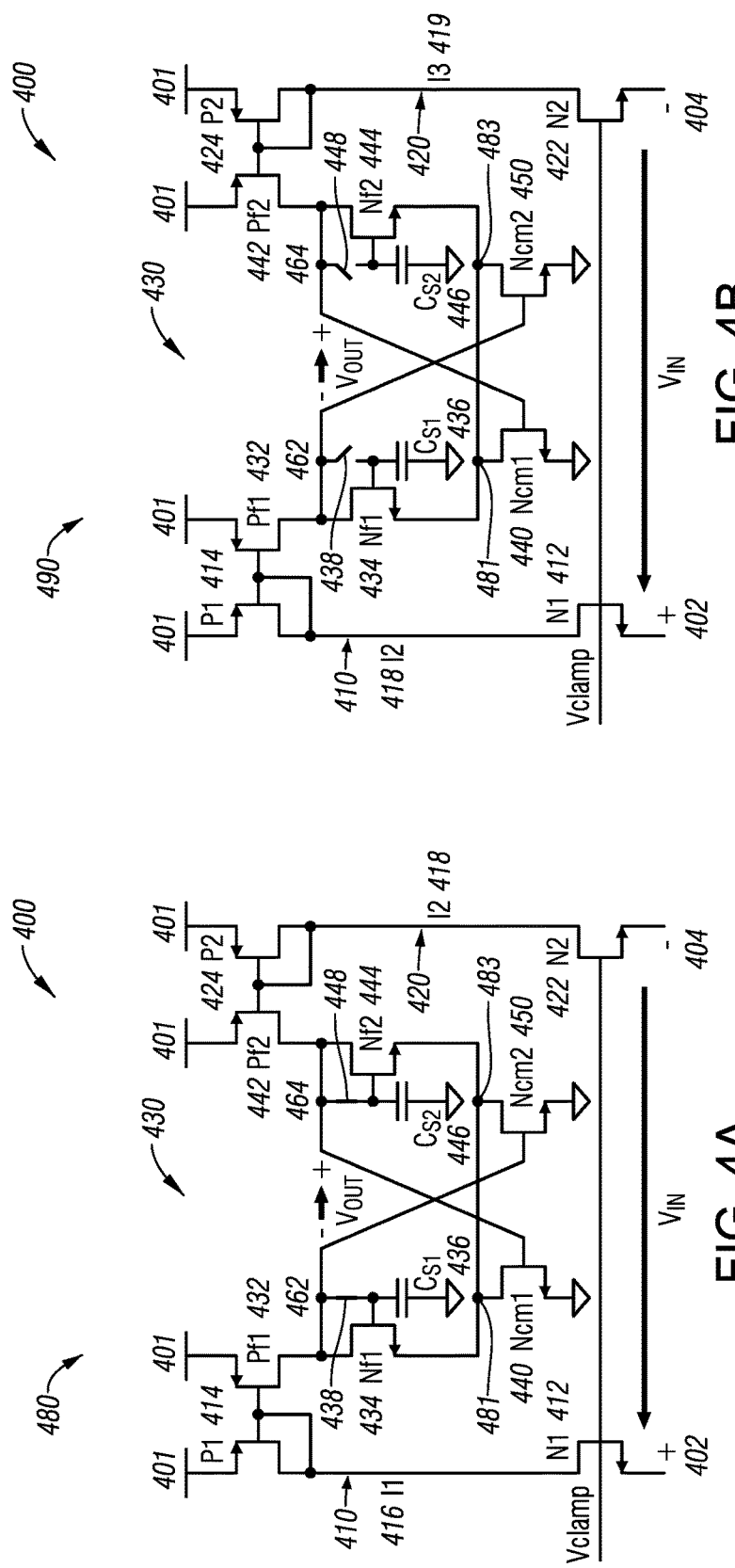
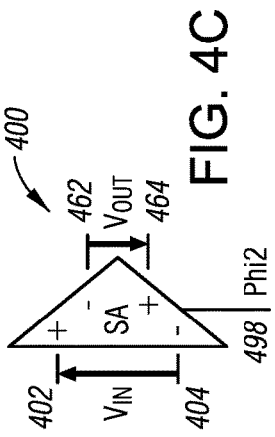
FIG. 4B
FIG. 4A
FIG. 4C

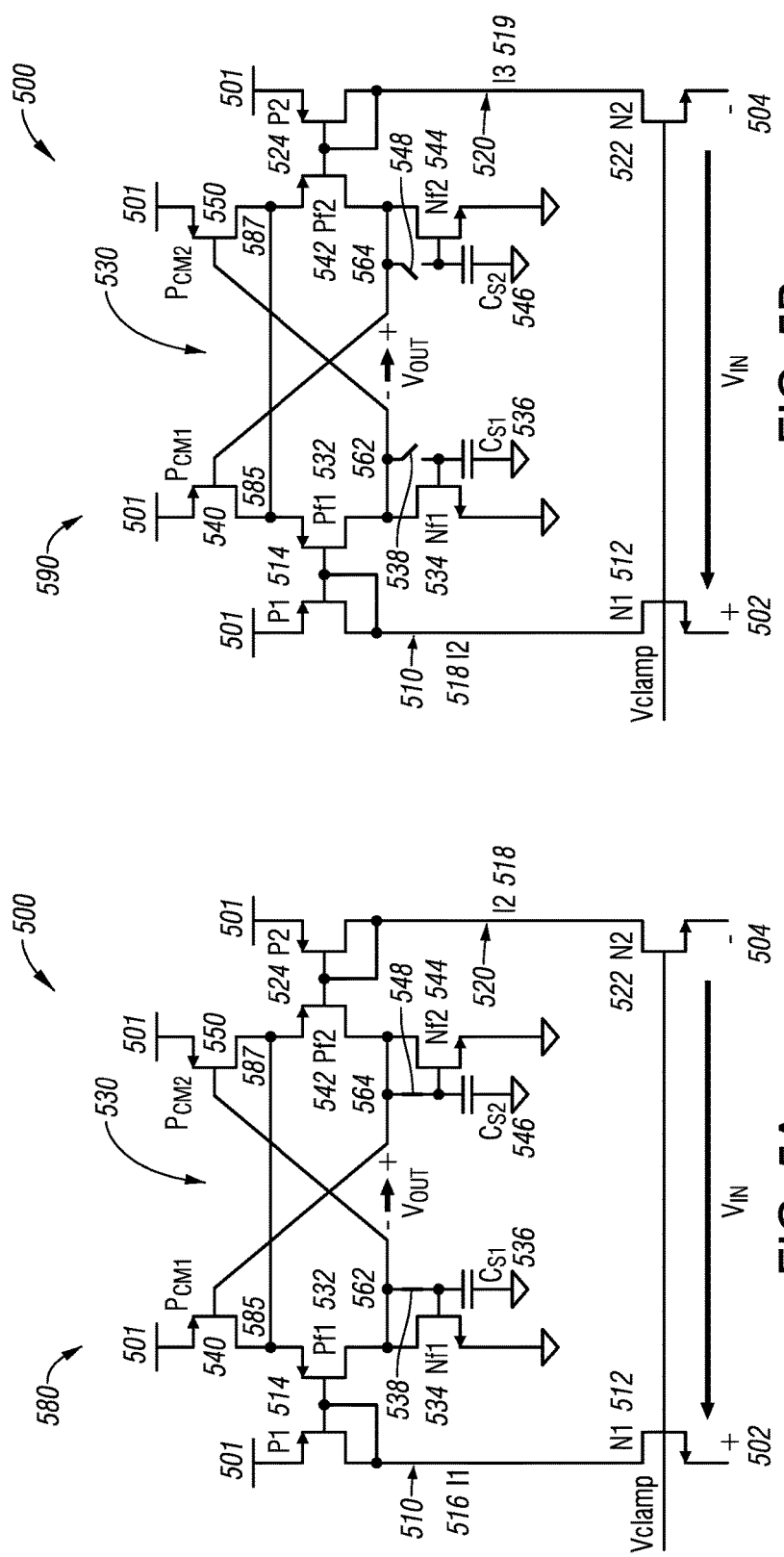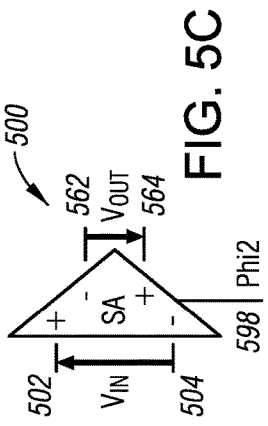
FIG. 5B
FIG. 5C
FIG. 5A

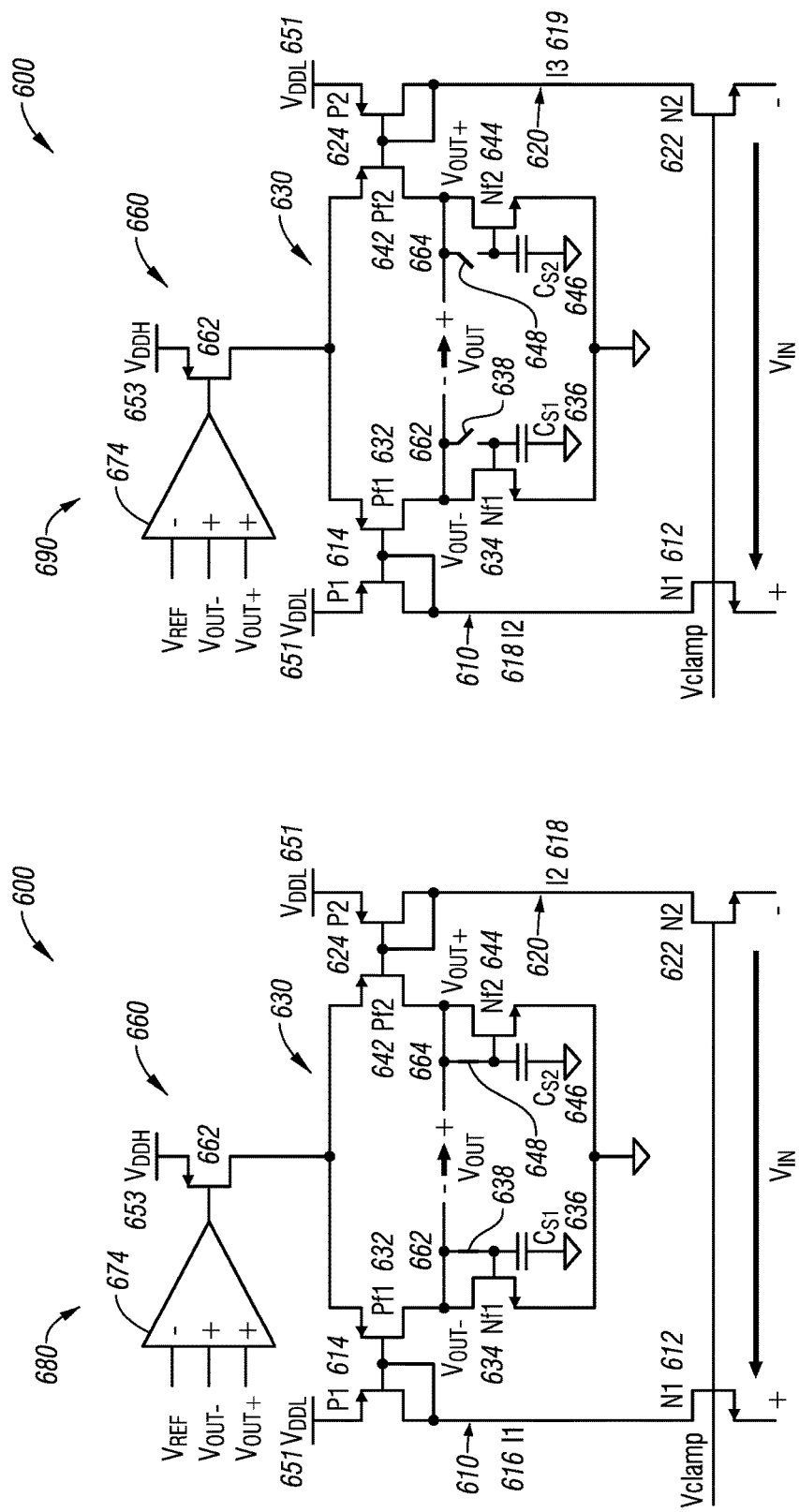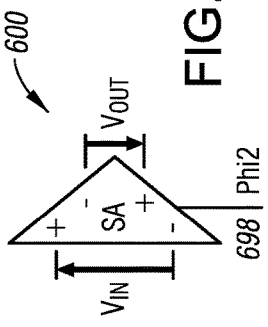
FIG. 6A
FIG. 6B
FIG. 6C

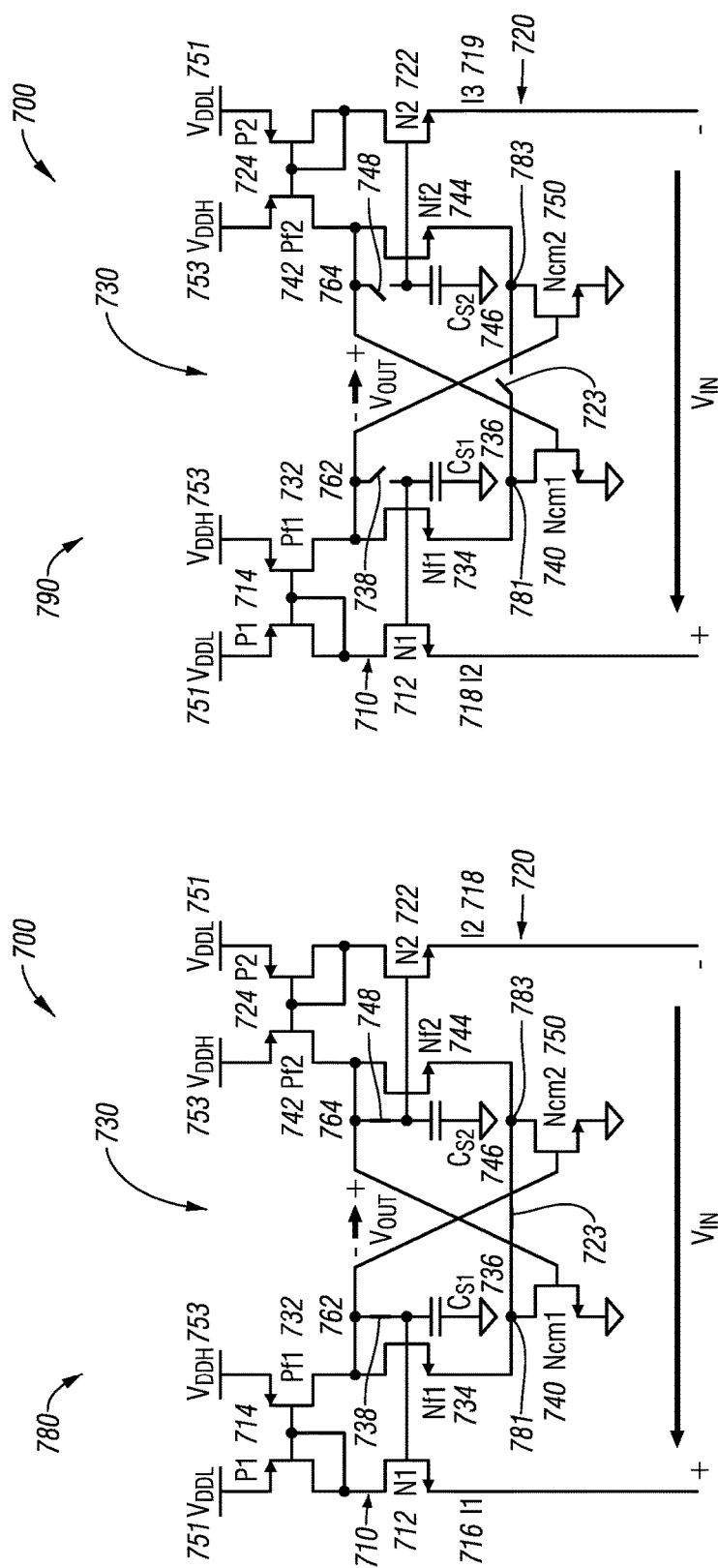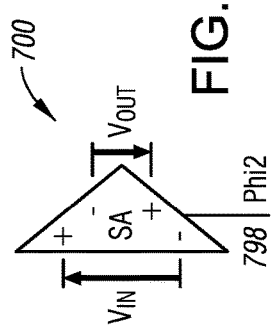
FIG. 7A
FIG. 7B
FIG. 7C

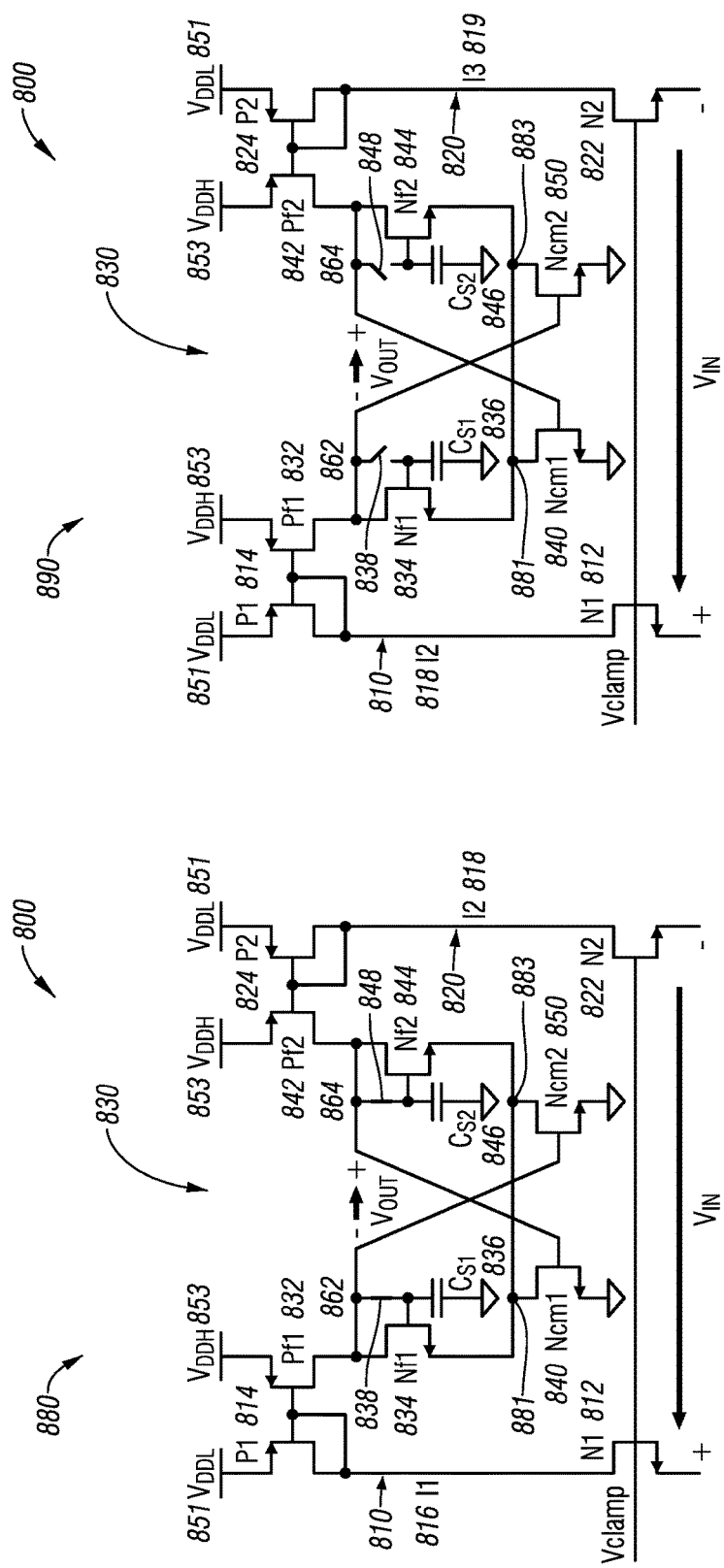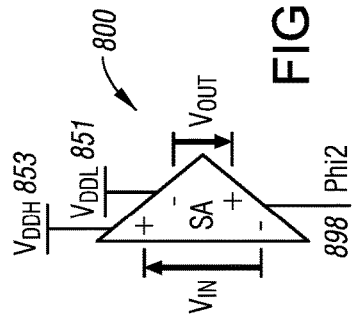
FIG. 8A
FIG. 8B
FIG. 8C

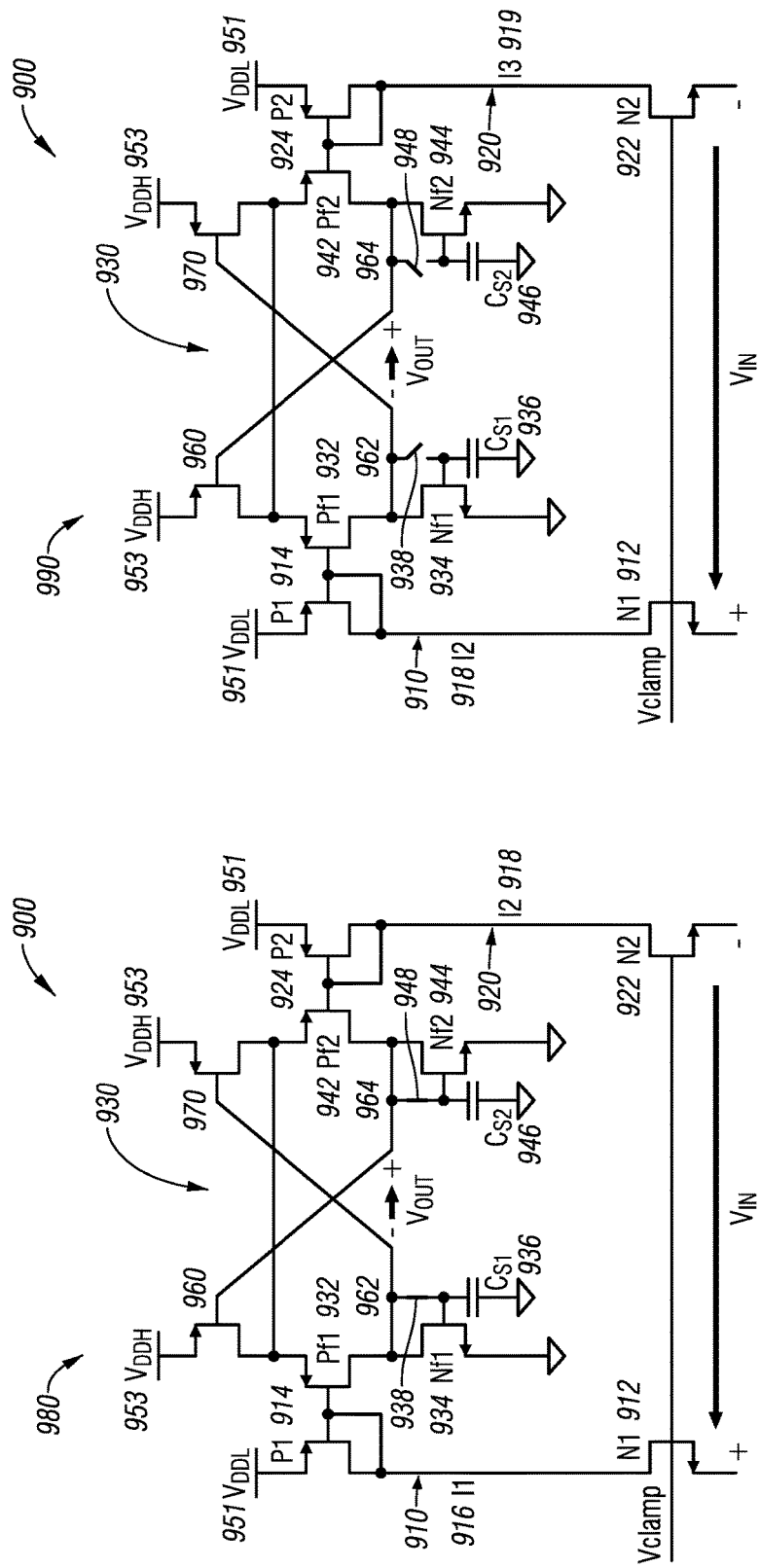
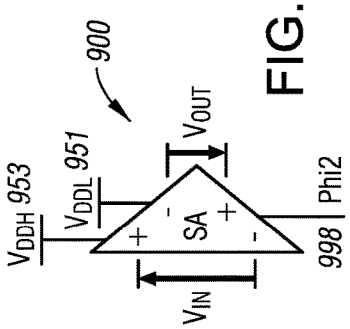
FIG. 9B
FIG. 9C
FIG. 9A

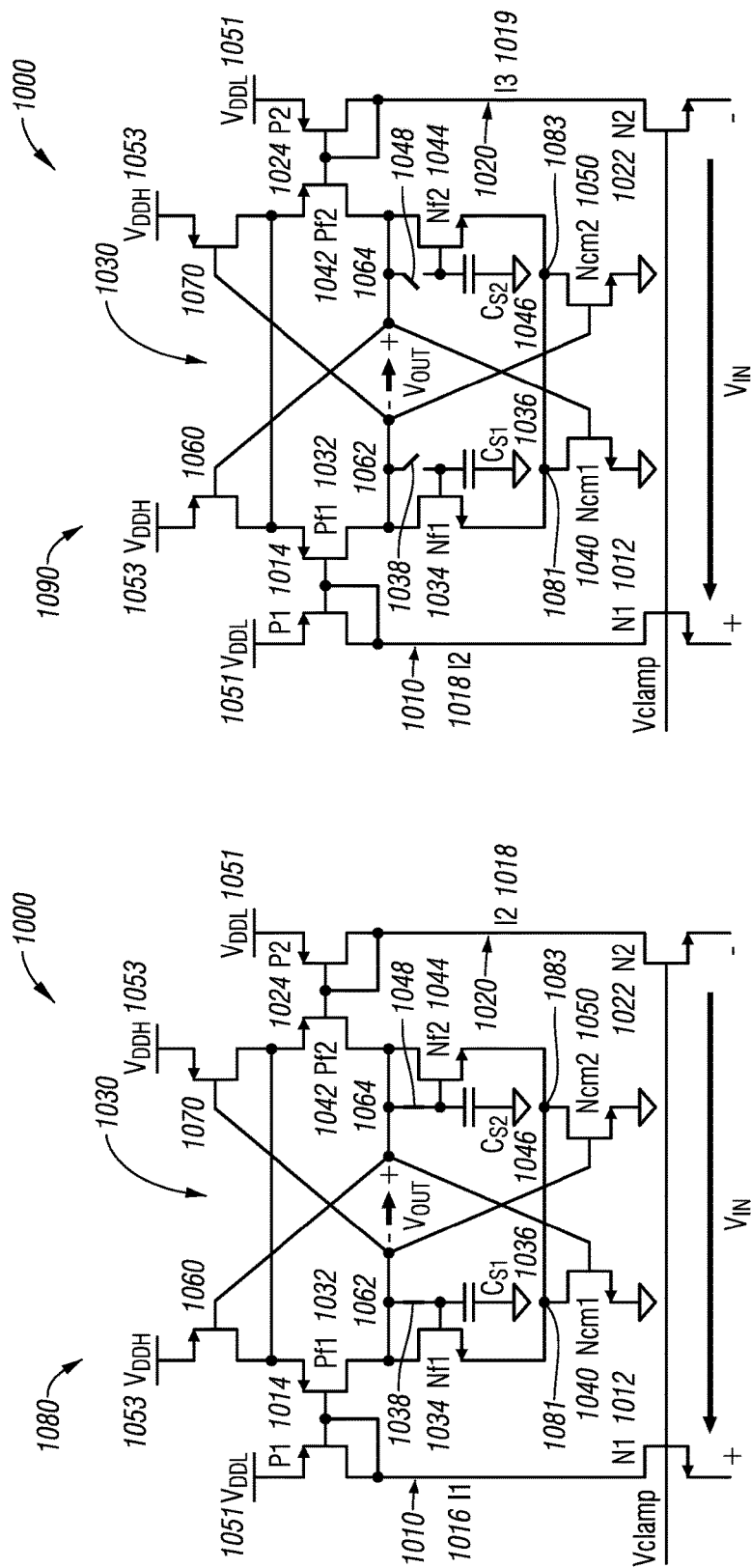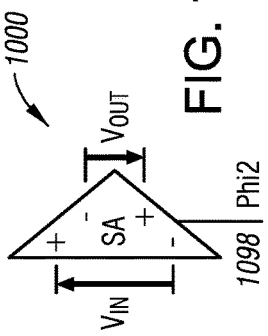
FIG. 10A
FIG. 10B
FIG. 10C

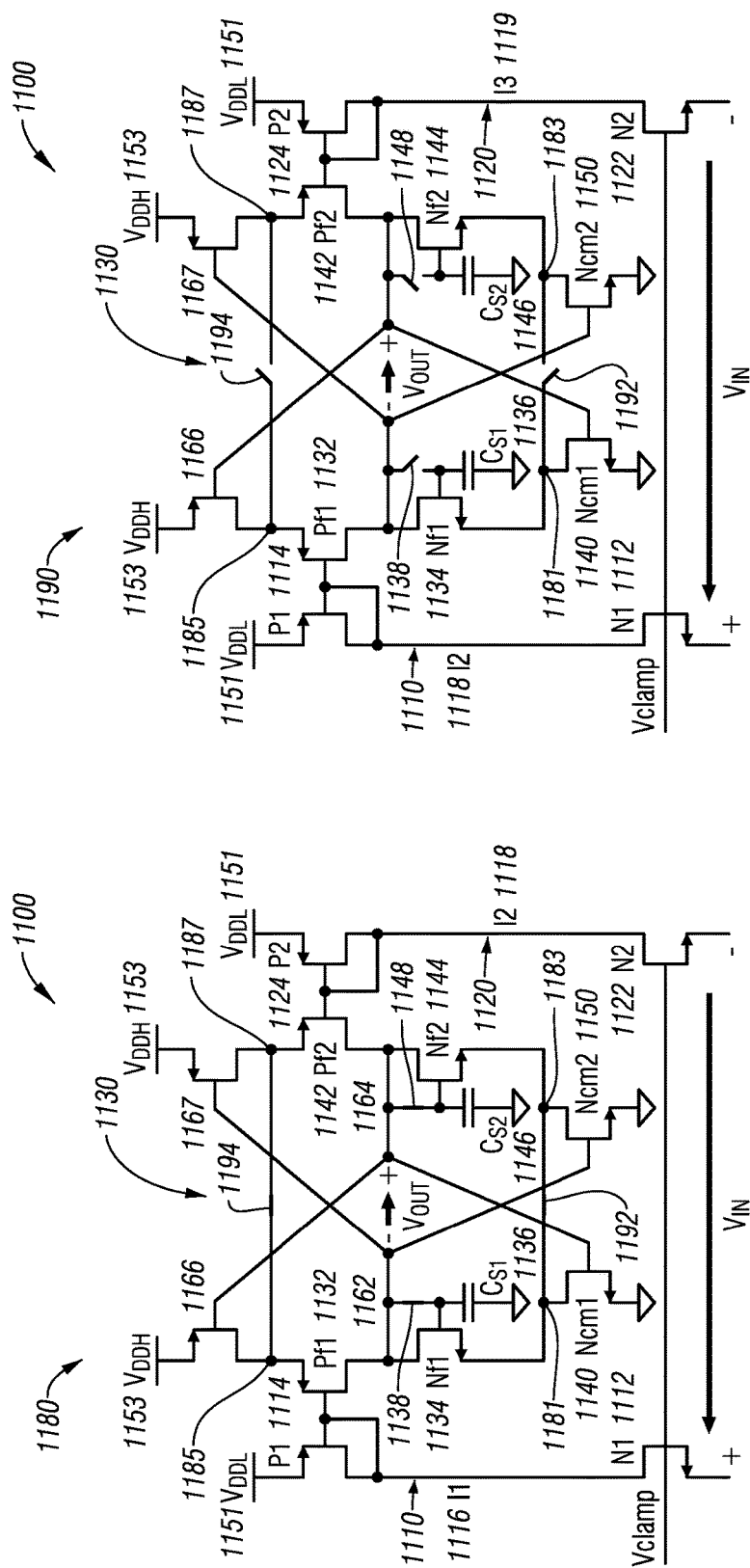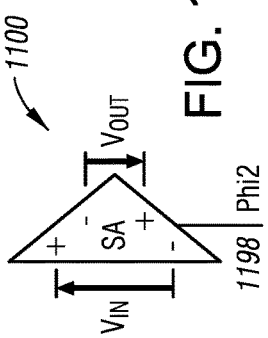
FIG. 11A
FIG. 11B
FIG. 11C

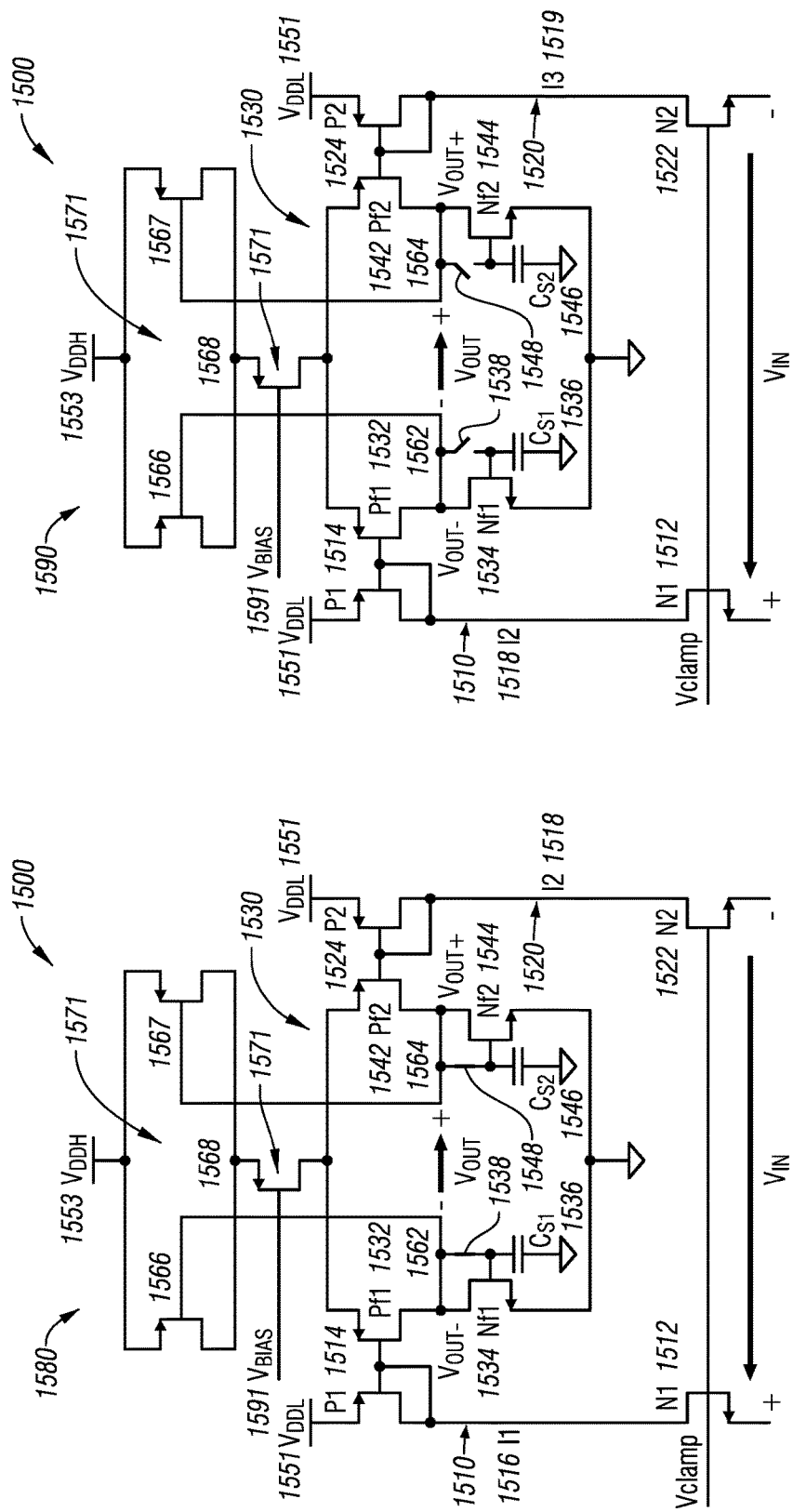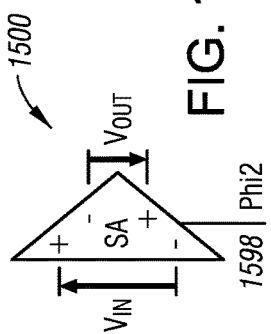
FIG. 15A
FIG. 15B
FIG. 15C

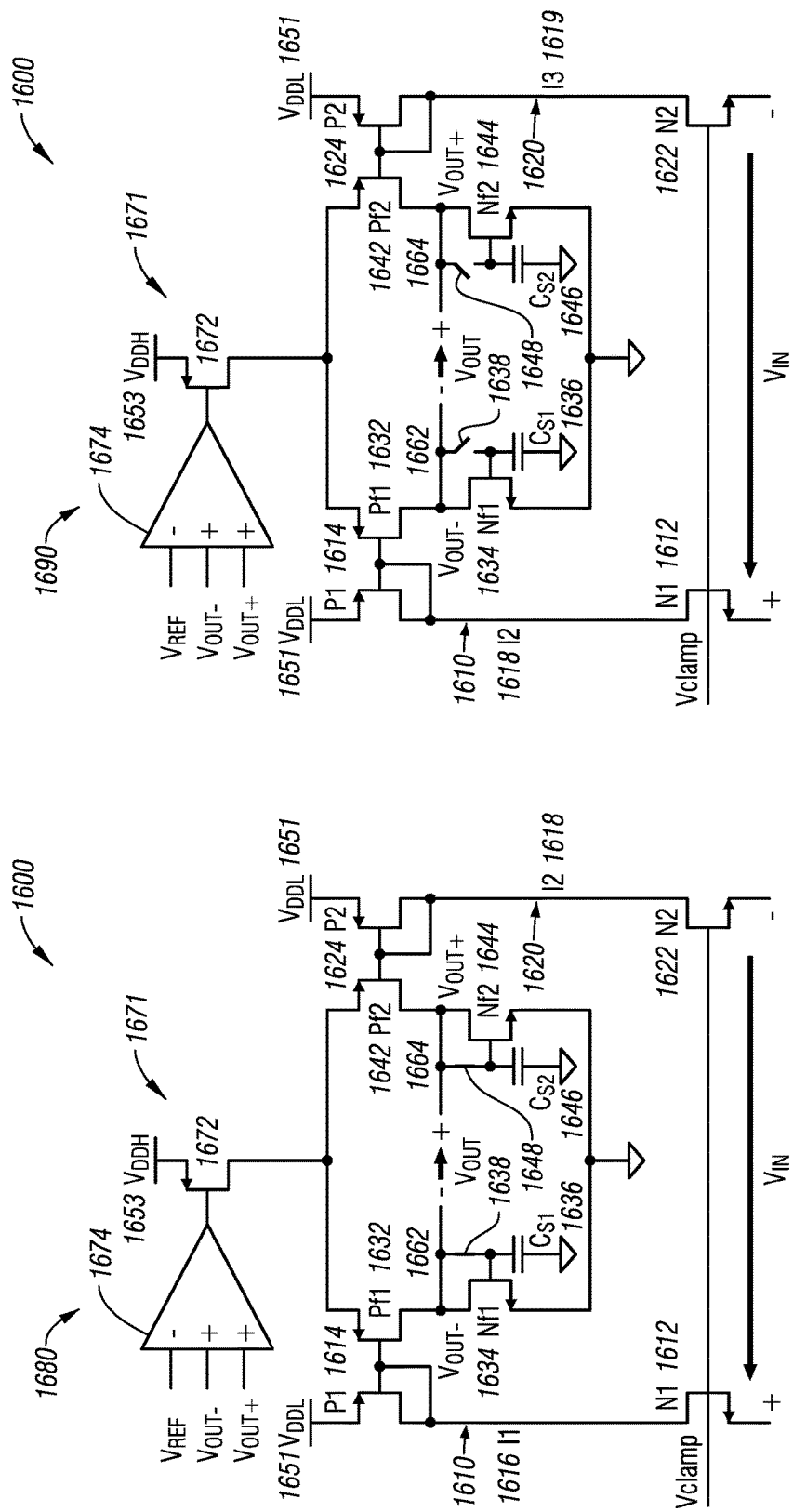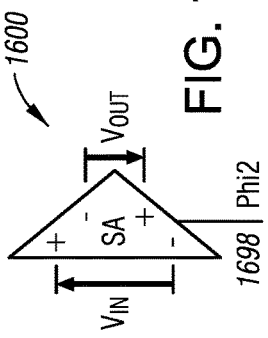

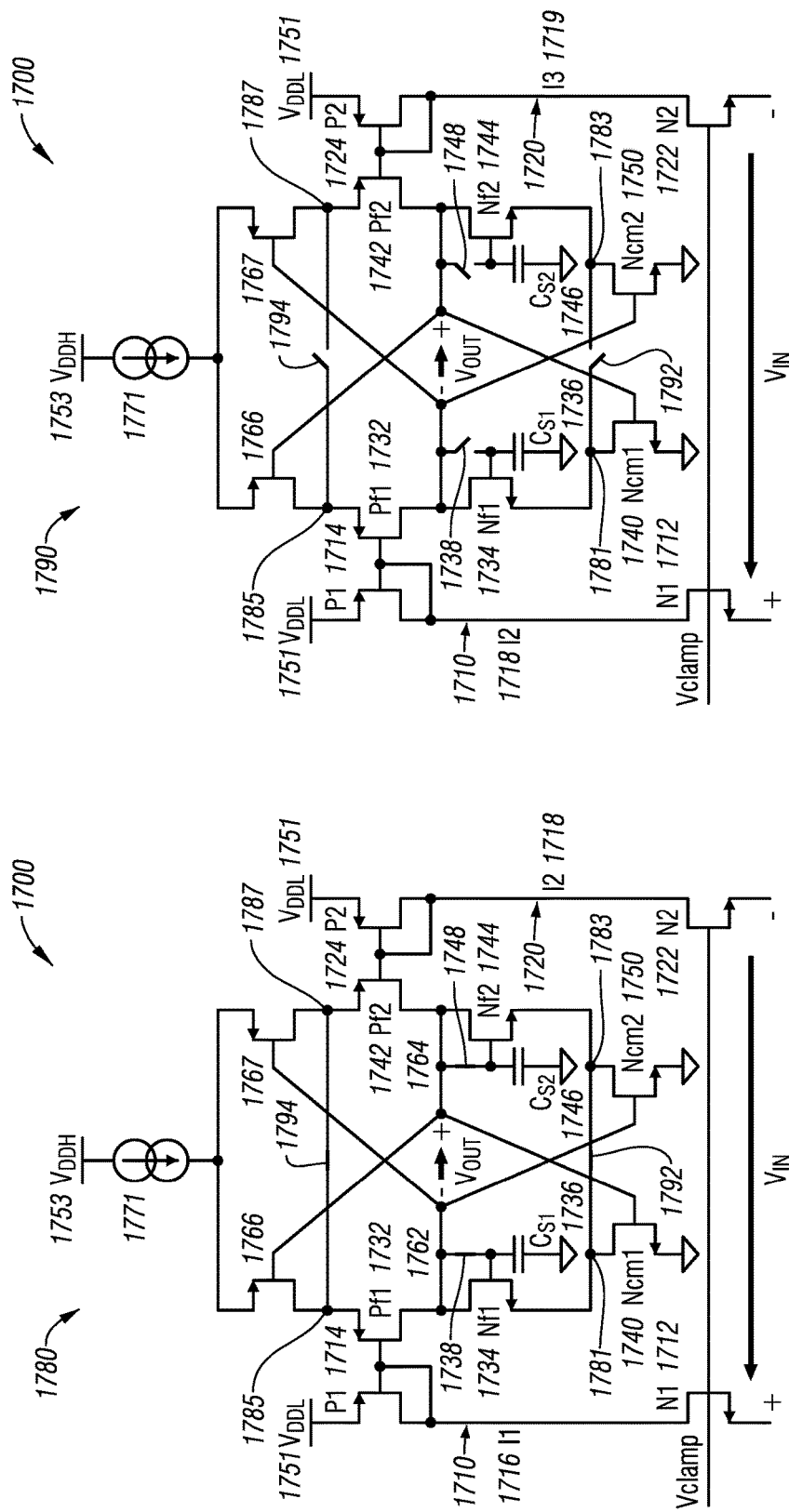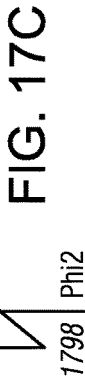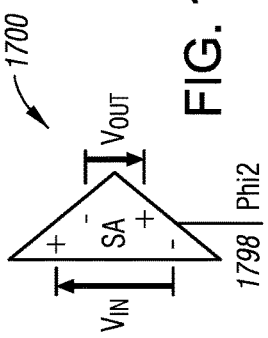
FIG. 17A
FIG. 17B
FIG. 17C

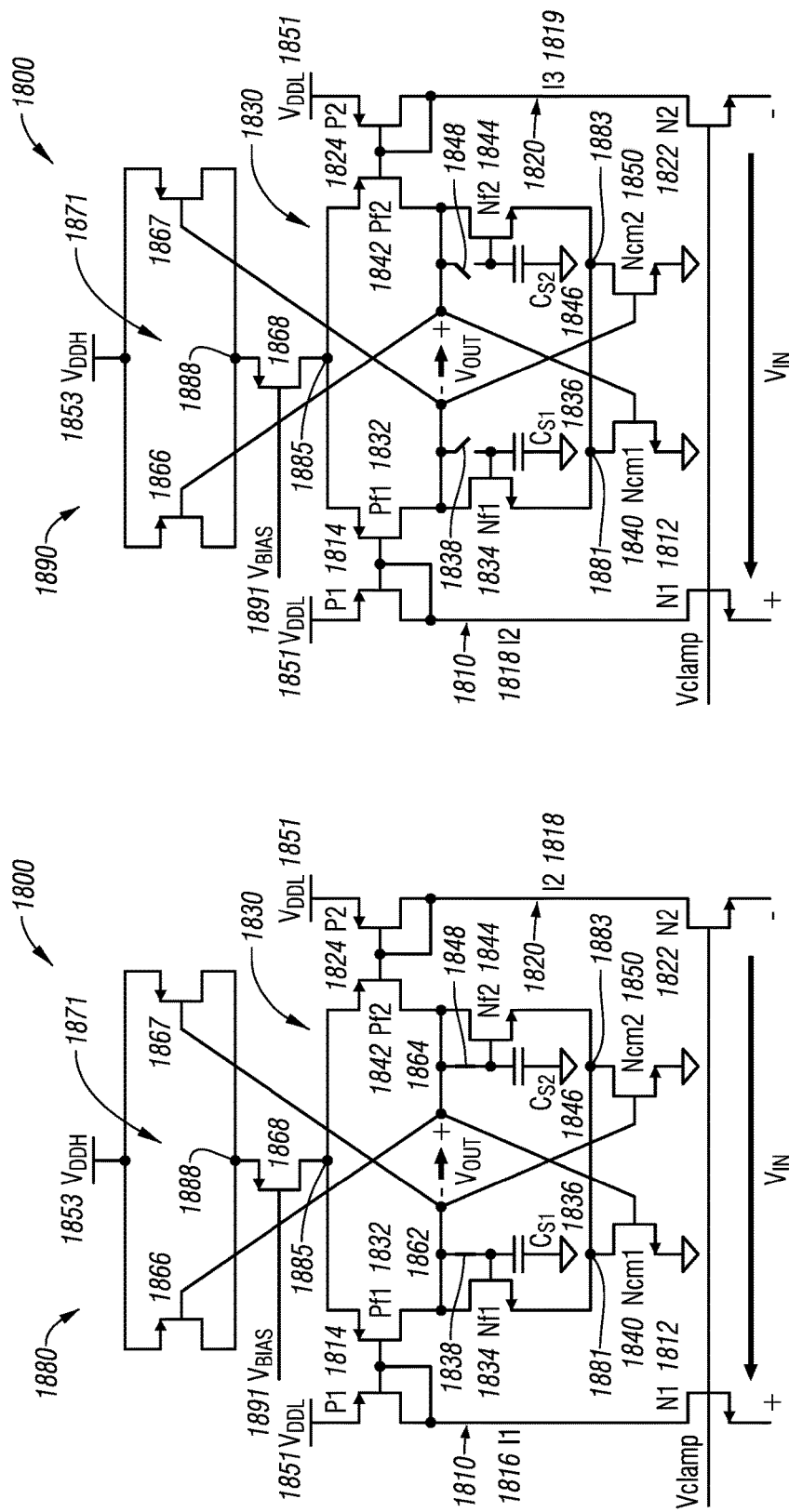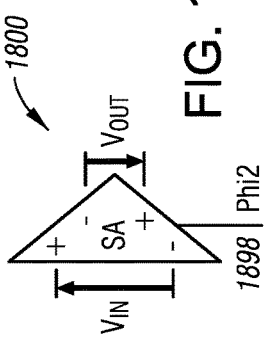
FIG. 18A
FIG. 18B
FIG. 18C

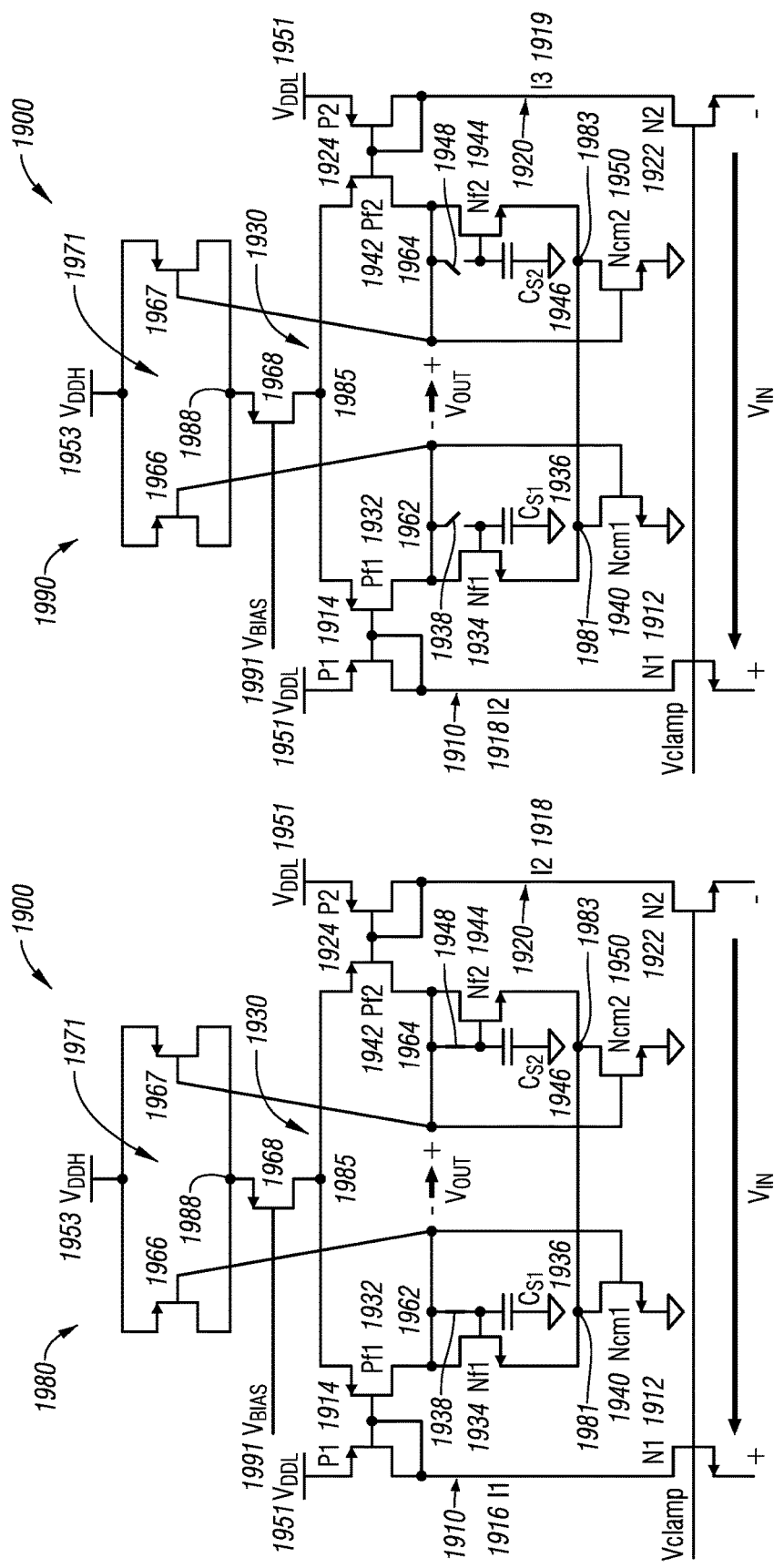

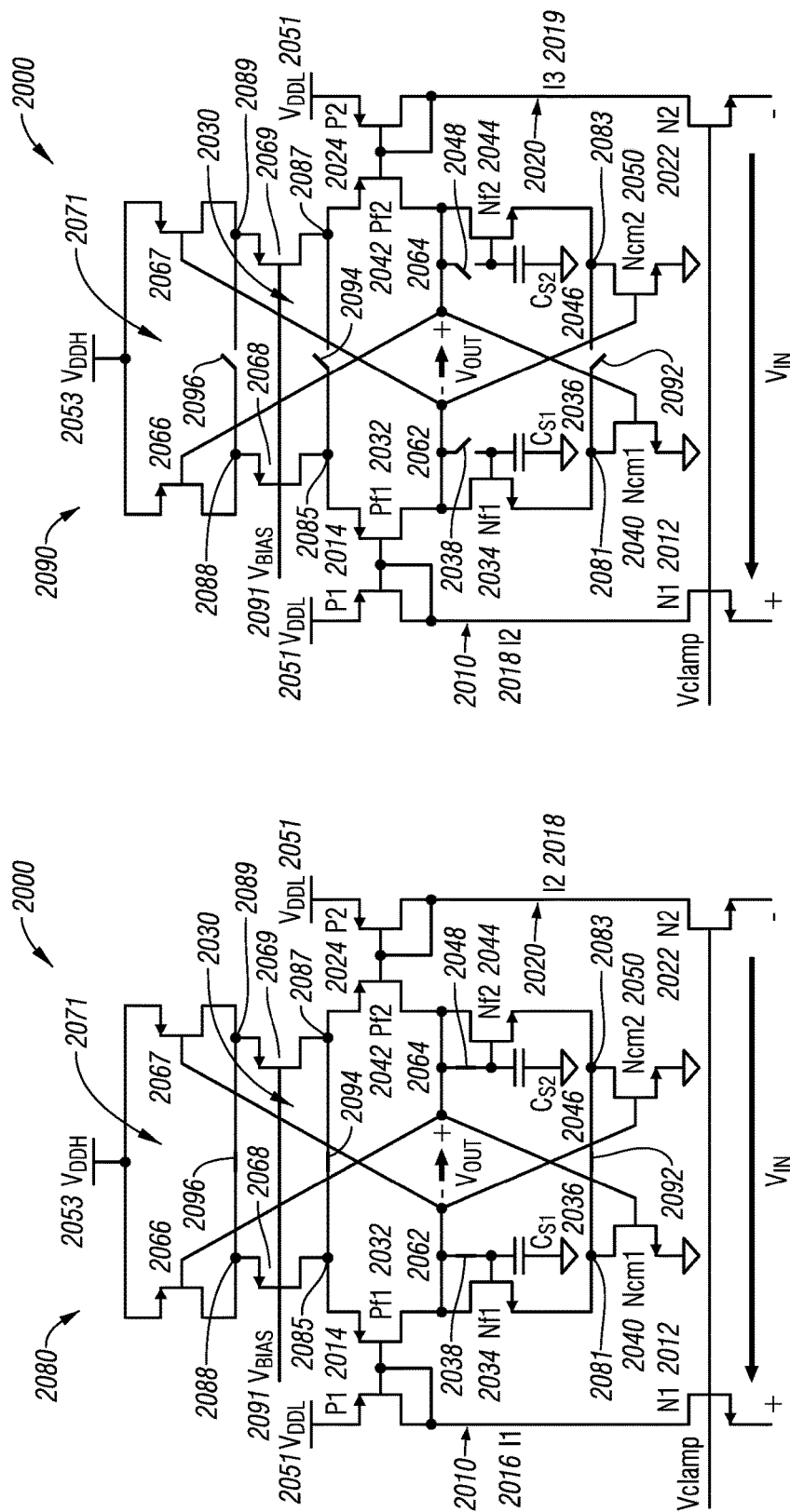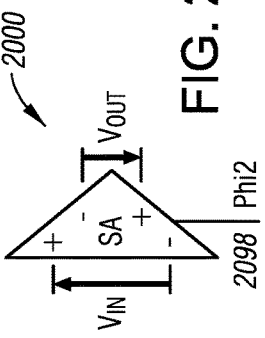

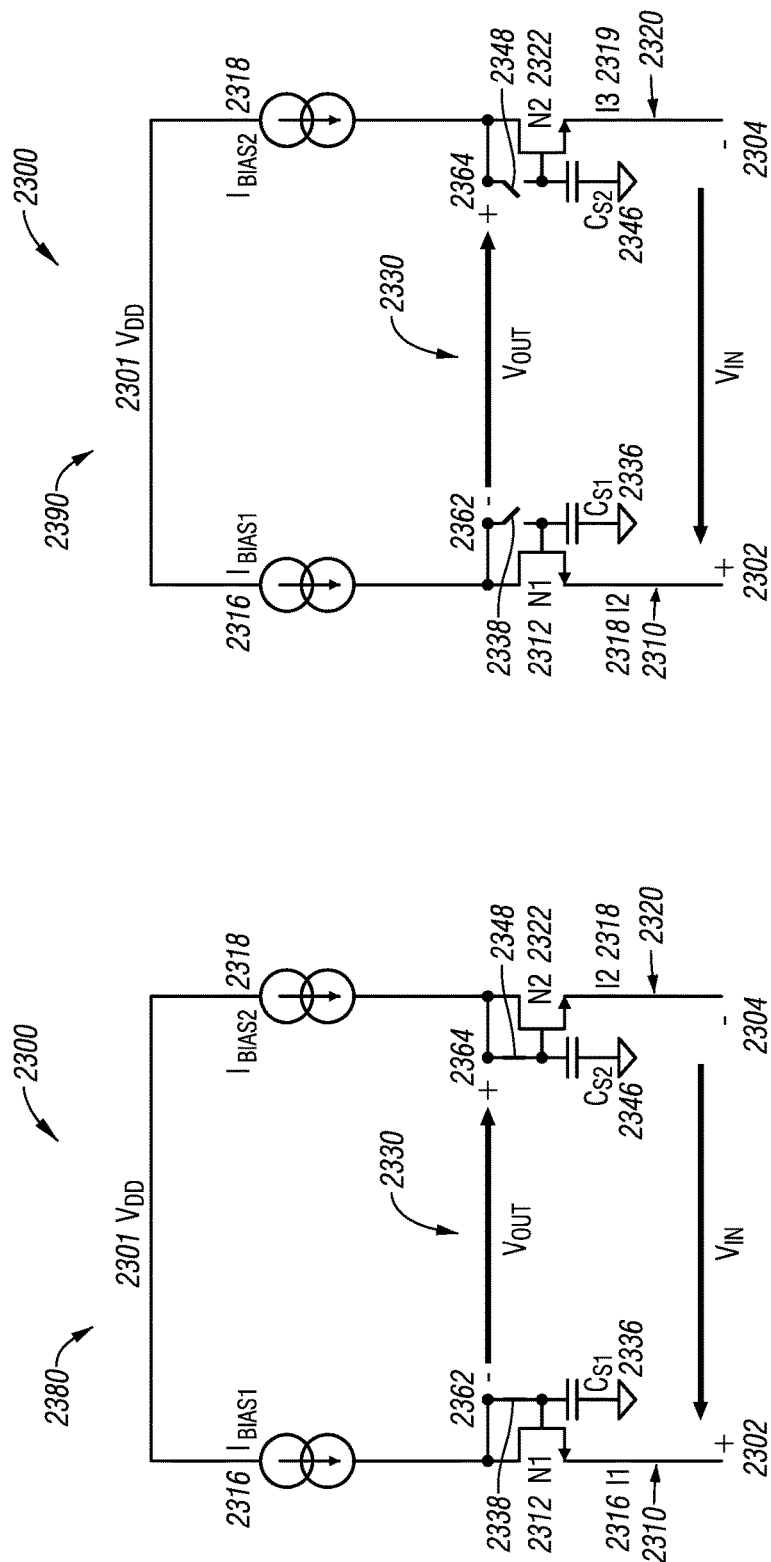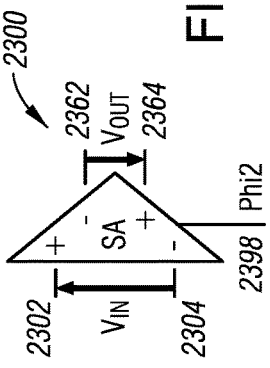
FIG. 23B
FIG. 23A
FIG. 23C

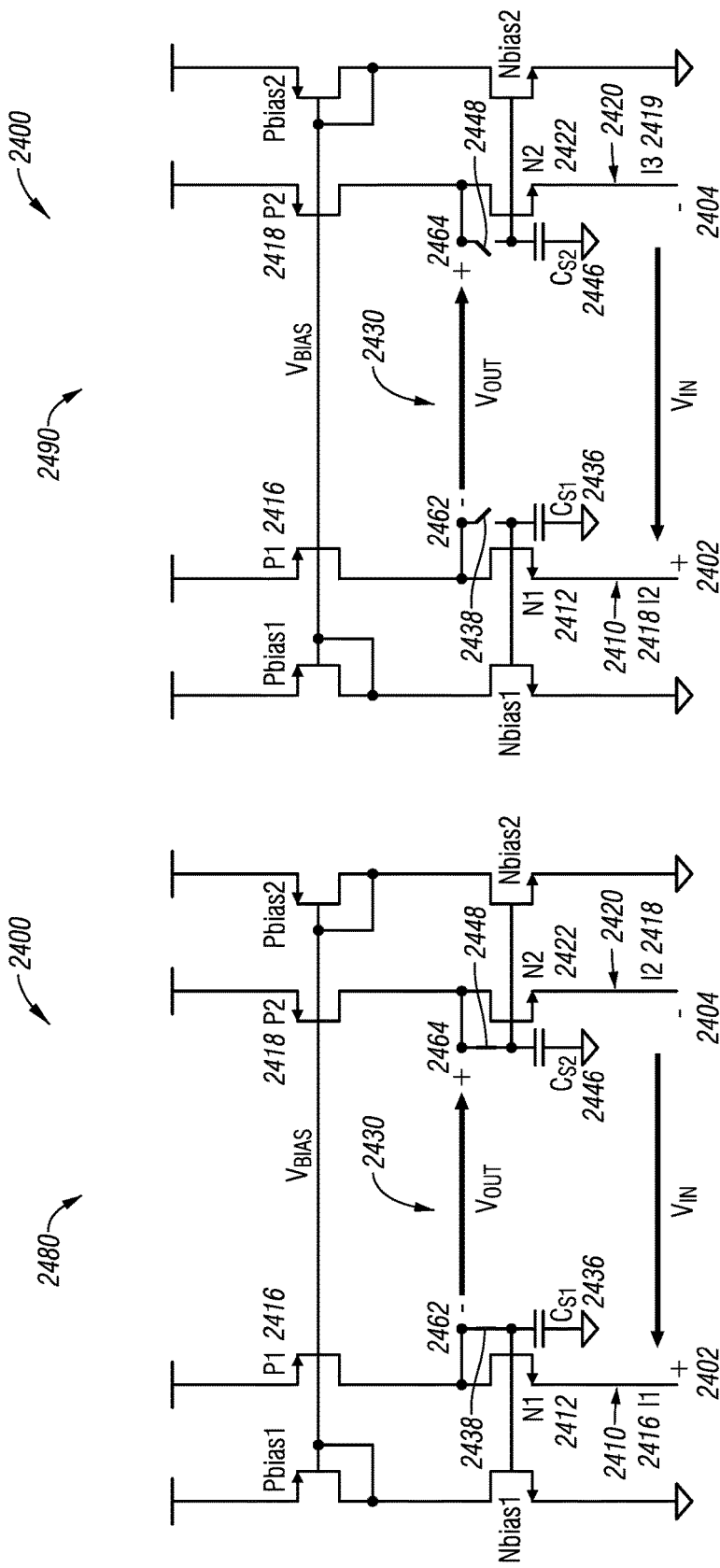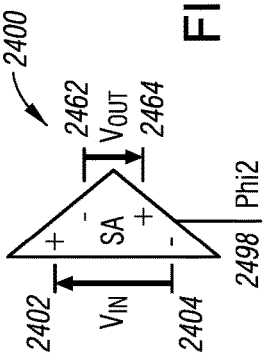
FIG. 24A
FIG. 24B
FIG. 24C

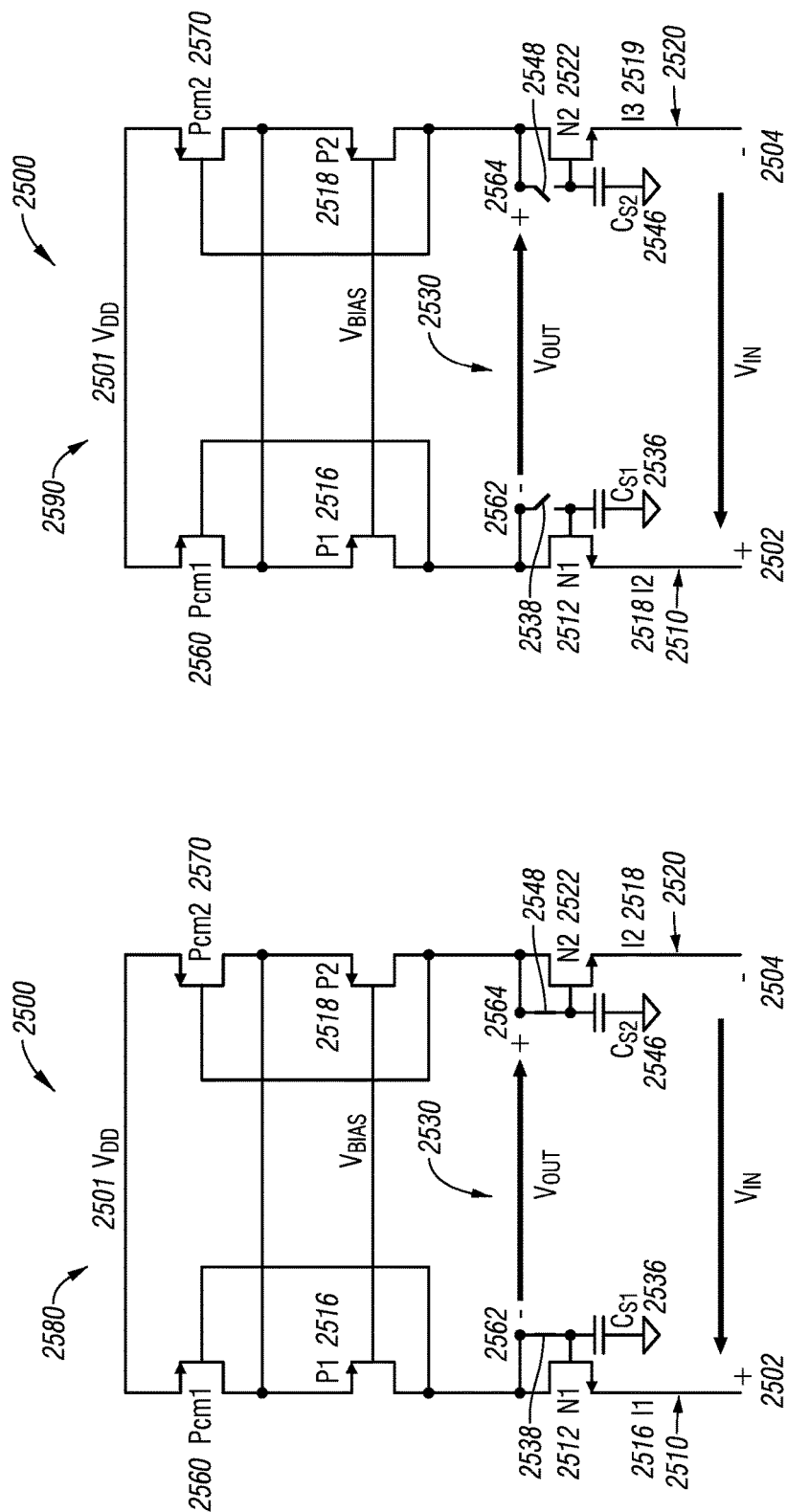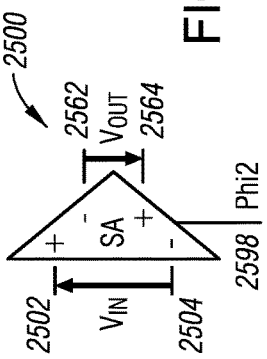
FIG. 25A
FIG. 25B
FIG. 25C

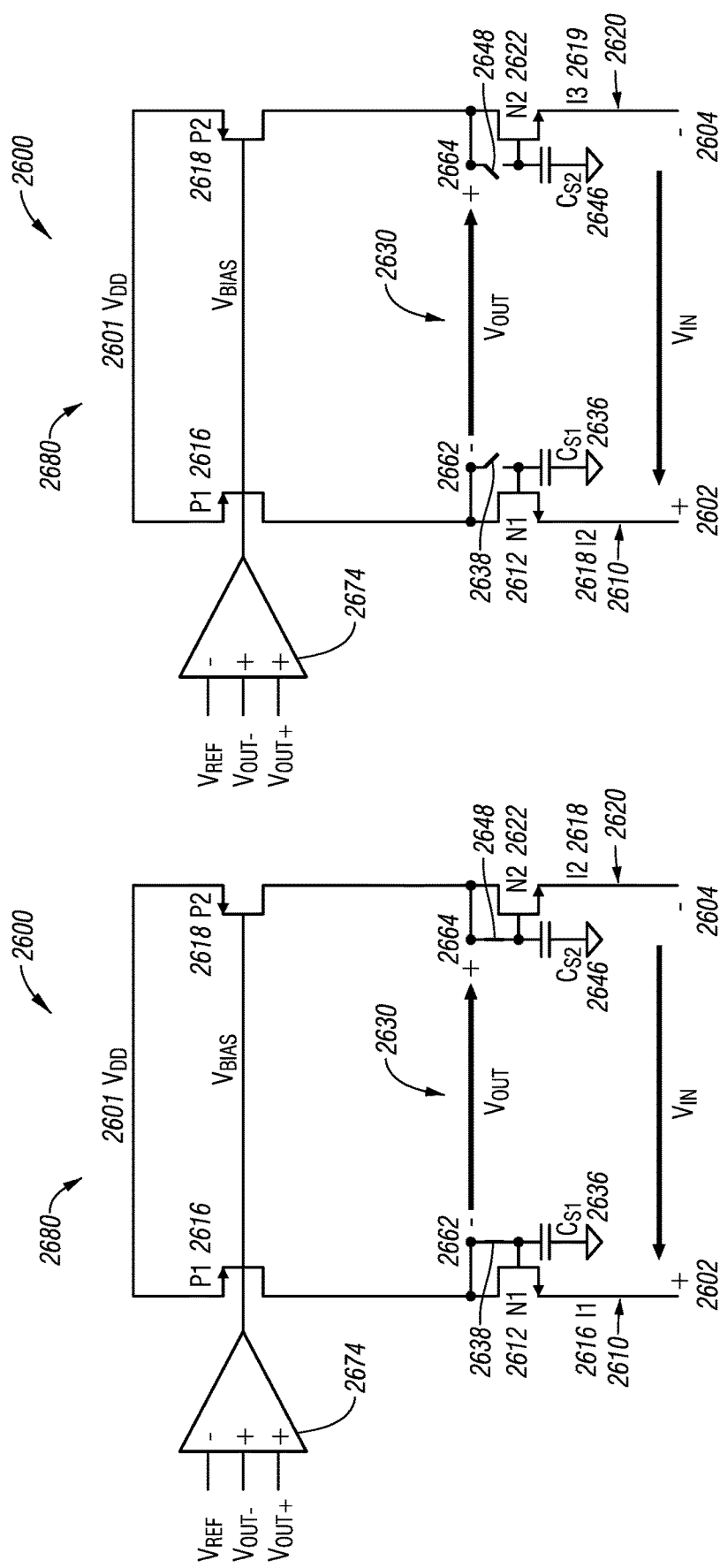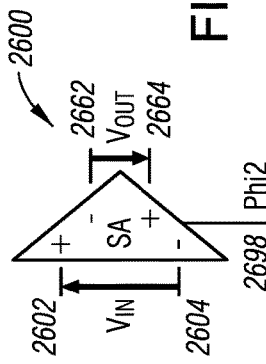
FIG. 26B
FIG. 26C
FIG. 26A

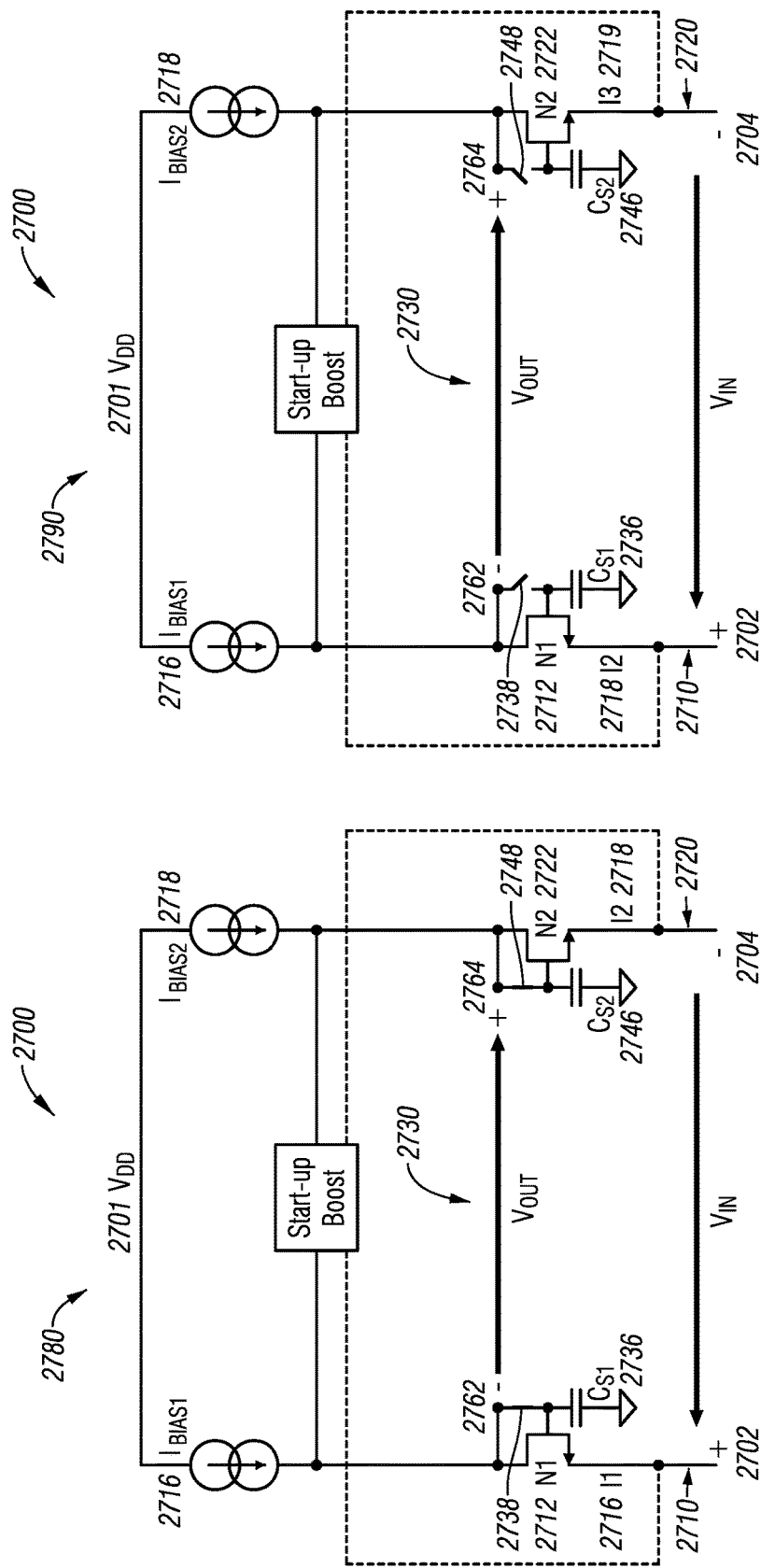
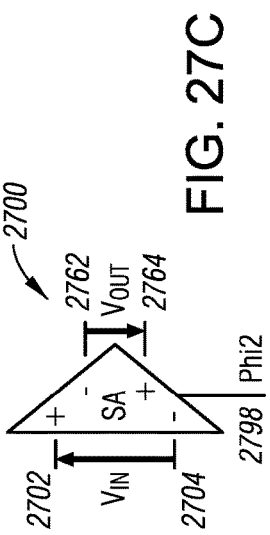
FIG. 27A
FIG. 27B
FIG. 27C

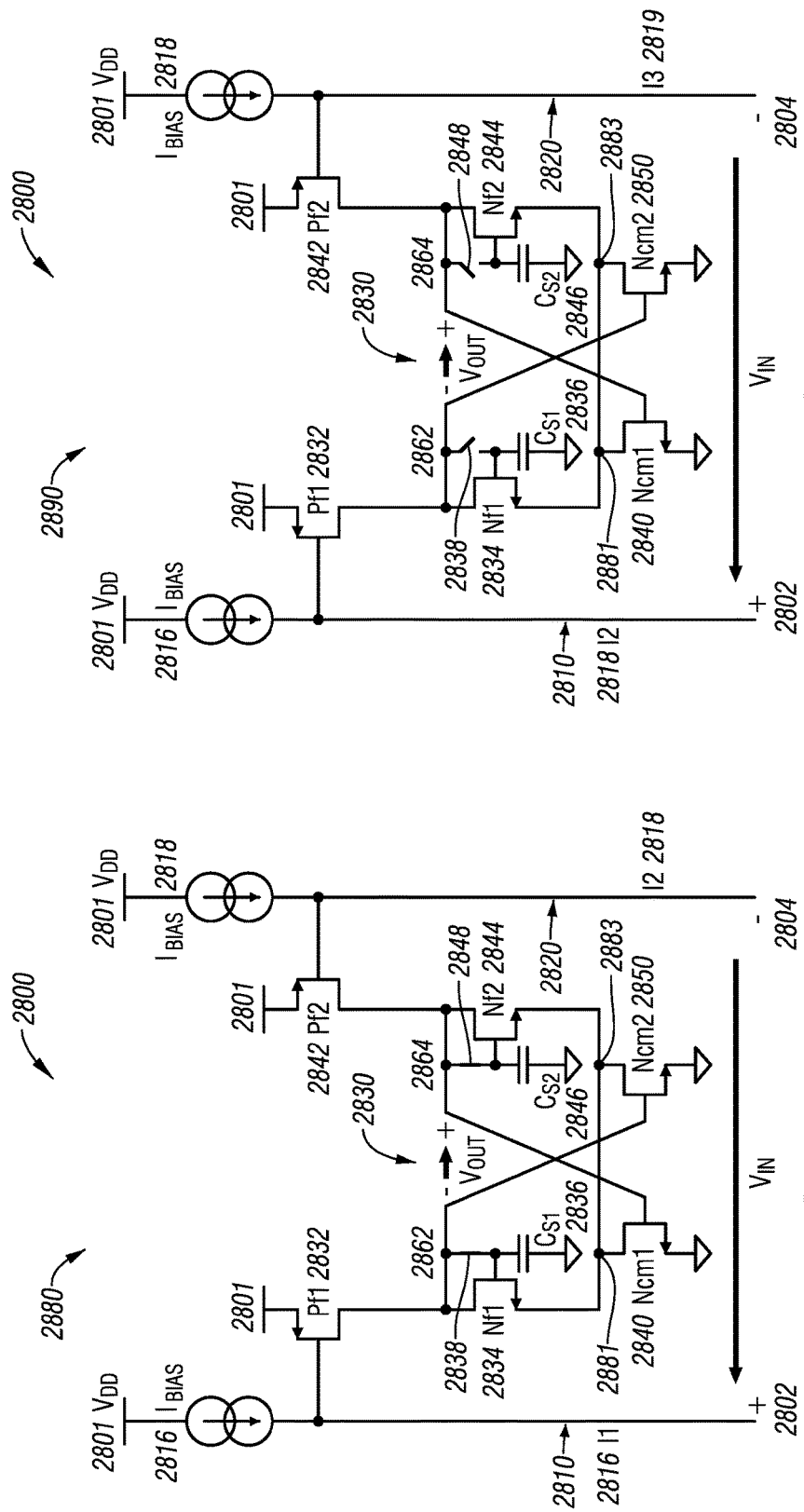

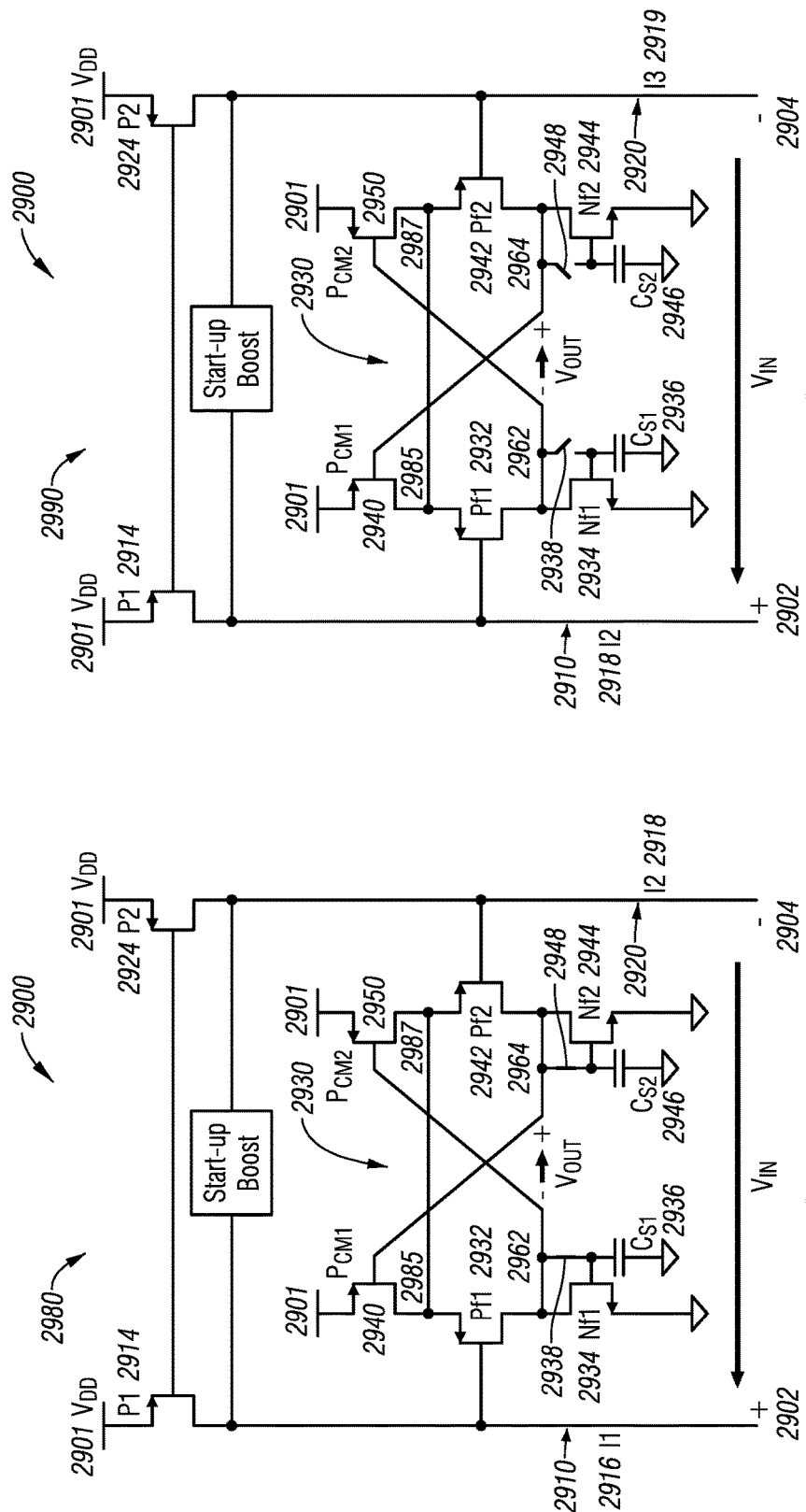

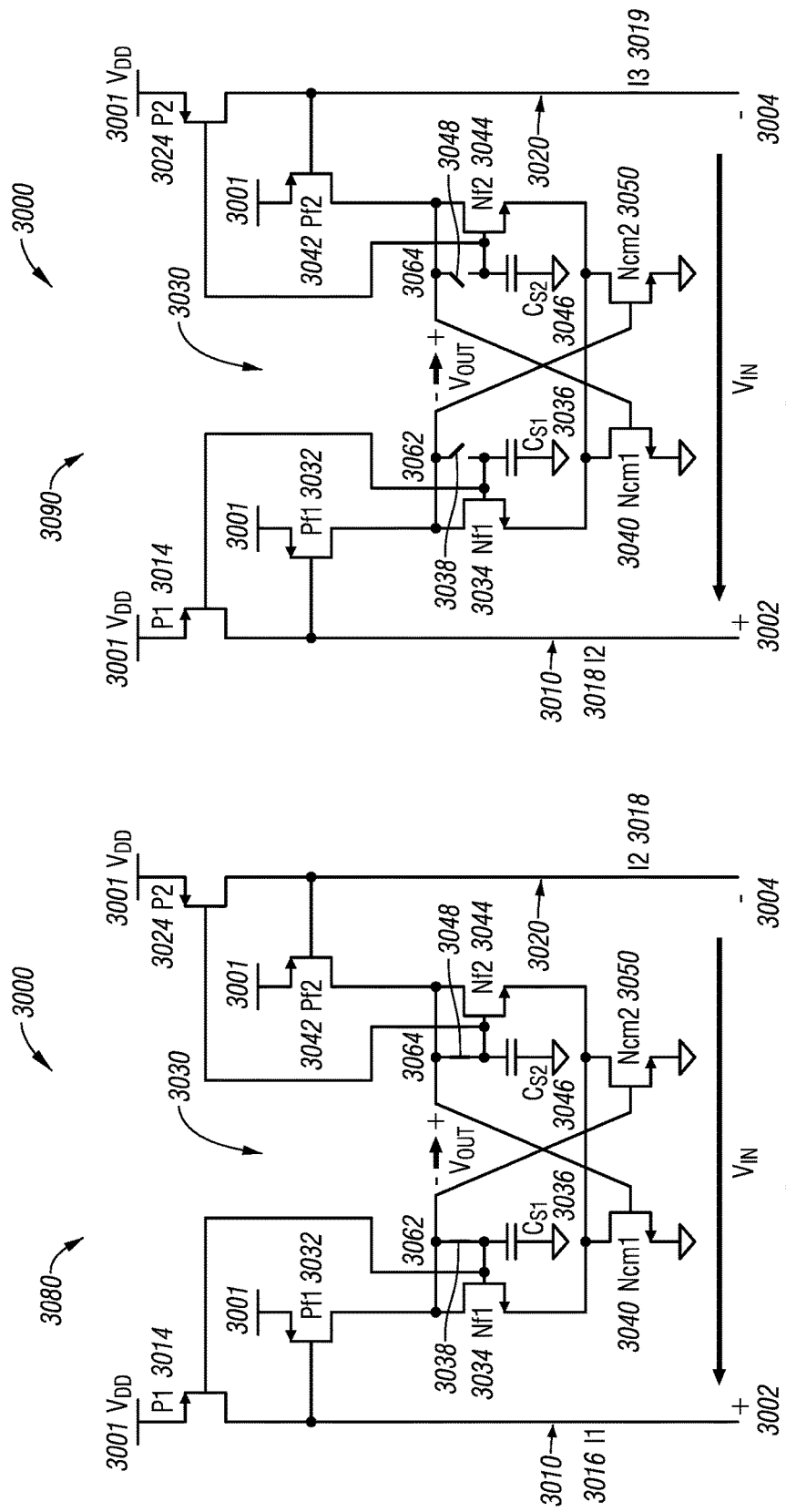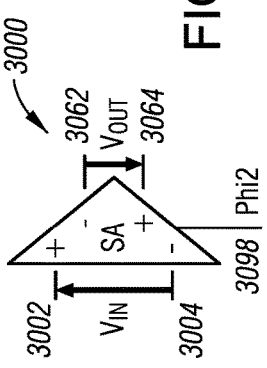
FIG. 30A
FIG. 30B
FIG. 30C

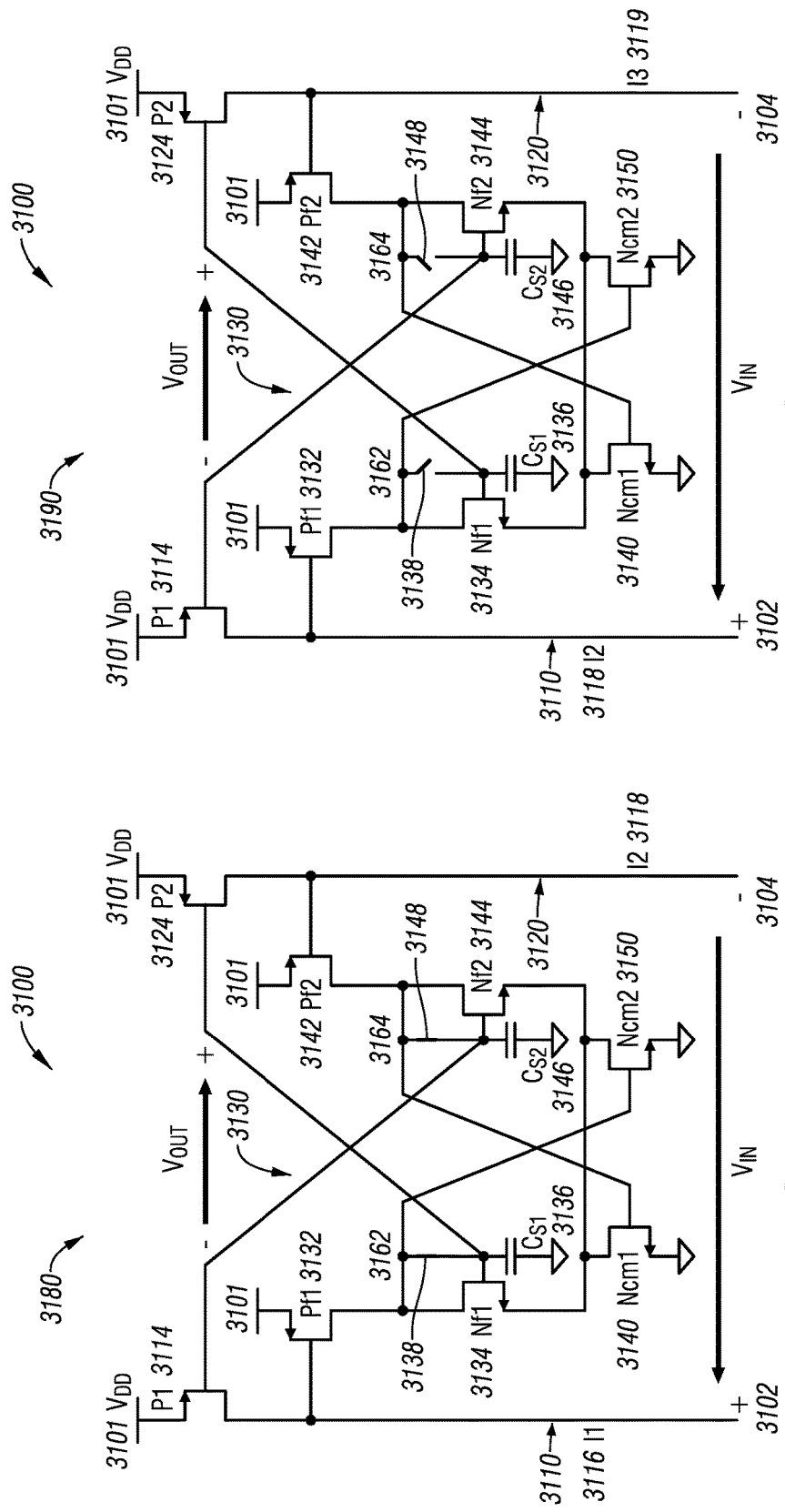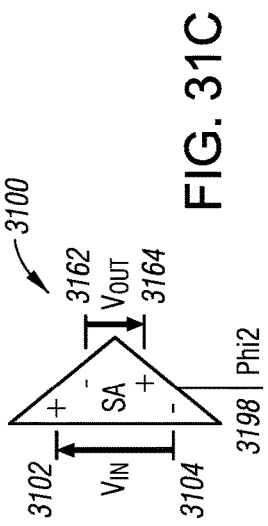
FIG. 31A
FIG. 31B
FIG. 31C

AMPLIFIER CIRCUIT DEVICES AND METHODS

I. CROSS-REFERENCE TO RELATED APPLICATION

This application claims the benefit of U.S. Provisional Application No. 62/768,415, filed Nov. 16, 2018.

II. FIELD

The present disclosure is generally related to amplifier circuit devices and methods.

III. DESCRIPTION OF RELATED ART

Unlike conventional random-access memory (RAM) chip technologies, in magnetic RAM (MRAM), data is not stored as electric charge but is instead stored by magnetic polarization of storage elements. The storage elements are formed from two ferromagnetic layers separated by a tunneling layer. One of the two ferromagnetic layers that is referred to as the fixed layer or pinned layer has a magnetization that is fixed in a particular direction. The other ferromagnetic magnetic layer that is referred to as the free layer has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To read data in a conventional MRAM, a read-current flows through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bit-cell of the MRAM. The two different resistances represent a logic "0" and a logic "1" value stored by the MTJ.

The two different resistances of the MTJ in a bit-cell of the MRAM is illustrated as low-resistive state (LRS) and high-resistive state (HRS) distributions when comparing the log number of read operation samples and the resistance (kΩ) on a two-dimensional Cartesian graph. When doing so, however, the "tail bits" of the two distributions may "overlap" at its point of differentiation. For example, an embedded MRAM (eMRAM) can exhibit exceedingly narrow read margins at the tail bits of the LRS and HRS distributions, and it is often difficult to accurately discern between the LRS and HRS resistances. Yet, it may be desirable to "sense" (i.e., provide sense amplifier offset cancellation) these tail bits, because at the crossing point of the LRS and HRS distributions is the limit of read yield requirements.

Current sense amplifiers are special-purpose amplifiers that output a voltage proportional to the current flowing in a power rail. Generally, these amplifiers utilize a current-sense "resistor-like" device to convert a load current in a power rail to a small voltage, which is then amplified by the current-sense amplifiers. For reading MTJs in a bit-cell of an MRAM, a conventional sensing circuit may be used to determine the differential voltage and a conventional current sense amplifier may be used to amplify the differential voltage to an amplified voltage. Accordingly, the conventional current sense amplifier's output may be used to determine (i.e., read) the logical state of the MRAM bit-cell. Nevertheless, especially in the context of the low voltage and low power design considerations, there is a need in the art for a current sense amplifier circuit that can provide offset cancellation such that accurate read yield requirements may be achieved for the tail bits of LRS and HRS distributions.

IV. BRIEF DESCRIPTION OF THE DRAWINGS

FIGS. 1A and 1B are circuit diagrams of an example amplifier system 100 during a sampling phase and amplification phase, respectively. FIG. 1C illustrates the system 100 as an example electronic circuit symbol.

FIGS. 3A and 3B are circuit diagrams of an example amplifier system 300 during a sampling phase and amplification phase, respectively. FIG. 3C illustrates the system 300 as an example electronic circuit symbol.

FIGS. 4A and 4B are circuit diagrams of an example amplifier system 400 during a sampling phase and amplification phase, respectively. FIG. 4C illustrates the system 400 as an example electronic circuit symbol.

FIGS. 5A and 5B are circuit diagrams of an example amplifier system 500 during a sampling phase and amplification phase, respectively. FIG. 5C illustrates the system 500 as an example electronic circuit symbol.

FIGS. 6A and 6B are circuit diagrams of an example amplifier system 600 during a sampling phase and amplification phase, respectively. FIG. 6C illustrates the system 600 as an example electronic circuit symbol.

FIGS. 7A and 7B are circuit diagrams of an example amplifier system 700 during a sampling phase and amplification phase, respectively. FIG. 7C illustrates the system 700 as an example electronic circuit symbol.

FIGS. 8A and 8B are circuit diagrams of an example amplifier system 800 during a sampling phase and amplification phase, respectively. FIG. 8C illustrates the system 800 as an example electronic circuit symbol.

FIGS. 9A and 9B are circuit diagrams of an example amplifier system 900 during a sampling phase and amplification phase, respectively. FIG. 9C illustrates the system 900 as an example electronic circuit symbol.

FIGS. 10A and 10B are circuit diagrams of an example amplifier system 1000 during a sampling phase and amplification phase, respectively. FIG. 10C illustrates the system 1000 as an example electronic circuit symbol.

FIGS. 11A and 11B are circuit diagrams of an example amplifier system 1100 during a sampling phase and amplification phase, respectively. FIG. 11C illustrates the system 1100 as an example electronic circuit symbol.

FIGS. 15A and 15B are circuit diagrams of an example amplifier system 1500 during a sampling phase and amplification phase, respectively. FIG. 15C illustrates the system 1500 as an example electronic circuit symbol.

FIGS. 16A and 16B are circuit diagrams of an example amplifier system 1600 during a sampling phase and amplification phase, respectively. FIG. 16C illustrates the system 1600 as an example electronic circuit symbol.

FIGS. 17A and 17B are circuit diagrams of an example amplifier system 1700 during a sampling phase and amplification phase, respectively. FIG. 17C illustrates the system 1700 as an example electronic circuit symbol.

FIGS. 18A and 18B are circuit diagrams of an example amplifier system 1800 during a sampling phase and amplification phase, respectively. FIG. 18C illustrates the system 1800 as an example electronic circuit symbol.

FIGS. 19A and 19B are circuit diagrams of an example amplifier system 1900 during a sampling phase and amplification phase, respectively. FIG. 19C illustrates the system 1900 as an example electronic circuit symbol.

FIGS. 20A and 20B are circuit diagrams of an example amplifier system 1900 during a sampling phase and amplification phase, respectively. FIG. 20C illustrates the system 1900 as an example electronic circuit symbol.

FIGS. 23A and 23B are circuit diagrams of an example amplifier system 2300 during a sampling phase and amplification phase, respectively. FIG. 23C illustrates the system 2300 as an example electronic circuit symbol.

FIGS. 24A and 24B are circuit diagrams of an example amplifier system 2400 during a sampling phase and amplification phase, respectively. FIG. 24C illustrates the system 2400 as an example electronic circuit symbol.

FIGS. 25A and 25B are circuit diagrams of an example amplifier system 2500 during a sampling phase and amplification phase, respectively. FIG. 25C illustrates the system 2500 as an example electronic circuit symbol.

FIGS. 26A and 26B are circuit diagrams of an example amplifier system 2600 during a sampling phase and amplification phase, respectively. FIG. 26C illustrates the system 2600 as an example electronic circuit symbol.

FIGS. 27A and 27B are circuit diagrams of an example amplifier system 2700 during a sampling phase and amplification phase, respectively. FIG. 27C illustrates the system 2700 as an example electronic circuit symbol.

FIGS. 28A and 28B are circuit diagrams of an example amplifier system 2800 during a sampling phase and amplification phase, respectively. FIG. 28C illustrates the system 2800 as an example electronic circuit symbol.

FIGS. 29A and 29B are circuit diagrams of an example amplifier system 2900 during a sampling phase and amplification phase, respectively. FIG. 29C illustrates the system 2900 as an example electronic circuit symbol.

FIGS. 30A and 30B are circuit diagrams of an example amplifier system 3000 during a sampling phase and amplification phase, respectively. FIG. 30C illustrates the system 3000 as an example electronic circuit symbol.

FIGS. 31A and 31B are circuit diagrams of an example amplifier system 3100 during a sampling phase and amplification phase, respectively. FIG. 31C illustrates the system 3100 as an example electronic circuit symbol.

IV. DETAILED DESCRIPTION

Figures 2A, 2B:
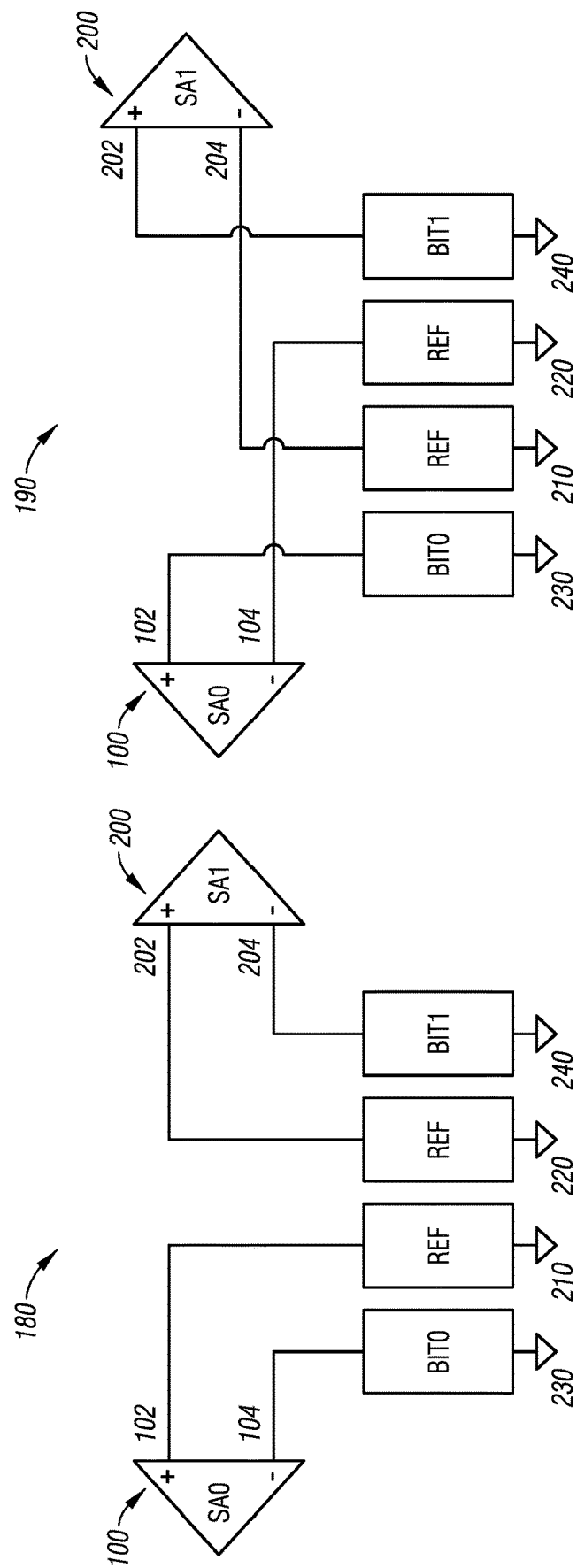
FIGS. 2A and 2B illustrates input coupling of two example amplifier systems according to certain embodiments.

According to one implementation of the present disclosure, an apparatus including first and second bias circuits and an inner amplifier provides sense amplifier offset cancellation. The inner amplifier includes: first and second current generators configured to replicate respective first and second currents from the first and second bias circuits, first and second transistor devices configured to transform the first and second currents into voltage samples, and first and second capacitors configured to store the voltage samples. In a sampling phase, a sampling of the first and second currents may be performed in the inner amplifier, and further, in an amplification phase, an amplification of the stored voltage samples may also be performed in the inner amplifier.

According to another implementation of the present disclosure, a method includes a sampling phase and an amplification phase. In a sampling phase, a first reference current and a bit current may be received on respective first and second bias circuits of an amplifier circuit. Also, the first reference current and the bit current may be replicated from the first and second bias circuits to respective first and second current generators in an inner amplifier of the amplifier circuit. Furthermore, the first reference current may be converted into a first voltage sample and the bit current may be converted into a second voltage sample at respective first and second transistor devices of the inner amplifier. Also, the first and second voltage samples may be stored at respective first and second capacitors of the inner amplifier. In an amplification phase, the bit current and a second reference current may be received in the amplifier circuit on the respective first and second bias circuits. Additionally, the bit current and the second reference current may be replicated from the first and second bias circuits to the first and second current generators in an inner amplifier of the amplifier circuit. Further, first and second output voltages may be determined at a node between the first current generator and the first transistor device, and at a node between the second current generator and the second transistor device.

According to another implementation of the present disclosure, another apparatus including first and second bias circuits and an inner amplifier provides sense amplifier offset cancellation. The inner amplifier may be configured to determine whether a stored voltage sample corresponding to a bit memory element may indicate a high resistive state or a low resistive state. The inner amplifier includes: first and second current generators configured to replicate respective first and second currents from the first and second bias circuits, first and second transistor devices configured to transform the first and second currents into voltage samples, and first and second capacitors configured to store the voltage samples.

Particular implementations of the present disclosure are described below with reference to the drawings. In the description, common features are designated by common reference numbers throughout the drawings.

Referring to FIGS. 1A-1C, a system 100 (i.e., a current sense amplifier circuit, amplifier circuit) for sense amplifier offset cancellation is shown. As depicted in two phases, a sampling phase 180 (FIG. 1A) and an amplification phase 190 (FIG. 1B), the system 100 includes first and second bias circuits 110, 120 (i.e., first and second: branches, bias branches, pre-amplification branches), and an inner amplifier 130. The first and second bias circuits 110, 120 may be configured to provide current paths for first and second currents, (i.e., 116, (i.e., I2) 118, from respective first and second inputs 102, 104 (e.g., $V_{IN}$ plus and minus input ports) of the system 100 to the inner amplifier 130. Coupled to the first and second bias circuits 110, 120, the inner amplifier 130 may be configured to determine whether a stored voltage sample corresponding to a bit memory element (e.g., as shown in FIGS. 2A, 2B, etc.) indicates a high resistive state or a low resistive state. As described in below paragraphs, voltage samples corresponding to bit memory elements and reference memory elements (as described with reference to FIG. 2) that are coupled to the system 100 are compared in the sampling phase 180 (i.e., sampling stage) and the amplification phase 190 (i.e., amplification stage) of the system 100. FIG. 1C illustrates the system 100 as an example electronic circuit symbol. As depicted, a control signal 198 may also be coupled to the system 100 to control the operation of the sampling phase 180 and the amplification phase 190.

Figure 12:
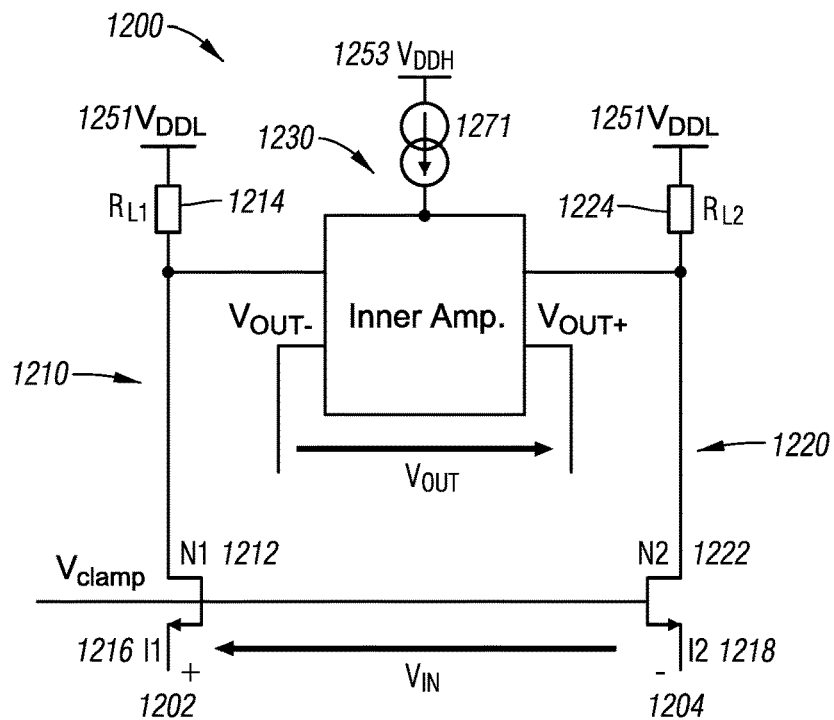
FIG. 12 is a representative circuit diagram of an example amplifier system 1200 during a sampling phase or an amplification phase.
Figure 13:
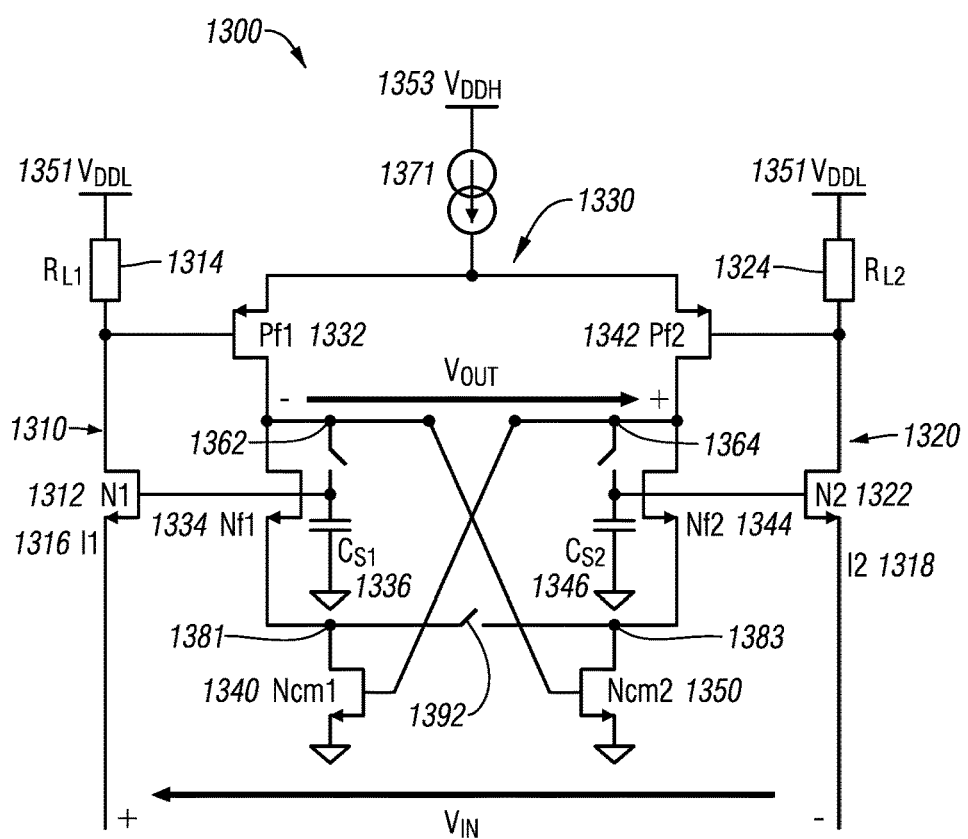
FIG. 13 is a representative circuit diagram of an example amplifier system 1300 during a sampling phase or an amplification phase.
Figure 14:
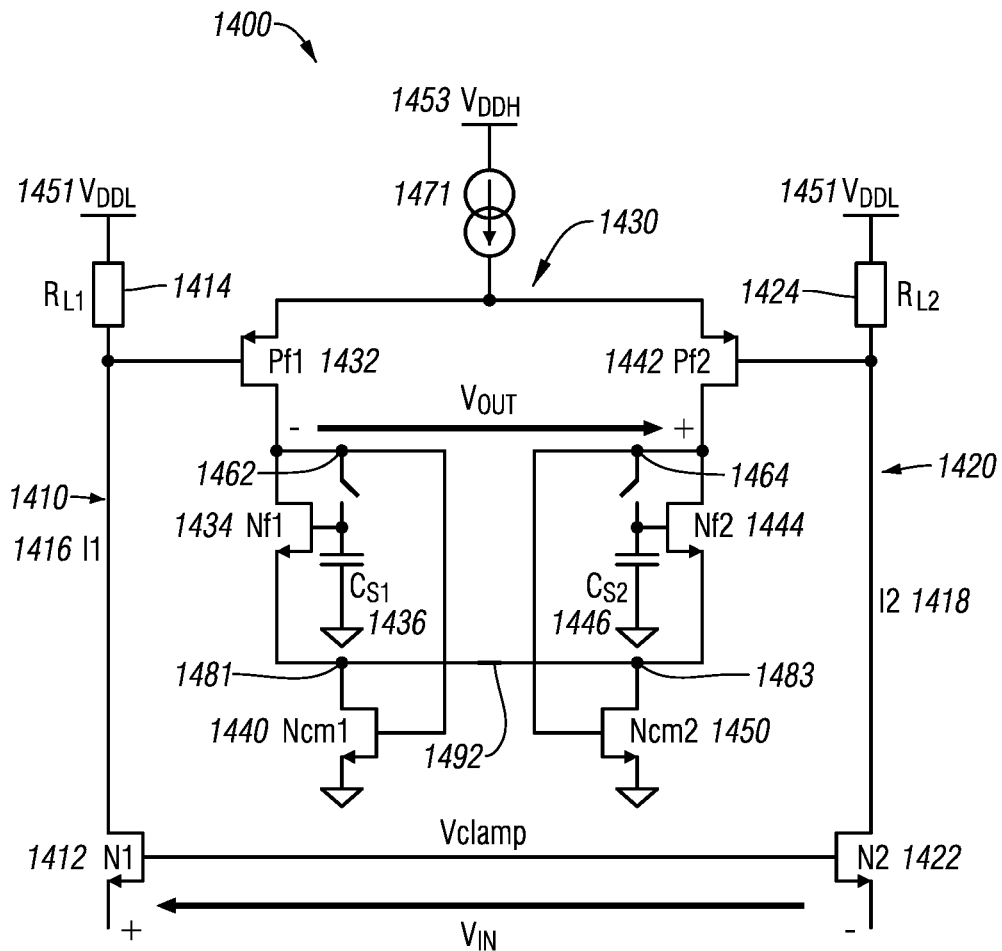
FIG. 14 is a representative circuit diagram of an example amplifier system 1400 during a sampling phase or an amplification phase.

The first and second bias circuits 110, 120 may be coupled between a power supply 101 and the first and second inputs 102, 104, respectively. As depicted in FIG. 1, the first and second bias circuits may include first and second voltage drop elements 114, 124 between the respective input ports 102, 104 and the power supply 101. In certain implementations, the first and second voltage drop elements 114, 124 may comprise diode-connected transistor devices (e.g., PMOS-type (e.g., PMOS) devices as shown in FIGS. 1, 3-11, and 15-20) such as, for example, in low voltage operations. In other implementations, the first and second voltage drop elements 114, 124 may comprise resistance elements (e.g., as shown in FIGS. 12-14) such as for certain ultra-low voltage operations (as described in below paragraphs).

The inner amplifier 130 may include first and second current generators (Pf1, Pf2) 132, 142 (i.e., first and second current sources), first and second transistors (Nf1, Nf2) 134, 144, and first and second capacitors (CS1, CS2) 136, 146. In certain implementations, the first and second current generators 132, 142 may be configured to replicate the first and second currents ($I_1$, $I_2$) 116, 118 provided from the first and second bias circuits 110, 120, respectively, for the inner amplifier 130. Provided from the first and second current generators (Pf1, Pf2) 132, 142, the first and second transistors (Nf1, Nf2) 134, 144 may transform (i.e., to convert) the first and second currents 116, 118 into voltage samples (i.e., sense voltages). As described herein, the first and second transistors (Nf1, Nf2) 134, 144 are diode-connected transistor devices (e.g., NMOS devices) that operate as voltage drop elements during the sampling phase 180 and current generators during the amplification phase 190 in FIG. 1 (and for all other implementations as illustrated in FIGS. 1A-C-22, 28A-C-31A-C herein). The voltage samples are next stored in the first and second capacitors 136, 146. As illustrated, the first current generator, the first transistor device, and the first capacitor may be coupled in a first series arrangement, while the second current generator, the second transistor device, and the second capacitor may be coupled in a second series arrangement.

The inner amplifier 130 may also include first and second switches 138, 148. The first switch 138 may be configured to decouple (i.e., selectively couple) a first output 162 (e.g., minus output port) of the amplifier circuit 100 and a node coupling a gate of the second transistor device 134 and the first capacitor 136. Also, the second switch 148 may be configured to decouple a second output 164 (e.g., plus output port) of the amplifier circuit 100 and a node coupling a gate of the second transistor device 144 and the second capacitor 146. In certain implementations, the coupling and decoupling of the first and second switches 138, 148 allows the system 100 (and the systems as described with reference to FIGS. 2-20) to alternately shift between the sampling phase 180 and the amplification phase 190.

For instance, in operation, the sampling phase 180 may be activated (i.e., initiated) upon the coupling of the first output 162 of the amplifier circuit 100 and the node coupling the gate of the first transistor device 134 and the first capacitor 136, and a coupling of the second output 164 of the amplifier circuit 100 and the node coupling the gate of the second transistor device 144 and the second capacitor 146.

Conversely, in operation, the amplification phase 190 may be initiated upon: a decoupling of the first output 162 of the amplifier circuit 100 and the node coupling the gate of the first transistor device 134 and the first capacitor 136, and a decoupling of the second output 164 of the amplifier circuit 100 and the node coupling the gate of the second transistor device 144 and the second capacitor 146. As explained in greater detail with respect to FIG. 2, during the amplification phase 190, an output voltage ($V_{OUT}$) may be determined based on a combination of a bit current of a bit memory element (e.g., as shown in FIG. 2) and a reference current of a reference memory element (e.g., as shown in FIG. 2). The resulting output voltage corresponds to whether a particular bit memory element has low resistive state or a high resistive state. In certain implementations, the combination of the bit current and the reference current may be determined at a node between the first current generator 132 and the first transistor device 134 and at a node between the second current generator 142 and the second transistor device 144.

The above-mentioned implementations of the sampling and amplification phases 180, 190 may be similarly performed with reference to the inventive systems as described in FIGS. 2-20 and 23-31. The system 100, in particular as described above, may allow for the accurate sensing of either memory elements that output a current or resistive memory elements that are not sensitive to read disturbances. Advantageously, in general, the system 100 (and other example systems 200-2000 as described with reference to FIGS. 2-20, and 23-31 herein) allows for greater accuracy during $V_{DD}$ min read operations for memory elements (e.g., MTJ devices) in bit-cells, while concurrently providing offset cancellation on a single efficient circuit. By performing offset cancellation, the inventive systems (as described with reference to FIGS. 1-20, and 23-31) are able to sense tail bits of LRS and HRS distributions where memory devices (e.g., MRAM) exhibit exceedingly narrow read margins. The capacity to sense the tail bits are of critical importance, because the crossing points of LRS and HRS distributions are at the limits of read yield requirements. The systems (e.g., with reference to FIGS. 3-6, 8-20, and 23-31) may be used along with any resistive memory including, but not limited to CeRAM/MRAM/ReRAM/PCM. The systems (e.g., with reference to FIGS. 1, 7, and 23-31) may also be used in a current-like memory where the output signal is a current, such as, for example, Flash/FeFET/FeRAM.

Referring to FIGS. 2A and 2B, the input coupling of two example systems 100, 200 to first and second reference memory elements 210, 220 and first and second bit memory elements 230, 240 during the sampling phase 180 and the amplification phase 190, respectively, are shown. In other implementations, FIG. 2A may be the amplification phase 190 and FIG. 2B may be the sampling phase 180. For instance, when the first and second switches 138, 148 are decoupled (as explained in above paragraphs), an example system 100 or 200 would be configured to be in the amplification phase 190, while when the first and second switches 138, 148 are coupled (as explained in above paragraphs), an example system, 100 or 200 would be configured to be in the sampling phase 180. The two example systems 100, 200 may be any of the inventive systems as described herein with references to FIGS. 1, 3-20, and 23-31.

In an operation, outside the example systems 100 and 200, for the sampling phase 180, the first reference memory element 210 may be coupled to the first input 102 (e.g., plus port) and the bit that is desired to be read, the first bit memory element 230 may be coupled to the second input 104 (e.g., minus port) of the system 100 (SA0). Likewise, the second reference memory element 220 may be coupled to the first input 202 (e.g. plus port) and the second bit memory element 240 may be coupled to the second input 204 (e.g., minus port) of the system 200 (SA1). Conversely, for the amplification phase 190, the first bit memory element 230 may be coupled to the first input 102 (e.g., plus port) and the second reference memory element 220 may be coupled to the second input 104 (e.g., minus port) of the system 200 (SA0). Likewise, the second reference memory element 220 may be coupled to the first input (e.g., plus port) and the second bit memory element 240 may be coupled to the second input (e.g., minus port) of the system 200 (SA1). Hence, in an example amplification phase, a comparison (as explained in greater detail in below paragraphs) can be made between the desired bits to be read, i.e., the first- and second-bit memory elements 230, 240 and the reference memory elements 210, 220.

In certain implementations, the first and second reference memory elements 210, 220 may be first and second reference memory paths having one or more MTJs. In a particular implementation, each of the reference memory elements may include two MTJ's, where one MTJ is preset with a resistance corresponding to a logic "0" value, while the other MTJ is preset with a with a resistance corresponding to a logic "1" value. Hence, each of the reference memory elements have an aggregate resistance that may be utilized as a reference state that is between the "0" and "1" logic values. Also, the first and second reference memory elements 210, 220 may be similar in terms of mean value (thus, having the same resistive-state), but have different non-correlated distributions.

FIG. 2 depicts the first- and second-bit memory elements 230, 240 and the first and second reference memory elements 210, 220 as resistive memory. In some implementations (not shown), the first and second bit memory elements and first and second reference memory elements may be both current-based memory that output current, resistive memory for the first and second bit memory elements with current-based memory used for the first and second reference memory elements, or current-based memory for the first and second bit memory elements with resistive memory used for the first and second reference memory elements.

In another operation, inside an example system 100 (or any of the systems 200-2000), in the sampling phase 180 (e.g., 280, 380, etc.), first and second currents ($I_1$) 116, ($I_2$) 118 associated with the first reference memory element 210 and the first bit memory element 230 are received in respective first and second bias circuits 110, 120. In certain instances, the first and second currents 116, 118 are generated by clamping a voltage on the impedances of the first reference memory element 210 and the first bit memory element 230. In other instances (where the first reference memory element 210 and the first bit memory element 230 are current-based memory that output current), the first and second currents 116, 118 are already provided at the respective first and second bias circuits 110, 120. Upon the combination of the first and second currents 116, 118 with the voltage drop element 114, 124 (e.g., a resistance device) with the first and second currents 116, 118, an input voltage is generated for the inner amplifier 130. Subsequently, the generated input voltage allows the first and second currents 116, 118 to be replicated from the first and second bias circuits 110, 120 to first and second current generators (e.g., Pf1) 132, (e.g., Pf2) 142, respectively, of the inner amplifier 130. The replicated first reference current and bit current is next converted into respective first and second voltage samples at respective first and second transistor devices 134 (e.g., Nf1) 144, (e.g., Nf2) of the inner amplifier 130. Upon conversion, the first and second voltage samples are then stored at respective first and second capacitors (CS1) 136, (CS2) 146. During the amplification phase 190 (e.g., 290, 390, etc.), inside the example system 100 (or any of the systems 200-2000), second and third currents ($I_2$) 118, ($I_3$) 119 associated with impedances of the first bit memory element 230 and a second reference memory element 220, respectively are received in the respective first and second bias circuits 110, 120. Next, the bit current 118 and the second reference current 119 from the first and second bias circuits 110, 120 are replicated to the first and second current generators (e.g., Pf1) 132, (e.g., Pf2) 142, respectively, of the inner amplifier 130. Furthermore, at a node 162 (e.g., 262, 362, etc.) between the first current generator 132 (e.g., Pf1) and the first transistor device 134, (e.g., Nf1) and at a node 164 (e.g., 264, 364, etc.) between the second current generator 142 (e.g., Pf2) and the second transistor device 144, (e.g., $N_{f2}$), first and second output voltages are determined.

In another operation, during the amplification phase, first and second output voltages are determined based on a combination of the bit current of the bit memory element and a reference current of the reference memory element. For example, in each of the systems 100-2000 and 2300-3100 (as described herein with reference to FIGS. 1-20), if the bit memory element has a low-resistive state (LRS) at a given voltage, the bit memory element would have a higher current than the reference current at the same voltage. In contrast, if the bit memory element has a high-resistive state (HRS) at a given voltage, the bit memory element would have a lower current than the reference current. Thus, for instance, if the voltage sample stored on a first capacitor (CS1) from the sampling phase is in an LRS, the voltage on a first comparison node (e.g., 162, 262, 362 etc.) (i.e., $V_{OUT}$ minus node, a node between the first current generator and the first transistor device) coupled to a minus output port (−) would decrease in the amplification phase, as the voltage would follow the higher current. Conversely, if in the amplification phase, the bit current on the second bias circuit has a low resistive state, a second comparison node (e.g., 164, 264, 364, etc.) (i.e., V OUT plus node, a node between the second current generator and second transistor device) would charge and the voltage at a plus output port (+) would increase. Hence, if there is an LRS bit current at the first comparison node, the first output voltage would decrease, and an LRS bit current at the second comparison node would result in the second output voltage increasing. Accordingly, upon combination of the first and second output voltages, a resultant output voltage of the amplifier circuit ($V_{OUT}$) would increase. In contrast, if there is an HRS bit current at the first comparison node, the first output voltage would increase, and an HRS bit current at the second comparison node would result in the second output voltage decreasing. Upon combination of the first and second output voltages, a resultant output voltage of the amplifier circuit ($V_{OUT}$) would decrease. Consequently, the first output voltage may be determined based on a combination of a current associated with the first voltage sample and the second reference current, and the second output voltage may be determined based on a combination of another current associated with second voltage sample and the bit current.

Referring to FIGS. 3A-3C, a system 300 (i.e., a current sense amplifier circuit, amplifier circuit) for sense amplifier offset cancellation is shown. Similar to the system 100, as depicted in two phases: the sampling phase 380 (FIG. 3A) and the amplification phase 390 (FIG. 3B), the system 300 includes first and second bias circuits 310, 320 (i.e., first and second: branches, bias branches, pre-amplification branches) and an inner amplifier 330. In a particular implementation, the inner amplifier 330 may include similar elements and be configured similarly to the inner amplifier 130 as described with reference to FIGS. 1A and 1B. However, in contrast, the first and second bias circuits 310, 320 may further include third and fourth transistor devices 312, 322. The third transistor device 312 may be coupled between the first voltage drop element 314 and the first input 302 (e.g. plus port), and the second transistor device may be coupled between a second voltage drop element 324 and the second input 304 (e.g., minus port). FIG. 3C illustrates the system 300 as an example electronic circuit symbol. As depicted, a control signal 398 may also be coupled to the system 300 to control the operation of the sampling phase 380 and the amplification phase 390.

In operation, the system 300 may be configured to receive an external clamping voltage (i.e., a drive voltage, Vclamp) on at least one of the respective gates of the third and fourth transistor devices (e.g., N1) 312, (e.g., N2) 322. Generated in response to the external clamping voltage, the first and second currents 116, 118 are provided to the first and second bias circuits 110, 120 to be transmitted to the inner amplifier 130. As a particular advantage, the system 300 allows for the accurate sensing of bit memory elements of MRAM-like devices (e.g., CeRAM/ReRAM/PCM), especially if the bit memory elements have constrained read disturb requirements.

Referring to FIGS. 4A-4C, a system 400 (i.e., a current sense amplifier circuit, amplifier circuit) for sense amplifier offset cancellation is shown. Similar to the systems described above, as depicted in two phases: the sampling phase 480 (FIG. 4A) and the amplification phase 490 (FIG. 4B), the system 400 includes first and second bias circuits 410, 420 (i.e., first and second: branches, bias branches, pre-amplification branches), and an inner amplifier 430. In a particular implementation, the first and second bias circuits 410, 420 may include similar elements and be configured similarly to the first and second bias circuits 110, 120 as described with reference to FIGS. 1A and 1B. However, in contrast, the inner amplifier 430 may further include first and second common-mode transistor devices (i.e., Ncm1, Ncm2) (e.g., NMOS devices or NPN devices) 440, 450. In one particular implementation, in the inner amplifier 430, the first common-mode transistor device 440 may be coupled between a first node 481 and ground, while the second common-mode transistor 450 may be coupled between a second node 483 and the ground. FIG. 4C illustrates the system 400 as an example electronic circuit symbol. As depicted, a control signal 498 may also be coupled to the system 400 to control the operation of the sampling phase 480 and the amplification phase 490.

In certain implementations illustrating "cross-coupling" (as depicted in FIGS. 4A-4B), a gate of the second common-mode transistor device 450 may be coupled to a first output (e.g., minus port) 462 of the amplifier circuit 400 and a gate of the first common-mode transistor device 440 may be coupled to a second output (e.g., plus port) 464 of the amplifier circuit 400. In implementations illustrating "parallel-coupling" ("non-cross-coupling") (not shown), the gate of the first common-mode transistor device 440 may be coupled to the first output (e.g., minus port) 462 of the amplifier circuit 400 and the gate of the second common-mode transistor device 450 may be coupled to the second output 464 (e.g., plus port) of the amplifier circuit 400.

In each of these implementations (including those depicted in FIGS. 4A-4B and its variations), the first and second common-mode transistor devices 440, 450 may be NMOS or NPN transistor devices. In alternative implementations (not shown), the first and second common-mode transistor devices 440, 450 may be PMOS devices or PNP transistor devices. As an example, if the reference memory elements coupled to the amplifier 400 are coupled to ground, NMOS or NPN transistor devices may be used for the first and second common-mode transistor devices 440, 450. Alternatively, if the reference memory elements coupled to the amplifier 400 are coupled to a power line (e.g., $V_{DD}$), PMOS or PNP transistor devices may be used for the first and second common-mode transistor devices 440, 450. In operation, the first and second common-mode transistor devices 440, 450 may be configured to control common-mode voltage during the amplification phase 490.

In a particular implementation, a "half-latch" feature may be included in the system 400. For instance, the inner amplifier 430 may further include a third switch (not shown). The third switch may be coupled between the first node 481 and the second node 483, where the first node 481 may couple the first transistor device 434 and the first common-mode transistor device 440, and the second node 483 may couple the second transistor device 444 and the second common-mode transistor device 450. In operation, during the sampling phase 480, the third switch may be "closed", such that the first node 481 may be coupled to the second node 483. During the amplification phase 490, the third switch may be "open", such that the first node 481 is not coupled to the second node 483. Advantageously, the first and second latch switches allow the system 400 to resemble a "full-latch device", thus providing for improved performance and efficient usage by having two stable states where the system 400 may be used to store state information as digital values.

In certain implementations, the system 400 may not require an external clamping voltage (i.e., a drive voltage), and thus may not require third and fourth transistor devices 412, 422. In such implementations, the system 400 may be coupled to: current-based memory (for both the bit and reference memory elements) on both plus and minus input ports 402, 404 of the system 400; a resistive bit memory element and a current-based reference memory element; a current-based bit memory element and a resistive reference memory element; or resistive memory (for both the bit and reference memory elements) with limited read distribution requirements (i.e., where its impedance may not be "read-disturb" sensitive). Examples of current-based memory may include but are not limited to flash/ferroelectric RAM (Fe-RAM). Advantageously, various techniques and technologies described in this paragraph may be implemented with circuit designs including the "half-latch" feature (as described above). Moreover, various techniques and technologies described in this paragraph may be implemented with either "cross-coupling" or "non-cross-coupling" of the common-mode transistor devices 440, 450 and the output ports 462, 464 (as described above).

Referring to FIGS. 5A-5C, a system 500 (i.e., a current sense amplifier circuit, amplifier circuit) for sense amplifier offset cancellation is shown. Similar to the systems described above, as depicted in two phases: the sampling phase 580 (FIG. 5A) and the amplification phase 590 (FIG. 5B), the system 500 includes first and second bias circuits 510, 520 (i.e., first and second branches), and an inner amplifier 530. In a particular implementation, the first and second bias circuits 510, 520 may include similar elements and be configured similarly to the system 400 as described with reference to FIGS. 4A-4B. However, in contrast, in the inner amplifier 530, the first common-mode transistor device 540 (Pcm1) may be coupled between a power supply 501 and a first node 585 coupling the first current generator 532 (Pf1) and a second node 587. Also, the second common-mode transistor device 550 (Pcm2) may be coupled between the power supply 501 and the second node 587 coupling the second current generator 542 (Pf2) and the first node 585. FIG. 5C illustrates the system 500 as an example electronic circuit symbol. As depicted, a control signal 598 may also be coupled to the system 500 to control the operation of the sampling phase 580 and the amplification phase 590.

In certain implementations illustrating "cross-coupling" (as depicted in FIGS. 5A-5B), a gate of the second common-mode transistor device 550 (Pcm2) may be coupled to a first output (e.g., minus port) 562 of the amplifier circuit 500 and a gate of the first common-mode transistor device 540 (Pcm1) may be coupled to a second output (e.g., plus port) 564 of the amplifier circuit 500. In other implementations representing "non-cross coupling" (not shown), the gate of the first common-mode transistor device 540 (Pcm1) may be coupled to the first output (e.g., minus port) 562 of the amplifier circuit 500 and the gate of the second common-mode transistor device 550 (Pcm2) may be coupled to the second output 564 (e.g., plus port) of the amplifier circuit 500.

In each of the implementations (as described in the previous paragraph directly above including those depicted in FIGS. 5A-5B), the first and second common-mode transistor devices 540, 550 may be PMOS or PNP transistor devices. In alternative implementations (not shown), the first and second common-mode transistor devices 540, 550 may be NMOS devices or NPN transistor devices. As an example, if the reference memory elements coupled to the amplifier 500 are coupled to ground, PMOS or PNP transistor devices may be used for the first and second common-mode transistor devices 540, 550. Alternatively, if the reference memory elements coupled to the amplifier 500 are coupled to a power line (e.g., $V_{DD}$), NMOS or NPN transistor devices may be used for the first and second common-mode transistor devices 540, 550.

In operation, the first and second common-mode transistor devices 540, 550 are configured to control common-mode voltage during the amplification phase 590. In a particular implementation, similar to the system 400, a "half-latch" feature may be included in the system 500. For instance, the inner amplifier 530 may further include a third switch (not shown). The third switch may be coupled between the first node 585 and the second node 587, where the first node 585 may couple the first current generator device 532 and the first common-mode transistor device 540, and the second node 587 may couple the second current generator device 542 and the second common-mode transistor device 550. Advantageously, the third switch allows the system 500 to resemble a half-latch device, thus providing for improved performance and efficient usage by having two stable states where the system 500 may be used to store state information as digital values.

In certain implementations, the system 500 may not require an external clamping voltage (i.e., a drive voltage), and thus may not require third and fourth transistor devices 512, 522. In such implementations, the system 500 may be coupled to: current-based memory (for both the bit and reference memory elements) on both plus and minus input ports 502, 504 of the system 500; a resistive bit memory element and a current-based reference memory element; a current-based bit memory element and a resistive reference memory element; or resistive memory (for both the bit and reference memory elements) with limited read distribution requirements (i.e., where impedance may not be "read-disturb" sensitive). Examples of current-based memory may include but are not limited to flash/ferroelectric RAM (Fe-RAM).

Advantageously, various techniques and/or technologies described in this paragraph may be implemented with circuit designs including the "half-latch" feature (as described above). Moreover, various techniques and/or technologies described in this paragraph may be implemented with either "cross-coupling" or "non-cross-coupling" of the common-mode transistor devices 540, 550 and the output ports 562, 564 (similar to as described in above paragraphs).

Referring to FIGS. 6A-6C, a system 600 (i.e., a current sense amplifier circuit, amplifier circuit) for sense amplifier offset cancellation is shown. Similar to the system 300, as depicted in two phases: the sampling phase 680 (FIG. 6A) and the amplification phase 690 (FIG. 3B), the system 600 includes first and second bias circuits 610, 620 (i.e., first and second branches), and an inner amplifier 630. In a particular implementation, the system 600 may include similar elements and be configured similarly to the system 300 as described with reference to FIGS. 3A and 3B. However, in contrast, in the system 600, the inner amplifier 630 may be coupled to a voltage controlled current source 660. In example implementations, the voltage controlled current source 660 may be configured to regulate (e.g., adjust, control) a common-mode voltage of the inner amplifier 630. In a particular implementation, the voltage controlled current source 660 includes a PMOS device 662 coupled to an external amplifier 674. FIG. 6C illustrates the system 600 as an example electronic circuit symbol. As depicted, a control signal 698 may also be coupled to the system 600 to control the operation of the sampling phase 680 and the amplification phase 690.

Referring to FIGS. 7A-7C, a system 700 (i.e., a current sense amplifier circuit, amplifier circuit) for sense amplifier offset cancellation is shown. Similar to the system 400 described above, as depicted in two phases: the sampling phase 780 (FIG. 7A) and the amplification phase 790 (FIG. 7B), the system 700 includes first and second bias circuits 710, 720 (i.e., first and second branches), and an inner amplifier 730. In a particular implementation, the first and second bias circuits 710, 720 and the inner amplifier 730 may include similar elements and be configured similarly to implementations described with reference to the first and second bias circuits 410, 420 and the inner amplifier 430. For example, the inner amplifier 730 of the system 700 may include first and second common-mode transistor devices 740, 750 (Ncm1, Ncm2) and a third switch 723. Moreover, like the system 400, the system 700 may not require an external clamping voltage. Hence, as an alternative implementation, in the system 700, a gate of the third transistor device 712 may be coupled to a gate of the first transistor device 734 and a gate of the second transistor device 722 may be coupled to a gate of the second transistor device 744. Advantageously, in operation, the system 700 does not require an external clamping voltage as a clamping voltage may be automatically generated internally and is thus "process aware". FIG. 7C illustrates the system 700 as an example electronic circuit symbol. As depicted, a control signal 798 may also be coupled to the system 700 to control the operation of the sampling phase 780 and the amplification phase 790.

In certain cases, the system 700 may be implemented with circuit designs including the "half-latch" feature (as described in above paragraphs), and either the "cross-coupling" or "non-cross-coupling" (as described in above paragraphs).

Advantageously, the systems 100-700 (as depicted in FIGS. 1-7) and its variations enable low voltage operation. In particular, as the first and second bias circuits including first and second voltage drop elements (P1, P2) and the third and fourth transistors (N1, N2) are decoupled from the inner amplifier, "bias paths" and "amplification stages" may be decoupled, allowing for operation with low voltage power supply. For instance, in certain implementations, the minimum acceptable voltage on the power supply (e.g., $V_{DD}$, $V_{DDL}$) may be Vgsp1+VdsatN1+Vin that totals to approximately 0.9V. Implementations of the systems (e.g., system 700) employing a process aware clamping voltage (i.e., Vclamp) may be automatically scaled with regard to corners, and thus allowing for very low read bit line voltage (i.e., down to approximately to 100 mV). Moreover, as a result of respective low impedance nodes on the bias circuits coupled to the one or more MTJs, faster settling time may be achieved.

Referring to FIGS. 8A-8C, a system 800 (i.e., a current sense amplifier circuit, amplifier circuit) for ultra-low voltage sense amplifier offset cancellation is shown. Similar to the system 400 described above, as depicted in two phases: the sampling phase 880 (FIG. 8A) and the amplification phase 890 (FIG. 8B), the system 800 includes first and second bias circuits 810, 820 (i.e., first and second branches. first and second bias branches), and an inner amplifier 830. In a particular implementation, the first and second bias circuits 810, 820 and the inner amplifier 830 may include similar elements and be configured similarly to implementations described with reference to the first and second bias circuits 410, 420 and the inner amplifier 430. However, in contrast, the system 800 includes a first power supply (e.g., $V_{DDL}$) 851, and a second power supply (e.g., $V_{DDH}$) 853. The first power supply 851 may be coupled to the first and second bias circuits 810, 820, while the second power supply 853 may be coupled to the inner amplifier 830. In one implementation, the first power supply 851 and the second power supply 853 may provide different voltages to the amplifier circuit 800. In another implementation, the first power supply 851 may provide a lower voltage than the second voltage supply 853. FIG. 8C illustrates the system 800 as an example electronic circuit symbol. As depicted, a control signal 898 may also be coupled to the system 800 to control the operation of the sampling phase 880 and the amplification phase 890.

In certain cases, the system 800 may be implemented with circuit designs including the "half-latch" feature (as described in above paragraphs), and either the "cross-coupling" or "non-cross-coupling" (as described in above paragraphs).

Referring to FIGS. 9A-9C, a system 900 (i.e., a current sense amplifier circuit, amplifier circuit) for ultra-low voltage sense amplifier offset cancellation is shown. Similar to the system 500 described above, as depicted in two phases: the sampling phase 980 (FIG. 9A) and the amplification phase 990 (FIG. 9B), the system 900 includes first and second bias circuits 910, 920 (i.e., first and second branches), and an inner amplifier 930. In a particular implementation, the first and second bias circuits 910, 920 and the inner amplifier 930 may include similar elements and be configured similarly to implementations described with reference to the first and second bias circuits 510, 520 and the inner amplifier 530. However, in contrast, the system 900 may include a first power supply 951 (e.g., $V_{DDL}$), and a second power supply 953 (e.g., $V_{DDH}$). The first power supply 951 may be coupled to the first and second bias circuits 910, 920, while the second power supply 953 may be coupled to the inner amplifier 930. In one implementation, the first power supply 951 and the second power supply 953 may provide different voltages to the amplifier circuit 900. In another implementation, the first power supply 951 may provide a lower voltage than the second voltage supply 953. FIG. 9C illustrates the system 900 as an example electronic circuit symbol. As depicted, a control signal 998 may also be coupled to the system 900 to control the operation of the sampling phase 980 and the amplification phase 990.

In certain cases, the system 900 may be implemented with circuit designs including the "half-latch" feature (as described in above paragraphs), and either the "cross-coupling" or "non-cross-coupling" (as described in above paragraphs).

Referring to FIGS. 10A-10C, a system 1000 (i.e., a current sense amplifier circuit, amplifier circuit) for ultra-low voltage sense amplifier offset cancellation is shown. Similar to a combination of the systems 400 and 500 described above, as depicted in two phases: the sampling phase 1080 (FIG. 10A) and the amplification phase 1090 (FIG. 10B), the system 1000 includes first and second bias circuits 1010, 1020 (i.e., first and second branches), and an inner amplifier 1030. In a particular implementation, the first and second bias circuits 1010, 1020 and the inner amplifier 1030 may include similar elements to implementations described with reference FIGS. 4 and 5. However, in contrast, the inner amplifier 1030 may include first, second, third, and fourth common-mode transistor devices 1040, 1050, 1060, 1070 (e.g., Ncm1, Ncm2, Pcm1, Pcm2). Advantageously, the first, second, third, and fourth common-mode transistor devices 1040, 1050, 1060, 1070 may be configured to control common-mode voltage during the amplification stage 1090. FIG. 10C illustrates the system 1000 as an example electronic circuit symbol. As depicted, a control signal 1098 may also be coupled to the system 1000 to control the operation of the sampling phase 1080 and the amplification phase 1090.

The system 1000 may include a first power supply 1051 (e.g., $V_{DDL}$), and a second power supply 1053 (e.g., $V_{DDH}$). The first power supply 1051 may be coupled to the first and second bias circuits 1010, 1020, while the second power supply 1053 may be coupled to the inner amplifier 1030. In one implementation, the first power supply 1051 and the second power supply 1053 may provide different voltages to the amplifier circuit 1000. In another implementation, the first power supply 1051 may provide a lower voltage than the second voltage supply 1053.

In a particular implementation (as shown in FIGS. 10A-10B), the first and second common-mode transistor devices 1040, 150 may be NMOS devices or NPN devices, while the third and fourth common-mode transistor devices 1060, 170 may be PMOS devices or PNP devices. In operation, the first and second, third, and fourth common-mode transistor devices 1040, 1050, 1060, 170 may be configured to provide greater common-mode voltage control during the amplification phase 1090.

In certain examples illustrating "cross-coupling" (as shown in FIGS. 10A-10B), gates of the first and third common-mode transistor devices 1040, 1060 may be coupled to a second output 1064 (plus port) of the amplifier circuit 1000 and gates of the second and fourth common-mode 1050, 1070 transistor devices are coupled to a first output 1062 (minus port) of the amplifier circuit 1000. In other examples illustrating "non-cross-coupling" (not shown), gates of the first and third common-mode transistor devices 1040, 1060 may be coupled to a first output 1062 (minus port) of the amplifier circuit 1000 and gates of the second and fourth common-mode 1050, 1070 transistor devices are coupled to the second output 1062 (plus port) of the amplifier circuit 100.

As shown in FIGS. 11A-C, the system 1100 may be identical to the system 1000 (as shown in FIGS. 10A-10B), with the variation of further including a "full-latch" feature. For example, the inner amplifier 1130 of the system 1100 may include first and second latch switches 1192, 1194. The first latch switch 1192 may be coupled between a first node 1181 and a second node 1183 and the second latch switch 1194 may be coupled between a third node 1185 and a fourth node 1187. In one implementation, the first node 1181 may be coupled between the first transistor device 1134 and the first common-mode transistor device 1140, the second node 1183 may be coupled between the second transistor device 1144 and the second common-mode transistor device 1150, the third node 1185 may be coupled between the first current generator device 1132 and the third common-mode transistor device 1160, and the fourth node 1187 may be coupled between the second current generator device 1142 and the fourth common-mode transistor device 1170.

In operation, during the sampling phase 1180, the first and second latch switches may be "closed", such that the first node 1181 may be coupled to the second node 1183 and the third node 1185 may be coupled to the fourth node 1187. During the amplification phase 1190, the first and second latch switches may be "open", such that the first node 1181 is not coupled to the second node 1183 and likewise, the third node 1185 is not coupled to the fourth node 1187. Advantageously, the first and second latch switches allow the system 1100 to resemble a "full-latch device", thus providing for improved performance and efficient usage by having two stable states where the system 1100 may be used to store state information as digital values. In another implementation (not shown), the first latch switch 1192 may instead be coupled between the drains of first and second PMOS devices 1166, 1167.

Referring to FIGS. 12-14, example ultra-low voltage (ULV) dual voltage block designs for sense amplifier offset cancellation are shown. The block designs of FIGS. 12-14 may be used as example representations of either a sampling phase or an amplification phase of example ULV dual voltage current sense amplifier circuit systems as described herein. FIG. 12 depicts an example ULV dual voltage block design 1200 (i.e., block design) including first and second bias circuits 1210, 1220 and an inner amplifier 1230. In certain implementations, the first and second bias circuits 1210, 1220 may be coupled between a first power supply (e.g., $V_{DDL}$) and first and second input ports 1202, 1204 (e.g., plus and minus input ports), respectively. The first bias circuit 1210 may include a first voltage drop element 1214 (RL1) and a third transistor 1212 (N1). The second bias circuit 1220 may include a second voltage drop element 1224 (RL2) and a fourth transistor 1222 (N2).

Illustrating additional features for one implementation of the block design 1200 in FIG. 12, FIG. 13 depicts an example ULV dual voltage block design 1300 (i.e., block design) where a gate of the third transistor device 1312 may be coupled to a gate of the first transistor device 1334 and a gate of the fourth transistor device 1322 may be coupled to a gate of the second transistor device 1344. Advantageously, in operation, the block design 1300 would not require an external clamping voltage as a clamping voltage may be automatically generated internally.

Illustrating additional features for one implementation of the block design 1200 in FIG. 12, FIG. 14 depicts an example ULV dual voltage block design 1400 (i.e., block design) where at least one of the respective gates of the third and fourth transistor devices 1412, 1422 may be configured to receive an external clamping voltage (i.e., a drive voltage, Vclamp). Generated in response to the external clamping voltage, the first and second currents 1416, 1418 are provided to the first and second bias circuits 1410, 1420 to be transmitted to the inner amplifier 1430. As a particular advantage, the block design 1400 allows for the accurate sensing of bit and reference memory elements of MRAM-like devices.

In some implementations (as shown in FIGS. 12-14), the voltage drop elements 1214, 1224, 1314, 1324, 1414, 1424 may be resistor elements. In other implementations (as shown in FIGS. 15-20), the voltage drop elements may be diode-connected transistor devices (e.g., PMOS transistor devices). As an advantage, the resistor elements allow for ultra-low voltage operation on the first and second bias circuits of the systems (as described with reference to FIGS. 12-20) to as low as in the range of 0.45V-0.58V (e.g., in functional and/or power read mode). In one example, this may be achieved through the use of resistor elements and higher voltage in the amplification phase. Moreover, as the sampling phase and amplification phase circuitry are decorrelated, and therefore optimized separately, amplification may be performed at high voltage for voltage headroom and gain. Furthermore, by utilizing low impedance nodes on the bias branches, the circuit operation may be conducted faster and with greater stability.

The inner amplifiers 1230, 1330, 1430 (as described with reference to ULV dual voltage block designs of FIGS. 12-14) may be implemented with any of the previously described inner amplifier configurations with references to FIGS. 1 and 3-11. Additionally, each of the circuit configurations described herein, in certain implementations, can be: dual-implemented (e.g., including a PMOS clamp, etc.), cascoded, or include a current generator.

In certain implementations (as shown in FIGS. 12-14), an external current generator 1271, 1371, 1471 (i.e., external current source) may be coupled between the second power supply (e.g., $V_{DDH}$) 1253, 1353, 1453 and the inner amplifier 1230, 1330, 1430. In operation, the external current generator 1271, 1371, 1471 may regulate (e.g., adjust, control) a common-mode voltage of the inner amplifier 1230, 1330, 1430 and enhance voltage operation thereof. Advantageously, the external current generator 1271, 1371, 1471 may allow for wide common mode input variation.

Referring to FIGS. 15A-C to 20A-C, systems 1500, 1600, 1700, 1800, 1900, 2000 (i.e., current sense amplifier circuits, amplifier circuits) for ultra-low voltage sense amplifier offset cancellation are shown. Similar to the various systems as described in above paragraphs, each of the systems 1500, 1600, 1700, 1800, 1900, 2000 may be depicted in two phases: a sampling phase 1580, 1680, 1780, 1880, 1980, 2080 (FIGS. 15A-20A) and an amplification phase 1590, 1690, 1790, 1890, 1990, 2090 (FIGS. 15B-20B), respectively. Similar to the previous systems, each of the systems 1500, 1600, 1700, 1800, 1900, 2000 may include respective first and second bias circuits 1510, 1520, 1610, 1620, 1710, 1720, 1810, 1820, 1910, 1920, 2010, 2020 (i.e., first and second branches), and a respective inner amplifier 1530, 1630, 1730, 1830, 1930, 2030. In some implementations, the respective first and second bias circuits 1510, 1520, 1610, 1620, 1710, 1720, 1810, 1820, 1910, 1920, 2010, 2020 may each be coupled to a first power supply ($V_{DDL}$) and first and second input ports (e.g., plus and minus ports). Additionally, the respective inner amplifiers 1530, 1630, 1730, 1830, 1930, 2030 may each be coupled between a second power supply ($V_{DDH}$) and ground.

Similar to the previously described systems, the system 1500, 1600, 1700, 1800, 1900, 2000 may be implemented in accordance to the various above-described implementations. Hence, each of the respective first and second bias circuits, and the respective inner amplifier may include at least one or more features similar to the features of one or more systems as described with reference to FIGS. 1A-1C and 3A-3C to 14A-14C.

As an example, similar to the external current generators as shown in FIGS. 12-14, the external current generators in each of the systems 1500, 1600, 1700, 1800, 1900, 2000 of FIGS. 15A-C to 20A-C may also be coupled between a second power supply 1553, 1653, 1753, 1853, 1953, 2053 and the inner amplifier 1530, 1630, 1730, 1830, 1930, 2030, respectively. Advantageously, each of the external current generators may be configured to enhance voltage operation and regulate (e.g., adjust, control) a common-mode voltage of the respective inner amplifiers and allow for wide common mode input variation.

Nevertheless, each of the systems 1500, 1600, 1700, 1800, 1900, 2000 may include variations in particular circuit configurations. For example, as shown in FIG. 15, an external current generator 1571 may include first, second, and third PMOS devices 1566, 1567, 1568. Additionally, source terminals of the first and second PMOS devices 1566, 1567 may be coupled to the second power supply 1553, the gate terminals of the first and second PMOS devices 1566, 1567 may be coupled to respective first and second outputs 1562, 1564 of the amplifier circuit 1500, and drain terminals of the first and second PMOS devices 1566, 1567 may be coupled to a source terminal of the third PMOS device 1569. Moreover, a gate terminal of the third PMOS device 1568 may be coupled to a bias voltage ($V_{BIAS}$) 1591 and a drain terminal of the third PMOS device 1568 may be coupled to the first and second current generators 1532, 1542 of the inner amplifier 1530.

As another example, in the system 1600 as shown in FIGS. 16A-16B, an external current generator 1671 may include a PMOS device 1672 coupled to an external amplifier 1674. In a particular implementation, additional circuit elements and configurations may be similar to that of FIGS. 6A-6B described above with the distinction that in FIGS. 16A-16B, the first and second bias circuits 1610, 1620 may be coupled to a first voltage supply 1651 and the inner amplifier 1630 may be coupled to a second voltage supply 1653.

Referring to FIGS. 17A-C to 20A-C, each of the systems 1700, 1800, 1900, 2000 may include variations in particular circuit configurations. For example, in each of the systems 1700, 1800, 1900, 2000, the inner amplifier includes first and second common-mode transistor devices (e.g., Ncm1, Ncm2) 1740, 1750, 1840, 1850, 1940, 1950, 2040, 2050. Moreover, the first and second common-mode transistor devices 1740, 1750, 1840, 1850, 1940, 1950, 2040, 2050 may be configured to control common-mode voltage during the amplification phase 1790, 1890, 1990, and 2090.

As another example, as shown in FIGS. 17A-17B, the system 1700 may include first and second PMOS devices 1766, 1767. In a particular configuration, gates of a second common-mode transistor device 1750 and the second PMOS device 1767 may be coupled to a first output 1762 (e.g., minus port) of the amplifier circuit 1700, and gates of the first common-mode transistor device 1740 and the first PMOS device 1766 may be coupled to a second output 1764 (e.g., plus port) of the amplifier circuit 1700. Moreover, in the implementation of FIGS. 17A-17B, the inner amplifier 1730 further includes first and second latch switches 1792, 1794. The first latch switch 1792 may be coupled between a first node 1781 and a second node 1783 and the second latch switch 1794 may be coupled between a third node 1785 and a fourth node 1787. Also, the first node 1781 may be coupled between the first transistor device 1734 and the first common-mode transistor device 1740. The second node 1783 may be coupled between the second transistor device 1744 and the second common-mode transistor device 1750. Moreover, the third node 1785 may be coupled between the first current generator device 1732 and the first PMOS device 1766. The fourth node 1787 may be coupled between the second current generator device 1742 and the second PMOS device 1767.

In operation, during the sampling phase 1780, the first and second latch switches 1792, 1793 may be "closed", such that the first node 1781 may be coupled to the second node 1783 and the third node 1785 may be coupled to the fourth node 1787. During the amplification phase 1790, the first and second latch switches 1792, 1793 may be "open", such that the first node 1781 is not coupled to the second node 1783 and likewise, the third node 1785 is not coupled to the fourth node 1787. Advantageously, the first and second latch switches allow the system 1700 to resemble a "full-latch device", thus providing for improved performance and efficient usage by having two stable states where the system 1700 may be used to store state information as digital values.

Moreover, in the system 1700, unlike various dual common-mode voltage implementations (as described herein with reference to FIGS. 10, 11), the first and second PMOS devices 1766, 1767 would not operate to control common mode voltage. Instead, the first and second PMOS devices 1766, 1767 may provide additional voltage drop during the sampling phase 1780 and enable latch operation during the amplification phase 1790.

As another example illustrating "cross-coupling", in the system 1800 as shown in FIGS. 18A-18B, an external current generator 1871 may include first, second, and third PMOS devices 1866, 1867, 1868. Additionally, source terminals of the first and second PMOS devices 1866, 1867 may be coupled to the second power supply 1853, and drain terminals of the first and second PMOS devices 1866, 1867 may be coupled to a source terminal of the third PMOS device 1868. Moreover, a gate terminal of the third PMOS device 1868 may be coupled to a bias voltage ($V_{BIAS}$) 1891, and a drain terminal of the third PMOS device 1868 may be coupled to a node coupling the first and second current generators 1832, 1842 of the inner amplifier 1830. Further, gate terminals of the first PMOS device 1866 and the first common-mode transistor device 1840 may be coupled to a second output 1864 of the amplifier circuit 1800 and gate terminals of the second PMOS device 1867 and the second common-mode transistor device 1850 may be coupled to a first output 1862 of the amplifier circuit 1800.

As another example illustrating "non-cross coupling", in the system 1900 as shown in FIGS. 19A-19B, an external current generator 1971 may include first, second, and third PMOS devices 1966, 1967, 1968. Additionally, source terminals of the first and second PMOS devices 1966, 1967 may be coupled to the second power supply 1953 and drain terminals of the first and second PMOS devices 1966, 1967 may be coupled to a source terminal of the third PMOS device 1968. Moreover, a gate terminal of the third PMOS device 1968 may be coupled to a bias voltage ($V_{BIAS}$) 1991 and a drain terminal of the third PMOS device 1968 may be coupled to a node coupling the first and second current generators 1932, 1942 of the inner amplifier 1930. Further, gate terminals of the first PMOS device 1966 and the first common-mode transistor device 1940 may be coupled to a first output 1962 of the amplifier circuit 1900 and gate terminals of the second PMOS device 1967 and the second common-mode transistor device 1950 may be coupled to a second output 1964 of the amplifier circuit 1900.

As yet another example illustrating "cross-coupling", in the system 2000 as shown in FIGS. 20A-20B, an external current generator 2071 may include first, second, third, and fourth PMOS devices 2066, 2067, 2068, 2069. Additionally, source terminals of the first and second PMOS devices 2066, 2067 may be coupled to the second power supply 2053. Gate terminals of the first and second PMOS devices 2066, 2067 may be coupled to respective first and second outputs 2062, 2064 of the amplifier circuit 2000. Moreover, drain terminals of the first and second PMOS devices 2066, 2067 may be coupled to the respective source terminals of the third and fourth PMOS devices 2068, 2069. Further, gate terminals of the third and fourth PMOS device 2068, 2069 may be coupled to a bias voltage ($V_{BIAS}$) 2091 and drain terminals of the third and fourth PMOS devices 2068, 2069 may be coupled to the first and second current generator devices 2032, 2042 of the amplifier circuit 2000.

In a particular implementation, in the system 2000, the inner amplifier 2030 may further include first and second latch switches 2092, 2094 and the external current generator 2071 may further include a third latch switch 2096. The first latch switch 2092 may be coupled between a first node 2081 and a second node 2083, the second latch switch 2094 may be coupled between a third node 2085 and a fourth node 2087, and the third latch switch 2096 may be coupled between a fifth node 2088 and a sixth node 2089. Additionally, the first node 2081 may be coupled between the first transistor device 2034 and a first common-mode transistor device 2040, the second node 2083 may be coupled between the second transistor device 2044 and a second common-mode transistor device 2050, the third node 2085 may be coupled between a first current generator device 2032 and the third PMOS device 2068, the fourth node 2087 may be coupled between the second current generator device 2042 and the fourth PMOS device 2069, the fifth node 2088 may be coupled between the first and third PMOS devices 2066, 2068, and the sixth node 2089 may be coupled between the second and fourth PMOS devices 2067, 2069.

FIG. 15C-20C illustrate the systems 1500, 1600, 1700, 1800, 1900, 2000 as example electronic circuit symbols. As depicted, a control signal 1598, 1698, 1798, 1898, 1998, 2098 may also be coupled to each of the systems 1500, 1600, 1700, 1800, 1900, 2000, respectively, to control the operation of the respective sampling phases 1580, 1680, 1780, 1880, 1980, 2080 and the respective amplification phases 1590, 1690, 1790, 1890, 1990, 2090.

In alternative implementations to the systems 1-20 and 23-31 as described herein (with reference to FIGS. 1A-C to 20A-20C and 23A-C to 31A-C), each of the NMOS transistors devices may instead be NPN transistor devices, while each of the PMOS transistor devices may instead be PNP transistor devices. Accordingly, in each of these alternative implementations, instead of drain, source, and gate terminals for the described NMOS and PMOS transistors, each of the respective NPN and PNP transistor devices would include collector, emitter, and base terminals. In all other respects, each of these alternative implementations would be identical to the implementations as described herein.

In example implementations, certain circuit elements have been provided in the FIGS. 1A-C to 20A-20C (i.e., 1-20) and 23A-C to 31A-C (i.e., 23-31) (as described in below paragraphs), but whose redundant description has not been duplicated in the related description of analogous circuit elements herein. It is expressly incorporated that the same circuit elements with identical symbols and/or reference numerals are included in each of embodiments based on its corresponding figure(s).

Figure 21:
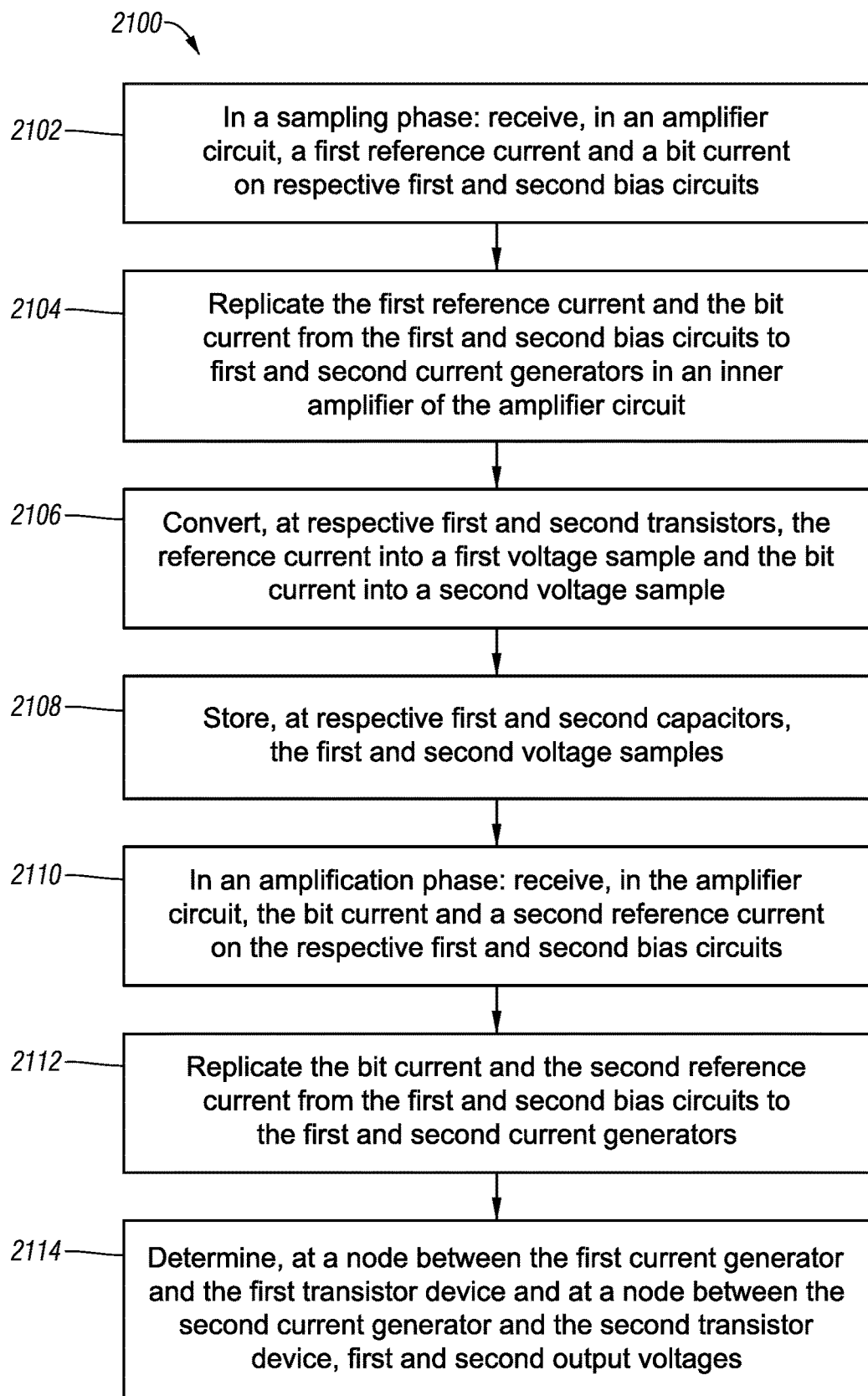
FIG. 21 is a method for amplifier offset cancelation according to certain embodiments.

Referring to FIG. 21, a method for current sense amplifier offset cancelation is shown. The method 2100 may be performed by any of the systems 100 to 2000 of FIGS. 1-20.

The method 2100 includes in a sampling phase, receiving, in an amplifier circuit, a first a reference current and a bit current on respective first and second bias circuits, at 2102. For example, as described with reference to FIGS. 1-20, during a sampling phase (e.g., 180), an amplifier circuit (e.g., 100) may receive a first bit current (e.g., 116) and a first reference current (e.g., 118) on respective first and second input ports.

At 2104, the first bit current and the first reference current may be replicated from the first and second bias circuits to first and second current generator devices of the inner amplifier. For example, as described with reference to FIGS. 1-20, the first and second currents 116, 118 are replicated from the first and second bias circuits 110, 120 to first and second current generators (e.g., Pf1) 132, (e.g., Pf2) 142, respectively, of the inner amplifier 130.

At 2106, the first reference current may be converted into a first voltage sample and the bit current may be converted into a second voltage sample at respective first and second transistor devices of the inner amplifier. For example, the replicated first reference current and bit current may be converted into respective first and second voltage samples at respective first and second transistors 134 (e.g., Nf1) 144, (e.g., Nf2) of the inner amplifier 130.

At 2108, the first and second voltage samples may be stored at respective first and second capacitors of the inner amplifier. For example, the first and second voltage samples are then stored at respective first and second capacitors (CS1) 136, (CS2) 146.

At 2110, the bit current and a second reference current may be received in the amplifier circuit on the respective first and second bias circuits. For example, the second and third currents ($I_2$) 118, ($I_3$) 119 associated with the first bit memory element 230 and a second reference memory element 220, respectively are received in the respective first and second bias circuits 110, 120.

At 2112, the bit current and the second reference current may be replicated from the first and second bias circuits to the first and second current generators in an inner amplifier of the amplifier circuit. For example, the bit current 118 and the second reference current 119 from the first and second bias circuits 110, 120 are replicated to the first and second current generators (e.g., Pf1) 132, (e.g., Pf2) 142, respectively, of the inner amplifier 130.

At 2114, first and second output voltages may be determined at a node between the first current generator and the first transistor device, and at a node between the second current generator and the second transistor device. For example, at a node 162 (e.g., 262, 362, etc.) between the first current generator 132 (e.g., Pf1) and the first transistor device 134, (e.g., Nf1), and at a node 164 (e.g., 264, 364, etc.) between the second current generator 142 (e.g., Pf2) 144 and the second transistor device (e.g., Nf2), first and second output voltages are determined.

The systems 100-2000 may be used in any device. As an example, folded offset cancelled sense amplifier as related to the systems 100-2000 may be integrated into a mobile phone, a set top box, a music player, a video player, an entertainment unit, a navigation device, a computer, a handheld personal communication systems (PCS) unit, a portable data unit, and/or a fixed location data unit.

As another example, a processing device may comprise an integrated circuit device or a circuit as described above. A processing device may be: a microcontroller unit (MCU) or a microprocessor, a central processing unit (CPU), a graphics processor, a coprocessor, a digital signal processor (DSP), an embedded processor, an application specific integrated circuit (ASIC), a field programmable gate array (FPGA), an analogue-to-digital converter, etc.

Figure 22:
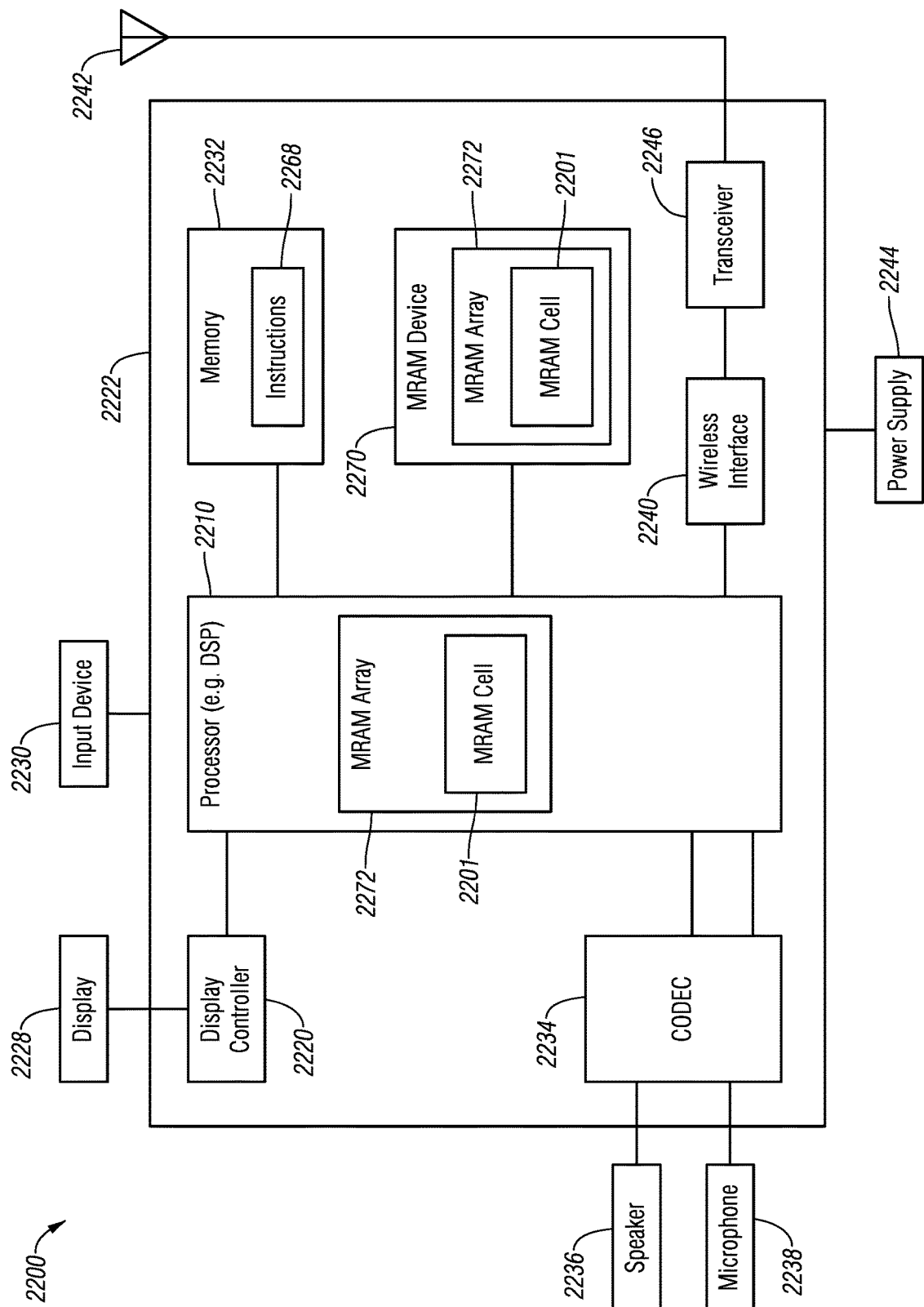
FIG. 22 is a block diagram of a device including an example amplifier system according to certain embodiments.

Referring to FIG. 22, a block diagram of a particular illustrative implementation of a device (e.g., a wireless communication device) is depicted and generally designated 2200. In various implementations, the device 2200 may have more or fewer components than illustrated in FIG. 22.

In a particular implementation, the device 2200 includes a processor 2210, such as a central processing unit (CPU) or a digital signal processor (DSP), coupled to a memory 2232. The memory 2232 includes instructions 2268 (e.g., executable instructions) such as computer-readable instructions or processor-readable instructions. The instructions 2268 may include one or more instructions that are executable by a computer, such as the processor 2210. The processor 2210 is also coupled to an MRAM device 2270. An MRAM array 2272 may be included in the MRAM device 2270. For example, the MRAM device 2270 may include an array of MRAM cells, including the MRAM cell 2201. Additionally, or alternatively, the MRAM array 2272 (including a plurality of folded offset cancelled sense amplifiers) may be included in the processor 2210, as non-limiting examples. In example implementations, the processor 2210, the MRAM device 2270, or both may include the systems 100-2000 of FIGS. 1-20. In other implementations, the device 2200 may be similarly designed with CeRAM, ReRAM, PCM, Flash, FeFET, or FeRAM memory devices, memory arrays, and memory cells.

FIG. 22 also illustrates a display controller that is coupled to the processor 2210 and to a display 2228. A coder/decoder (CODEC) 2234 may also be coupled to the processor 2210. A speaker 2236 and a microphone 2238 may be coupled to the CODEC 2234.

FIG. 22 also illustrates that a wireless interface 2240, such as a wireless controller, and a transceiver 2246 may be coupled to the processor 2210 and to an antenna 2242, such that wireless data received via the antenna 2242, the transceiver 2246, and the wireless interface 2240 may be provided to the processor 2210. In some implementations, the processor 2210, the display controller 2226, the memory 2232, the CODEC 2234, the MRAM device 2270, the wireless interface 2240, and the transceiver 2246 are included in a system-in-package or system-on-chip device 2222. In some implementations, an input device 2230 and a power supply 2244 are coupled to the system-on-chip device 2222. Moreover, in a particular implementation, as illustrated in FIG. 22, the display 2228, the input device 2230, the speaker 2236, the microphone 2238, the antenna 2242, and the power supply 2244 are external to the system-on-chip device 2222. In a particular implementation, each of the display 2228, the input device 2230, the speaker 2236, the microphone 2238, the antenna 2242, and the power supply 2244 may be coupled to a component of the system-on-chip device 2222, such as an interface or a controller.

In an illustrative implementation, the memory 2232 includes or stores the instructions 2268 (e.g., executable instructions), such as computer-readable instructions or processor-readable instructions. For example, the memory 2232 may include or correspond to a non-transitory computer readable medium storing the instructions 2268. The instructions 2268 may include one or more instructions that are executable by a computer, such as the processor 2210. The instructions 2268 may cause the processor 2210 to perform the method 2100 of FIG. 21.

In alternative approaches, variations of telescopic offset cancelled sense amplifier circuits and folded offset cancelled sense amplifier circuits may be used for low power and low current circuit design implementations. Advantageously, such design implementations may allow for further intrinsically low power operation due to the minimal number of devices and minimal number of circuit branches required for circuit implementation. Moreover, such implementations allow the use of arbitrary current generators to generate input voltage directly for transistor devices. Moreover, such arbitrary current generators may be configured to enhance voltage operation and/or to regulate (e.g., adjust, control) a common-mode voltage of the respective inner amplifiers and allow for wide common mode input variation. Also, as another advantage, for both the telescopic and folded circuit designs, it is possible to employ very low bias currents without the risk of turning off the system such that a bias current would still be available. In previous systems as described in above paragraphs, if it is desired to use very low current with a clamping voltage, there is an outsized risk of having zero current.

Referring to FIGS. 23A-C, a telescopic system 2300 (i.e., a voltage sense amplifier circuit, amplifier circuit) for sense amplifier offset cancellation is shown. As depicted in two phases, a sampling phase 2380 (FIG. 23A) and an amplification phase 2390 (FIG. 23B), the telescopic system 2300 includes an amplifier portion 2330 coupled to first and second bias current generators 2316, 2318 and first and second inputs 2302, 2304 (e.g., $V_{IN}$ plus (+) and minus (−) input ports) of the system 2300. Similar in operation to the inner amplifiers discussed with reference to previous systems 100-2000, the amplifier portion 2330 may be configured to determine whether a stored voltage sample corresponding to a bit memory element (e.g., as shown with reference to FIGS. 2A, 2B, etc.) indicates a high resistive state or a low resistive state. As described in above paragraphs, voltage samples corresponding to bit memory elements and reference memory elements (as described with reference to FIG. 2) that are coupled to the system 100 are compared in the sampling phase 2380 (i.e., sampling stage) and the amplification phase 2390 (i.e., amplification stage) of the system 2300. FIG. 23C illustrates the system 2300 as an example electronic circuit symbol. As depicted, a control signal 2398 may also be coupled to the system 2300 to control the operation of the sampling phase 2380 and the amplification phase 2390.

As shown in FIGS. 23A-B, as part of a telescopic approach, the first and second bias current generators 2316, 2318 (e.g., first and second PMOS transistor devices) may be coupled in series between a power supply ($V_{DD}$) 2301, third and fourth transistor devices (N1) 2312, (N2) 2322 (e.g., NMOS diode-connected transistor devices) of the amplifier portion 2330, and the first and second inputs 2302, 2304 (e.g., $V_{IN}$ plus (+) and minus (−) input ports) of the system 2300, respectively. In a particular implementation, the first and second bias current generators 2316, 2318 transmit arbitrary currents, $I_{BIAS1}$, $I_{BIAS2}$, that are inserted (e.g., "forced") into the drain terminals of the third and fourth transistor devices (N1) 2312, (N2) 2322. In some cases, the arbitrary currents, $I_{BIAS1}$, $I_{BIAS2}$, may be substantially identical, and in other cases, the arbitrary currents, $I_{BIAS1}$, $I_{BIAS2}$, may be different. Advantageously, in the example implementation, in contrast to previous example systems that clamped a voltage, in this approach a current may be clamped.

As shown in FIGS. 23A-B, the amplifier portion 2330 may include: the third and fourth transistor devices (N1) 2312, (N2) 232, first and second switches 2338, 2348, and first and second capacitors 2336, 2346. The first switch 2338 may be configured to decouple (i.e., selectively couple) a first output 2362 (e.g., minus output port) of the amplifier circuit 2300 and a node coupling a gate of the third transistor device (N1) 2312 and the first capacitor (CS1) 2336. Also, the second switch 2348 may be configured to decouple a second output 2364 (e.g., plus output port) of the amplifier circuit 2300 and a node coupling a gate of the second transistor device (N2) 2322 and the second capacitor (CS2) 2346.

In certain implementations, the coupling and decoupling of the first and second switches 2338, 2348 allow the system 2300 to alternately shift between the sampling phase 2380 and the amplification phase 2390. For instance, in operation, the sampling phase 2380 may be activated (i.e., initiated) upon the coupling of the first output 2362 of the amplifier circuit 2300 and the node coupling the gate of the third transistor device (N1) 2312 and the first capacitor (CS1) 2336, and a coupling of the second output 2364 of the amplifier circuit 2300 and the node coupling the second transistor device (N2) 2322 and the second capacitor (CS2) 2346.

Conversely, in operation, the amplification phase 2390 may be initiated upon: a decoupling of the first output 2362 of the amplifier circuit 2300 and the node coupling the gate of the third transistor device (N1) 2312 and the first capacitor (CS1) 2336, and a decoupling of the second output 2364 of the amplifier circuit 2300 and the node coupling the gate of the of the second transistor device (N2) 2322 and the second capacitor (CS2) 2346. As explained in greater detail with respect to FIG. 2 in above paragraphs, during the amplification phase 2390, an output voltage ($V_{OUT}$) may be determined based on the combination of the bit current of the bit memory element (e.g., as shown in FIG. 2) and the reference current of the reference memory element (e.g., as shown in FIG. 2). The resulting output voltage corresponds to whether the particular bit memory element has low resistive state or a high resistive state. In certain implementations, the combination of the bit current and the reference current may be determined at a node between the first bias current generator 2316 and the third transistor device (N1) 2312, and at a node between the second bias current generator 2318 and the second transistor device (N2) 2322.

As an example operation, inside an example system 2300 (or any of the systems 2400-3100), in the sampling phase 2380 (e.g., 2480, 2580, etc.), first and second bias currents ($I_1$) 2316, ($I_2$) 2318 associated with the first reference memory element 210 and the first bit memory element 230 are received in respective first and second circuit branches 2310, 2320. Using the first and second current generators, first and second currents, $I_{BIAS1}$, $I_{BIAS2}$, are "pushed" through impedances of the first reference memory element 210 and the first bit memory element 230 to generate an input voltage for the amplifier portion 2330. The input voltage allows for the first and second currents 2316, 2318 associated with the first reference current and bit current to be converted into respective first and second voltage samples stored at third and fourth transistor devices (N1, N2) 2312, 2322. Upon conversion, the first and second voltage samples are then stored at respective first and second capacitors (CS1) 2336, (CS2) 2346. During the amplification phase 2390 (e.g., 2490, 2590, etc.), inside the example system 2300 (or any of the systems 2400-3100), second and third currents ($I_2$) 2318, ($I_3$) 2319 associated with the impedances of the first bit memory element 230 and a second reference memory element 220, respectively are received in the respective first and second circuit branches 2310, 2320. Using the first and second current generators, the first and second currents, $I_{BIAS1}$, $I_{BIAS2}$, are "pushed" through the impedances of the first bit memory element 230 and the second reference memory element 220 to generate another input voltage for the amplifier portion 2330. The input voltage allows for the second and third currents 2318, 2319 associated with the bit current and the second reference current to be converted into respective first and second voltage samples stored at third and fourth transistor devices (N1, N2) 2312, 2322. Furthermore, at a node 2362 and at a node 2364, first and second output voltages are determined.

In some implementations, a bias voltage ($V_{BIAS}$) can be externally applied to the system 2300. As one example, in such cases, the first and second bias current generators 2316, 2318 may be first and second PMOS transistor devices (P1, P2). In another example, the first and second bias current generators 2316, 2318 may be cascoded including multiple PMOS devices or at least one PMOS device and a resistive element arranged in series with different bias voltages to increase a voltage gain of the circuit. Additionally, or alternatively, the third and fourth transistor devices (N1) 2312, (N2) may be cascoded including multiple NMOS devices including substantially equivalent or different threshold voltages. In other implementations, various cascading techniques may be implemented in the system 2300 (or alternatively, the systems 2400, 2500, 2600, and 2700 as described herein).

Referring to FIGS. 24A-C, a telescopic system 2400 (i.e., a voltage sense amplifier circuit, amplifier circuit) for sense amplifier offset cancellation is shown. Similar to FIGS. 23A-C, as depicted in two phases, a sampling phase 2480 (FIG. 24A) and an amplification phase 2490 (FIG. 24B), the telescopic system 2400 includes an amplifier portion 2430 coupled to first and second bias current generators 2416, 2418 (e.g., PMOS transistor devices) and first and second inputs 2402, 2404 (e.g., $V_{IN}$ plus (+) and minus (−) input ports) of the system 2400. Similar to FIG. 23C, FIG. 24C illustrates the system 2400 as an example electronic circuit symbol. As depicted, a control signal 2498 may also be coupled to the system 2400 to control the operation of the sampling phase 2480 and the amplification phase 2490.

In contrast to the telescopic system 2300, the telescopic system 2400 generates a bias voltage internally within the telescopic system 2400 itself. Hence, as illustrated in FIGS. 24-C, the system 2400 is substantially similar to that of the system 2300 with an exception that system 2400 includes first and second diode-connected PMOS transistor devices (Pbias1, Pbias2) and third and fourth NMOS transistor devices (Nbias1, Nbias2). Advantageously, the bias voltage ($V_{BIAS}$) may be generated from the first and second diode-connected PMOS transistor devices (Pbias1, Pbias2) and the first and second bias current generators 2416, 2418. Moreover, in the telescopic system 2400, a gate of the third NMOS transistor device (Nbias1) may be coupled to a node coupling a first capacitor (CS1) 2436 and a first switch 2438 configured to either couple or decouple a minus output port 2462 (e.g., $V_{OUT}$ minus (−) output port). Further, in this example, a gate of the fourth NMOS transistor device (Nbias2) may be coupled to a node coupling a second capacitor (CS2) 2446 and a second switch 2448 configured to either couple or decouple a plus output port 2464 (e.g., $V_{OUT}$ plus (+) output port).

In an alternative example (not shown), the system 2400 may include solely a first diode-connected PMOS transistor device (Pbias1) and a third NMOS transistor device (Nbias1), but not the second diode-connected PMOS transistor device (Pbias2) and the fourth NMOS transistor device (Nbias1) (e.g., as shown in FIG. 24A-C). In the alternative example, the bias voltage ($V_{BIAS}$) may be generated between the first diode-connected PMOS transistor device (Pbias1) and the first and second bias current generators 2416, 2418. Moreover, the alternative example, a gate of the third NMOS transistor device (Nbias1) may be coupled to a node coupling a first capacitor (CS1) 2436 and a first switch 2438 configured to either couple or decouple a minus output port 2462 (e.g., $V_{OUT}$ minus (−) output port).

Referring to FIGS. 25A-C, a telescopic system 2500 (i.e., a voltage sense amplifier circuit, amplifier circuit) for sense amplifier offset cancellation is shown. Similar to FIGS. 23A-C, as depicted in two phases, a sampling phase 2580 (FIG. 25A) and an amplification phase 2590 (FIG. 25B), the telescopic system 2500 includes an amplifier portion 2530 (that is identical to the amplifier portion 2330) coupled to first and second bias current generators (which in this case are first and second PMOS transistor devices (P1, P2) 2516, 2518) and first and second inputs 2502, 2504 (e.g., $V_{IN}$ plus (+) and minus (−) input ports) of the system 2400. Similar to FIG. 23C, FIG. 25C illustrates the system 2500 as an example electronic circuit symbol. As depicted, a control signal 2598 may also be coupled to the system 2500 to control the operation of the sampling phase 2580 and the amplification phase 2590.

In contrast to the telescopic system 2300, the telescopic system 2500 includes first and second common-mode feedback devices (Pcm1, Pcm2) (e.g., PMOS transistor devices). As shown in FIGS. 25A-B, according to a parallel-coupled circuit arrangement, a gate of the first common-mode feedback device (Pcm1) may be coupled to a drain of the first PMOS transistor device (P1) 2516 on a first circuit branch 2510. Additionally, a gate of the second common-mode feedback device (Pcm2) 2570 may be coupled to a drain of a second PMOS transistor device 2518 (P2) on a second circuit branch 2520. Moreover, in the telescopic system 2500, a bias voltage ($V_{BIAS}$) may be generated between the first and second PMOS transistor devices (P1, P2) 2516, 2518.

In an alternative example (not shown), the telescopic system 2500, according to a cross-coupled circuit arrangement, the gate of the first common-mode feedback device (Pcm1) may be coupled to the drain of the second PMOS transistor device (P2) 2518 on the second circuit branch 2520. Additionally, the gate of the second common-mode feedback device (Pcm2) 2570 may be coupled to the drain of the first PMOS transistor device 2516 (P1) on the first circuit branch 2510. Moreover, in this alternative example as well, the bias voltage ($V_{BIAS}$) may be generated between the first and second PMOS transistor devices (P1, P2) 2516, 2518.

Referring to FIGS. 26A-C, a telescopic system 2600 (i.e., a voltage sense amplifier circuit, amplifier circuit) for sense amplifier offset cancellation is shown. Similar to FIGS. 23A-C, as depicted in two phases, a sampling phase 2680 (FIG. 26A) and an amplification phase 2690 (FIG. 26B), the telescopic system 2600 includes an amplifier portion 2630 (that is identical to the amplifier portion 2330) coupled to first and second bias current generators (which in this case are first and second PMOS transistor devices (P1, P2) 2616, 2618) and first and second inputs 2602, 2604 (e.g., $V_{IN}$ plus (+) and minus (−) input ports) of the system 2600. Similar to FIG. 23C, FIG. 26C illustrates the system 2600 as an example electronic circuit symbol. As depicted, a control signal 2698 may also be coupled to the system 2600 to control the operation of the sampling phase 2680 and the amplification phase 2690. In contrast to the telescopic system 2300, the telescopic system 2600 includes an external amplifier 2677 to generate a bias voltage ($V_{BIAS}$) between first and second PMOS transistor devices (P1, P2) 2616, 2618.

Referring to FIGS. 27A-C, a telescopic system 2700 (i.e., a voltage sense amplifier circuit, amplifier circuit) for sense amplifier offset cancellation is shown. Similar to FIGS. 23A-C, as depicted in two phases, a sampling phase 2780 (FIG. 27A) and an amplification phase 2790 (FIG. 26B), the telescopic system 2700 includes an amplifier portion 2730 (that is identical to the amplifier portion 2330) coupled to first and second bias current generators (P1, P2) 2716, 2718 (e.g., first and second PMOS transistor devices) and first and second inputs 2702, 2704 (e.g., $V_{IN}$ plus (+) and minus (−) input ports) of the system 2700. Similar to FIG. 23C, FIG. 27C illustrates the system 2700 as an example electronic circuit symbol. As depicted, a control signal 2798 may also be coupled to the system 2700 to control the operation of the sampling phase 2780 and the amplification phase 2790.

In contrast to the telescopic system 2300, the telescopic system 2700 includes a "start-up boost". The "start-up boost" may be any device or combination of devices that may be coupled to the first and second bias current generators (P1, P2) 2716, 2718, the amplifier portion 2730, and the first and second inputs 2702, 2704 (e.g., $V_{IN}$ plus (+) and minus (−) input ports) of the system 2700 to increase the first and second bias currents ($I_{BIAS1}$, $I_{BIAS2}$) in the event of slow operation of the telescopic system 2700.

As discussed in earlier paragraphs above, the folded sense amplifiers 100-2000 involve circuit designs having current mirrors, in as much as the first current is replicated from the first voltage drop element (P1) to a first current generator (Pf1), and the second current is replicated from the second voltage drop element (P2) to a second current generator (Pf2). In contrast, according to a folded approach as shown in folded systems 2800, 2900, 3000, 3100, bias current generators may be arranged in series with impedances on the first and second inputs 2702, 2704 (e.g., $V_{IN}$ plus (+) and minus (−) input ports), such that current may be "folded" current through an impedance.

Referring to FIGS. 28A-C to 31A-C, systems 2800, 2900, 3000, 3100 (i.e., folded systems, current sense amplifier circuits, amplifier circuits) for low voltage sense amplifier offset cancellation are shown. Similar to the various systems as described in above paragraphs, each of the systems 2800, 2900, 3000, 3100 may be depicted in two phases: a sampling phase 2880, 2980, 3080, 3180 (FIGS. 28A-31A) and an amplification phase 2890, 2990, 3090, 3190 (FIGS. 15B-20B), respectively. Similar to previously described inner amplifiers 330, 430, 530, etc. of the previously respective systems 300, 400, 500, etc., systems 2800, 2900, 3000, 3100 may include respective inner amplifier 2830, 2930, 3030, 3130. However, in contrast to the previously described systems, instead of the respective first and second bias circuits of the previous systems, each of the systems 2800, 2900, 3000, 3100 include first and second bias current generators 2816, 2818, 2916, 2918, 3016, 3018, 3116, 3118 (e.g., first and second PMOS transistor devices (P1, P2)), each coupled between a voltage supply ($V_{DD}$) and respective first and second inputs 2702, 2704, 2802, 2804, 2902, 2904, 3002, 3004, 3102, 3104 (e.g., $V_{IN}$ plus (+) and minus (−) input ports) of the respective systems 2700, 2800, 2900, 3000, 3100.

In some implementations, one power supply ($V_{DD}$) may be coupled to both the first and second bias current generators (P1, P2) (e.g., 2716, 2718, 2816, 2818, 2916, 2918, 3016, 3018, 3106, 3108) and the inner amplifier (e.g., 2830, 2930, 3030, 3130). In other implementations, the first and second bias current generators (P1, P2) (e.g., 2716, 2718, 2816, 2818, 2916, 2918, 3016, 3018, 3106, 3108) may be coupled to a first power supply (e.g., $V_{DDL}$), and the inner amplifier (e.g., 2830, 2930, 3030, 3130) may be coupled to a second power supply (e.g., $V_{DDH}$).

Referring to FIGS. 28A-C, unlike the system 400 in FIGS. 4A-4B, the system 2800 provides for first and second bias current generators 2816, 2818 to be directly coupled, respectively, to the first and second current generators (Pf1, Pf2) 2832, 2842 (e.g., via gates of PMOS devices Pf1, Pf2 as shown in FIGS. 28A-B). However, equivalent to the inner amplifier 430 in FIGS. 4A-4B, the inner amplifier 2830 in FIGS. 28A-B may include first and second common-mode transistor devices (e.g., Ncm1, Ncm2) 2840, 2850. In one particular implementation, in the inner amplifier 2830, the first common-mode transistor device 2840 may be coupled between a first node 2881 and ground, while the second common-mode transistor 2850 may be coupled between a second node 2883 and the ground.

In certain implementations illustrating "cross-coupling" (as depicted in FIGS. 28A-28B), a gate of the second common-mode transistor device 2850 may be coupled to a first output (e.g., minus port) 2862 of the amplifier circuit 2800 and a gate of the first common-mode transistor device 2840 may be coupled to a second output (e.g., plus port) 2864 of the amplifier circuit 2800. In implementations illustrating "parallel-coupling" ("non-cross-coupling") (not shown), the gate of the first common-mode transistor device 2840 may be coupled to the first output (e.g., minus port) 2862 of the amplifier circuit 2800 and the gate of the second common-mode transistor device 2850 may be coupled to the second output 2864 (e.g., plus port) of the amplifier circuit 2800.

In each of these implementations (including those depicted in FIGS. 28A-28B and its variations), the first and second common-mode transistor devices 2840, 2850 may be NMOS or NPN transistor devices. In alternative implementations (not shown), the first and second common-mode transistor devices 2840, 2850 may be PMOS devices or PNP transistor devices. As an example, if the reference memory elements coupled to the amplifier 2800 are coupled to ground, NMOS or NPN transistor devices may be used for the first and second common-mode transistor devices 2840, 2850. Alternatively, if the reference memory elements coupled to the amplifier 2800 are coupled to a power line (e.g., $V_{DD}$), PMOS or PNP transistor devices may be used for the first and second common-mode transistor devices 2840, 2850. In operation, the first and second common-mode transistor devices 2840, 2850 may be configured to control common-mode voltage during the amplification phase 2890.

In a particular implementation, a "half-latch" feature may be included in the system 2800. For instance, the inner amplifier 2830 may further include a third switch (not shown). The third switch may be coupled between the first node 2881 and the second node 2883, where the first node 2881 may couple the first transistor device 2834 and the first common-mode transistor device 2840, and the second node 2883 may couple the second transistor device 2844 and the second common-mode transistor device 2850. In operation, during the sampling phase 2880, the third switch may be "closed", such that the first node 2881 may be coupled to the second node 2883. During the amplification phase 2890, the third switch may be "open", such that the first node 2881 is not coupled to the second node 2883. Advantageously, the first and second latch switches allow the system 2800 to resemble a "full-latch device", thus providing for improved performance and efficient usage by having two stable states where the system 2800 may be used to store state information as digital values.

Referring to FIGS. 29A-C, unlike the system 500 in FIGS. 5A-5B, the folded system 2900 provides for first and second bias current generators (e.g., PMOS transistor devices P1, P2) 2916, 2918 to be directly coupled, respectively, to the first and second current generators (Pf1, Pf2) 2832, 2842 (e.g., via gates of PMOS transistor devices Pf1, Pf2 as shown in FIGS. 29A-B). Moreover, in this particular implementation, a "start-up boost" device (or devices) may be coupled between drain terminals of the PMOS transistor devices P1, P2, and a bias voltage ($V_{BIAS}$) may be generated between gate terminals of the PMOS transistor devices P1, P2, However, equivalent to the inner amplifier 530 in FIGS. 4A-4B, in the inner amplifier 2930 as shown in FIGS. 29A-C, the first common-mode transistor device 2940 (Pcm1) may be coupled between a power supply 2901 and a first node 2985 coupling the first current generator 2932 (Pf1) and a second node 2987. Also, the second common-mode transistor device 2950 (Pcm2) may be coupled between the power supply 2901 and the second node 2987 coupling the second current generator 2942 (Pf2) and the first node 2985.

In certain implementations illustrating "cross-coupling" (as depicted in FIGS. 29A-29B), a gate of the second common-mode transistor device 2950 (Pcm2) may be coupled to a first output (e.g., minus port) 2962 of the amplifier circuit 2900 and a gate of the first common-mode transistor device 2940 (Pcm1) may be coupled to a second output (e.g., plus port) 2964 of the amplifier circuit 2900. In other implementations representing "non-cross coupling" (not shown), the gate of the first common-mode transistor device 2940 (Pcm1) may be coupled to the first output (e.g., minus port) 2962 of the amplifier circuit 2900 and the gate of the second common-mode transistor device 2950 (Pcm2) may be coupled to the second output 2964 (e.g., plus port) of the amplifier circuit 2900.

In each of the implementations (as described in the previous paragraph directly above including those depicted in FIGS. 29A-29B), the first and second common-mode transistor devices 2940, 2950 may be PMOS or PNP transistor devices. In alternative implementations (not shown), the first and second common-mode transistor devices 2940, 2950 may be NMOS devices or NPN transistor devices. As an example, if the reference memory elements coupled to the amplifier 2900 are coupled to ground, PMOS or PNP transistor devices may be used for the first and second common-mode transistor devices 2940, 2950. Alternatively, if the reference memory elements coupled to the amplifier 500 are coupled to a power line (e.g., $V_{DD}$), NMOS or NPN transistor devices may be used for the first and second common-mode transistor devices 2940, 2950.

In operation, the first and second common-mode transistor devices 2940, 2950 are configured to control common-mode voltage during the amplification phase 2990. In a particular implementation, similar to the system 2800, a "half-latch" feature may be included in the system 2900. For instance, the inner amplifier 2930 may further include a third switch (not shown). The third switch may be coupled between the first node 2985 and the second node 2987, where the first node 2985 may couple the first current generator device 2932 and the first common-mode transistor device 2940, and the second node 2987 may couple the second current generator device 2942 and the second common-mode transistor device 2950. Advantageously, the third switch allows the system 2900 to resemble a half-latch device, thus providing for improved performance and efficient usage by having two stable states where the system 2900 may be used to store state information as digital values.

Referring to FIGS. 30A-C, expanding on the circuit arrangement of the folded system 2800, in the folded system 3000, gates of the first and second bias current generators 3016, 3018 (e.g., PMOS transistor devices P1, P2) may be directly coupled, respectively, to the gates of the first and second transistors (Nf1, Nf2) 3034, 3044. Moreover, the respective drain terminals of the first and second bias current generators 3016, 3018 are coupled to the respective gate terminals of the first and second current generators 3032, 3042 (e.g., via gates of PMOS transistor devices Pf1, Pf2). The folded system 3000 is otherwise equivalent to the folded system 2800 in operation and circuit design, including alternative implementations, including either "cross-coupling" or "non-cross coupling", and the "half-latch" feature (as described in above paragraphs). Advantageously, the folded system 3000 allows internally generated bias voltage provided with positive feedback, resulting in substantially high gain at low power.

Referring to FIGS. 31A-C, expanding on the circuit arrangement of the folded system 2800, in the folded system 3100, a gate of the first bias current generator 3116 (e.g., PMOS transistor device P1) may be directly coupled to a node coupling the gate of the second transistor device (Nf2) 3144 and a first capacitor (CS1) 3136, and a gate of the second bias current generator 3118 may be directly coupled to a node coupling a gate of the first transistor device (Nf1) 3134 and a second capacitor (CS2) 3146. Moreover, similar to the folded system 3000, the respective drain terminals of the first and second bias current generators 3116, 3118 are coupled to the respective gate terminals of the first and second current generators 3132, 3142 (e.g., via gates of PMOS transistor devices Pf1, Pf2). The folded system 3100 is otherwise equivalent to the folded system 2800 in operation and circuit design, including alternative implementations, including either "cross-coupling" or "non-cross coupling", and the "half-latch" feature (as described in above paragraphs). Advantageously, the folded system 3100 allows internally generated bias voltage provided with negative feedback.

FIG. 28C-31C illustrate the systems 2800, 2900, 3000, 3100 example electronic circuit symbols. As depicted, a control signal 2898, 2998, 3098, 3198 may also be coupled to each of the systems 2800, 2900, 3000, 3100 respectively, to control the operation of the respective sampling phases 2880, 2980, 3080, 3180, and the respective amplification phases 2890, 2990, 3090, 3190.

Although one or more of FIGS. 1-31 may illustrate systems, apparatuses, or methods according to the teachings of the disclosure, the disclosure is not limited to these illustrated systems, apparatuses, or methods. One or more functions or components of any of FIGS. 1-31 as illustrated or described herein may be combined with one or more other portions of another of FIGS. 1-31. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An amplifier circuit comprising:
   first and second bias circuits; and
   an inner amplifier coupled to the first and second bias circuits comprising:
      first and second current generators configured to replicate respective first and second currents from the first and second bias circuits,
      first and second transistors configured to transform the first and second currents into voltage samples, and
      first and second capacitors configured to store the voltage samples,
   wherein in a sampling phase, a sampling of the first and second currents is performed in the inner amplifier, and wherein in an amplification phase, an amplification of the stored voltage samples is performed in the inner amplifier.

2. The amplifier circuit of claim 1, wherein the inner amplifier is configured to determine if the stored voltage samples corresponding to bit memory elements indicate a high resistive state or a low resistive state.

3. The amplifier circuit of claim 1, further comprising a power supply that is coupled to the first and second bias circuits and the inner amplifier.

4. The amplifier circuit of claim 3, wherein the first and second bias circuits are coupled between respective first and second inputs and the power supply.

5. The amplifier circuit of claim 1, wherein the inner amplifier further comprises:
   a first switch configured to decouple a first output port of the amplifier circuit and a node coupling a gate of the first transistor device and the first capacitor; and
   a second switch configured to decouple a second output port of the amplifier circuit and a node coupling a gate of the second transistor device and the second capacitor.

6. The amplifier circuit of claim 5, wherein during the sampling phase, a first reference memory element is coupled to the first input and a first bit memory element is coupled to the second input, and wherein during the amplification phase, the first bit memory element is coupled to the first input and a second reference memory element is coupled to the second input.

7. The amplifier circuit of claim 6, wherein the first and second reference memory elements and the first bit memory element comprise one of a resistive-based memory and a current-based memory.

8. The amplifier circuit of claim 6, wherein a coupling of the first switch at the first output of the amplifier circuit and the node coupling the gate of the first transistor device and the first capacitor and a coupling of the second switch at the second output of the amplifier circuit and the node coupling the gate of the second transistor device and the second capacitor are configured to initiate the sampling phase.

9. The amplifier circuit of claim 6, wherein a decoupling of the first switch at the first output of the inner amplifier and the node coupling the gate of the first transistor device and the first capacitor and a decoupling of the first switch at the second output of the inner amplifier and the node coupling the gate of the second transistor device and the second capacitor are configured to initiate the amplification phase.

10. The amplifier circuit of claim 9, wherein during the amplification phase, an output voltage, based on a combination of a bit current of the bit memory element and a reference current of the first and second reference memory elements, corresponds to the bit memory element having one of a low resistive state and a high resistive state.

11. The amplifier circuit of claim 1, wherein the inner amplifier further comprises first and second common-mode transistor devices, wherein the first and second common-mode transistor devices are configured to control common-mode voltage during the amplification phase.

12. The amplifier circuit of claim 1, further comprising a first power supply and a second power supply, wherein the first power supply is coupled to the first and second bias circuits and wherein the second power supply is coupled to the inner amplifier.

13. The amplifier circuit of claim 1, wherein the amplifier circuit comprises a folded offset cancelled sense amplifier.

14. The amplifier circuit of claim 13, wherein the folded offset cancelled sense amplifier is integrated into a mobile phone, a set top box, a music player, a video player, an entertainment unit, a navigation device, a computer, a hand-held personal communication systems (PCS) unit, a portable data unit, and/or a fixed location data unit.

15. The amplifier circuit of claim 13, wherein the folded offset cancelled sense amplifier is integrated into a memory array comprising a plurality of folded offset cancelled sense amplifiers.

16. A method comprising:
   in a sampling phase:
      receiving, in an amplifier circuit, a first reference current and a bit current on respective first and second bias circuits;
      replicating the first reference current and the bit current from the first and second bias circuits to first and second current generators in an inner amplifier of the amplifier circuit;
      converting, at respective first and second transistors of the inner amplifier, the reference current into a first voltage sample and the bit current into a second voltage sample; and
      storing, at respective first and second capacitors of the inner amplifier, the first and second voltage samples; and
   in an amplification phase:
      receiving, in the amplifier circuit, the bit current and a second reference current on the respective first and second bias circuits;
      replicating the bit current and the second reference current from the first and second bias circuits to the first and second current generators in an inner amplifier of the amplifier circuit; and
      determining, at a node between the first current generator and first transistor device, and at a node between the second current generator and second transistor device, first and second output voltages.

17. The method of claim 16, wherein the first and second output voltages correspond to a bit memory element associated with the bit current having one of a low resistive state and a high resistive state.

18. The method of claim 17, wherein the first output voltage is determined based on a combination of a current or voltage associated with the first voltage sample and the second bit current, and the second output voltage is determined based on a combination of another current or voltage associated with the second voltage sample and the second reference current.

19. The method of claim 16, further comprising: providing the first and second reference current from first and second reference memory elements coupled to the amplifier circuit, and providing the bit current from a bit memory element coupled to the amplifier circuit.

20. An amplifier circuit comprising:
first and second bias circuits;
an inner amplifier coupled to the first and second bias circuits, wherein the inner amplifier is configured to determine if a stored voltage sample corresponding to a bit memory element indicates a high resistive state or a low resistive state, wherein the inner amplifier comprises:
first and second current generators configured to replicate respective first and second currents from the first and second bias circuits;
first and second transistors configured to transform the first and second currents into voltage samples; and
first and second capacitors configured to store the voltage samples.

* * * * *